US012787407B2

(12) United States Patent
Wada et al.

(10) Patent No.: US 12,787,407 B2
(45) Date of Patent: Nov. 3, 2026

(54) SEMICONDUCTOR DEVICE HAVING DUAL TRENCH STRUCTURES AND AN IMPURITY REGION

(71) Applicant: ROHM CO., LTD., Kyoto (JP)

(72) Inventors: Keiji Wada, Kyoto (JP); Daisuke Ichikawa, Kyoto (JP); Mitsuhide Kori, Kyoto (JP); Naoki Izumi, Kyoto (JP); Bungo Tanaka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 490 days.

(21) Appl. No.: 18/350,765

(22) Filed: Jul. 12, 2023

(65) Prior Publication Data

US 2023/0352545 A1 Nov. 2, 2023

Related U.S. Application Data

(63) Continuation of application No. PCT/JP2021/043822, filed on Nov. 30, 2021.

(30) Foreign Application Priority Data

Jan. 15, 2021 (JP) ................................ 2021-005307
Jan. 15, 2021 (JP) ................................ 2021-005308
(Continued)

(51) Int. Cl.
*H10D 64/00* (2025.01)
*H10D 30/65* (2025.01)
*H10D 62/10* (2025.01)

(52) U.S. Cl.
CPC .......... *H10D 64/117* (2025.01); *H10D 30/65* (2025.01); *H10D 62/108* (2025.01)

(58) Field of Classification Search
CPC .. H10D 64/117; H10D 62/108; H10D 30/655; H10D 62/157; H10D 62/371;
(Continued)

(56) References Cited

U.S. PATENT DOCUMENTS

2016/0163583 A1 6/2016 Liu et al.
2018/0053765 A1 2/2018 Pendharker et al.
(Continued)

FOREIGN PATENT DOCUMENTS

JP H01290235 A 11/1989
JP H0362946 A 3/1991
(Continued)

OTHER PUBLICATIONS

International Search Report and Written Opinion mailed on Feb. 1, 2022, received for PCT Application PCT/JP2021/043822, filed on Nov. 30, 2021, 10 pages including English Translation.
(Continued)

*Primary Examiner* — Shahed Ahmed
(74) *Attorney, Agent, or Firm* — XSENSUS LLP

(57) ABSTRACT

A semiconductor device includes a chip that has a first main surface on one side and a second main surface on another side, a pn-junction portion that is formed in an interior of the chip such as to extend along the first main surface, a device region that is provided in the first main surface, a first trench structure that is formed in the first main surface such as to penetrate through the pn-junction portion and demarcates the device region in the first main surface, and a second trench structure that is formed in the first main surface such as to penetrate through the pn-junction portion and demarcates the device region in a region further to the device region side than the first trench structure.

20 Claims, 29 Drawing Sheets

(30) Foreign Application Priority Data

Jan. 15, 2021 (JP) ................................ 2021-005309
Jan. 15, 2021 (JP) ................................ 2021-005310

(58) Field of Classification Search
CPC ............... H10D 62/378; H10D 62/116; H10D 84/0151; H10D 30/0281–0289; H10D 30/65–659; H10D 62/115–116; H01L 21/761
See application file for complete search history.

(56) References Cited

U.S. PATENT DOCUMENTS

2019/0096744 A1* 3/2019 Hu ....................... H10D 62/371
2021/0057462 A1* 2/2021 Stamper ................ G01S 7/4863

FOREIGN PATENT DOCUMENTS

JP H04225260 A 8/1992
JP 2013033931 A 2/2013
JP 2015-122543 A 7/2015
JP 2019-526932 A 9/2019
JP 2021002623 A 1/2021

OTHER PUBLICATIONS

German Office Action issued Dec. 11, 2023 in corresponding German Patent Application No. 11 2021 006 557.2, 19 pages.
Office Action dated Sep. 25, 2025 in corresponding Japanese patent application No. 2022-575113 (5 pages; with English translation).
Office Action dated Feb. 5, 2026 in corresponding Japanese patent application No. 2022-575113 (4 pages; with English machine translation).

* cited by examiner

1

1

81

SEMICONDUCTOR DEVICE HAVING DUAL TRENCH STRUCTURES AND AN IMPURITY REGION

CROSS-REFERENCE TO RELATED APPLICATIONS

The present application is a continuation application of PCT Application No. PCT/JP2021/043822, filed on Nov. 30, 2021, which corresponds to Japanese Patent Application No. 2021-005307 filed on Jan. 15, 2021 in the Japan Patent Office, Japanese Patent Application No. 2021-005308 filed on Jan. 15, 2021 in the Japan Patent Office, Japanese Patent Application No. 2021-005309 filed on Jan. 15, 2021 in the Japan Patent Office, and Japanese Patent Application No. 2021-005310 filed on Jan. 15, 2021 in the Japan Patent Office, and the entire disclosures of these applications are incorporated herein by reference.

BACKGROUND OF THE INVENTION

1. Field of the Invention

The present invention relates to a semiconductor device.

2. Description of the Related Art

Japanese Patent Application Publication No. 2015-122543 discloses a semiconductor device that includes a p-type region, a first p-epitaxial region, an n-type embedded region, a second p-epitaxial region, and a DTI structure (deep trench isolation structure). The first p-type epitaxial layer is formed on the p-type region. The n-type embedded region is formed on the first p-epitaxial region. The second p-epitaxial region is formed on the n-type embedded region. The DTI structure surrounds a formation region of a high-voltage-resistant lateral MOS transistor in plan view. The DTI structure penetrates through the second p-epitaxial region, the n-type embedded region, and the first p-epitaxial region such as to reach the p-type region.

DETAILED DESCRIPTION OF THE PREFERRED EMBODIMENTS

The attached drawings are not necessarily drawn precisely but are schematic views and are not necessarily matched in scale, etc. The wording "substantially equal" in this Description encompasses cases where a numerical value of a measured object (measured location) is completely matched with a numerical value of a compared object (compared location) as well as cases where a numerical value of a measured object (measured location) is in a range of being treatable as equivalent to (for example, range of not less than 0.9 times to not more than 1.1 times of) a numerical value of a compared object (compared location).

Figure 1:
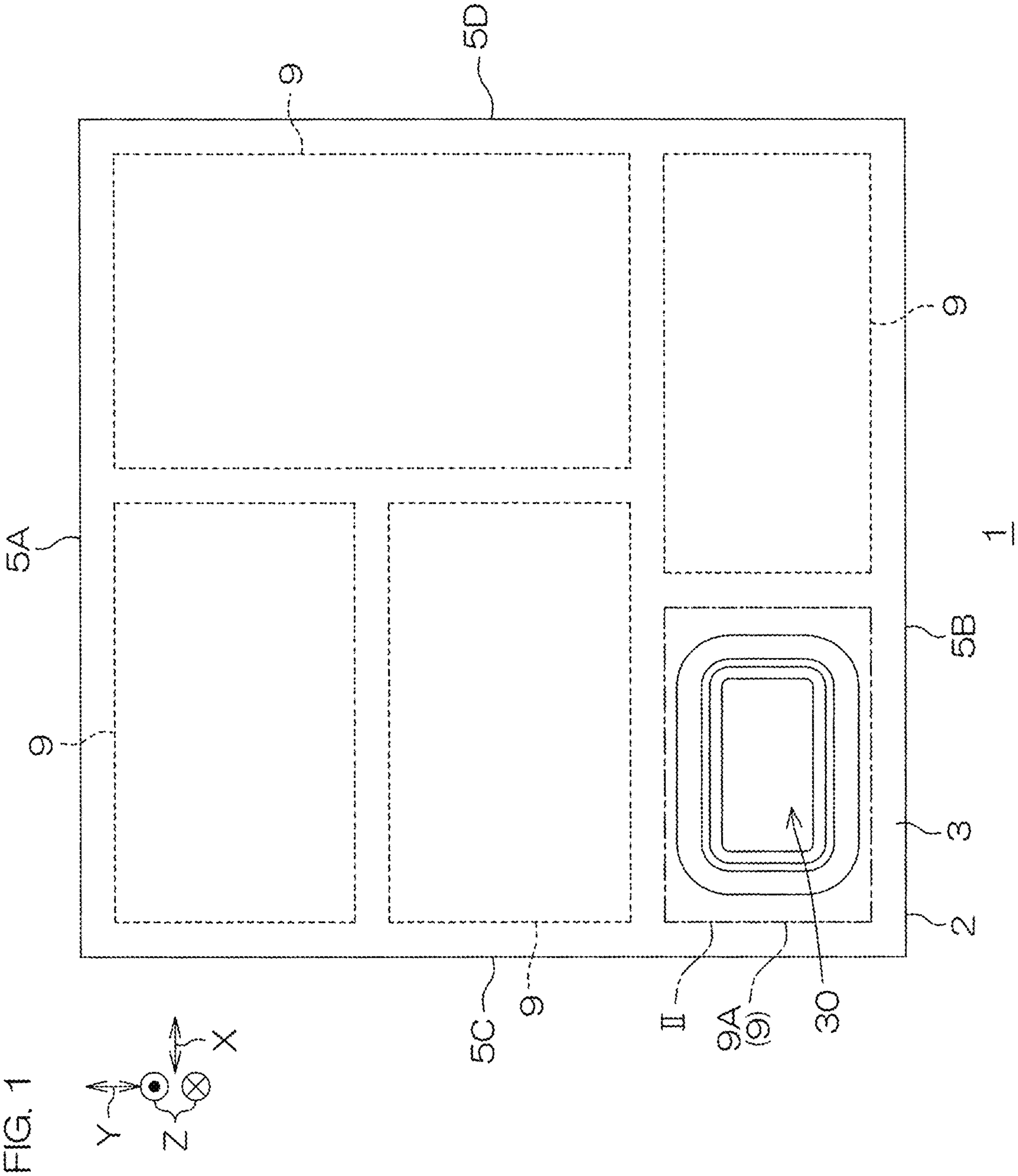
FIG. 1 is a schematic plan view showing a semiconductor device according to a first embodiment.
Figure 2:
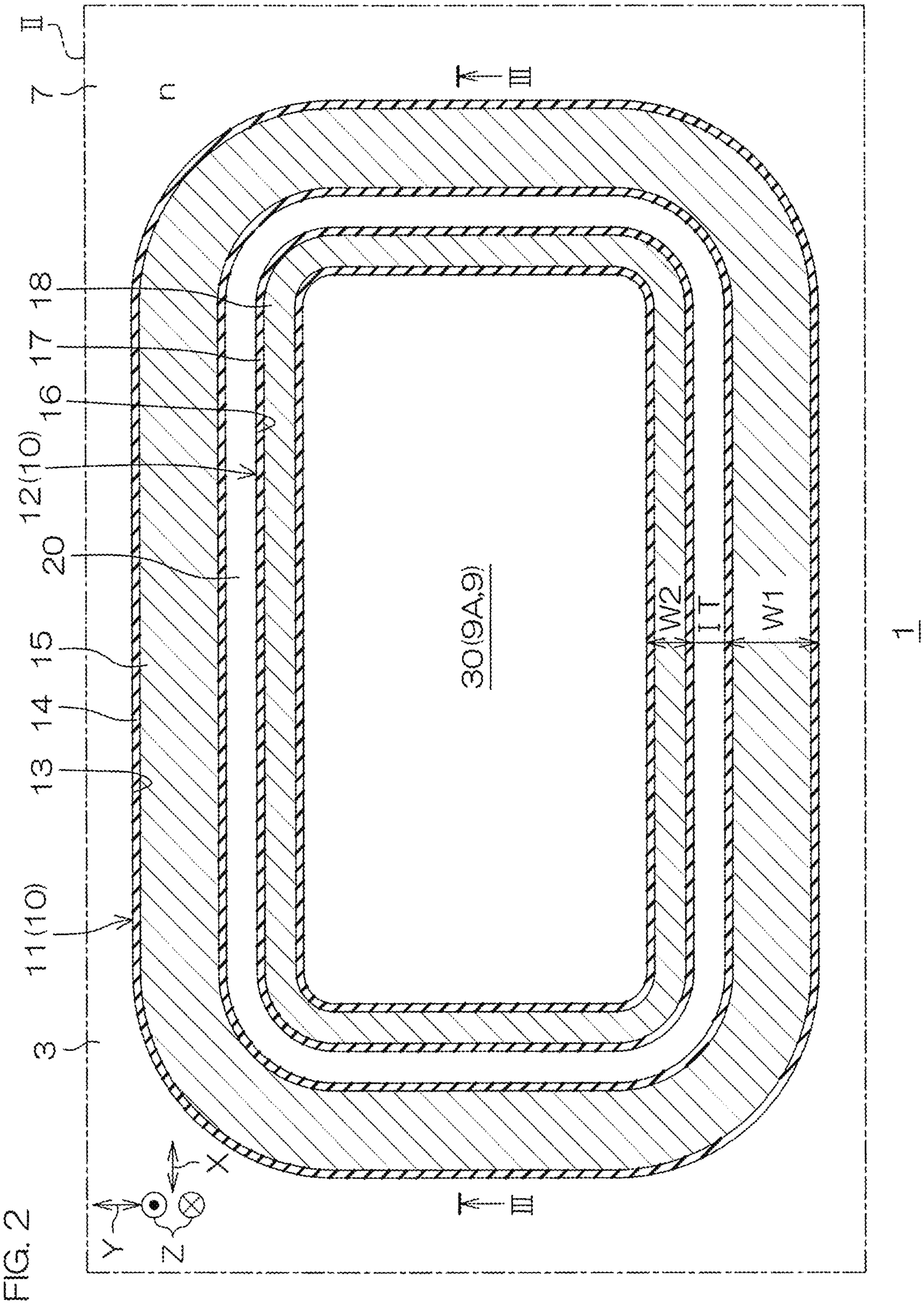
FIG. 2 is an enlarged view of a region II shown in FIG. 1.
Figure 3:
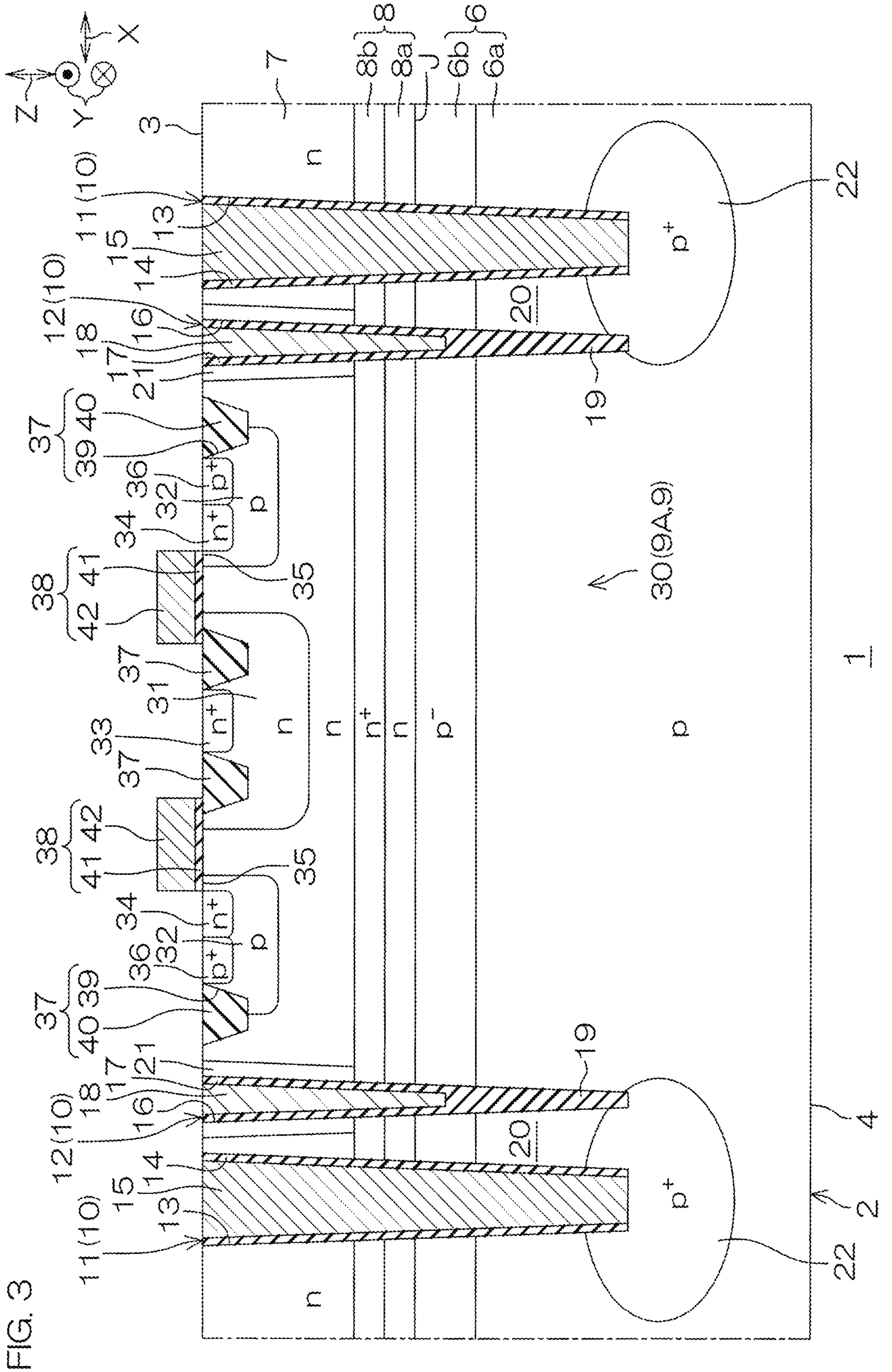
FIG. 3 is a sectional view showing a sectional structure along a line shown in FIG. 2 together with a second trench structure according to a first configuration example.
Figure 4:
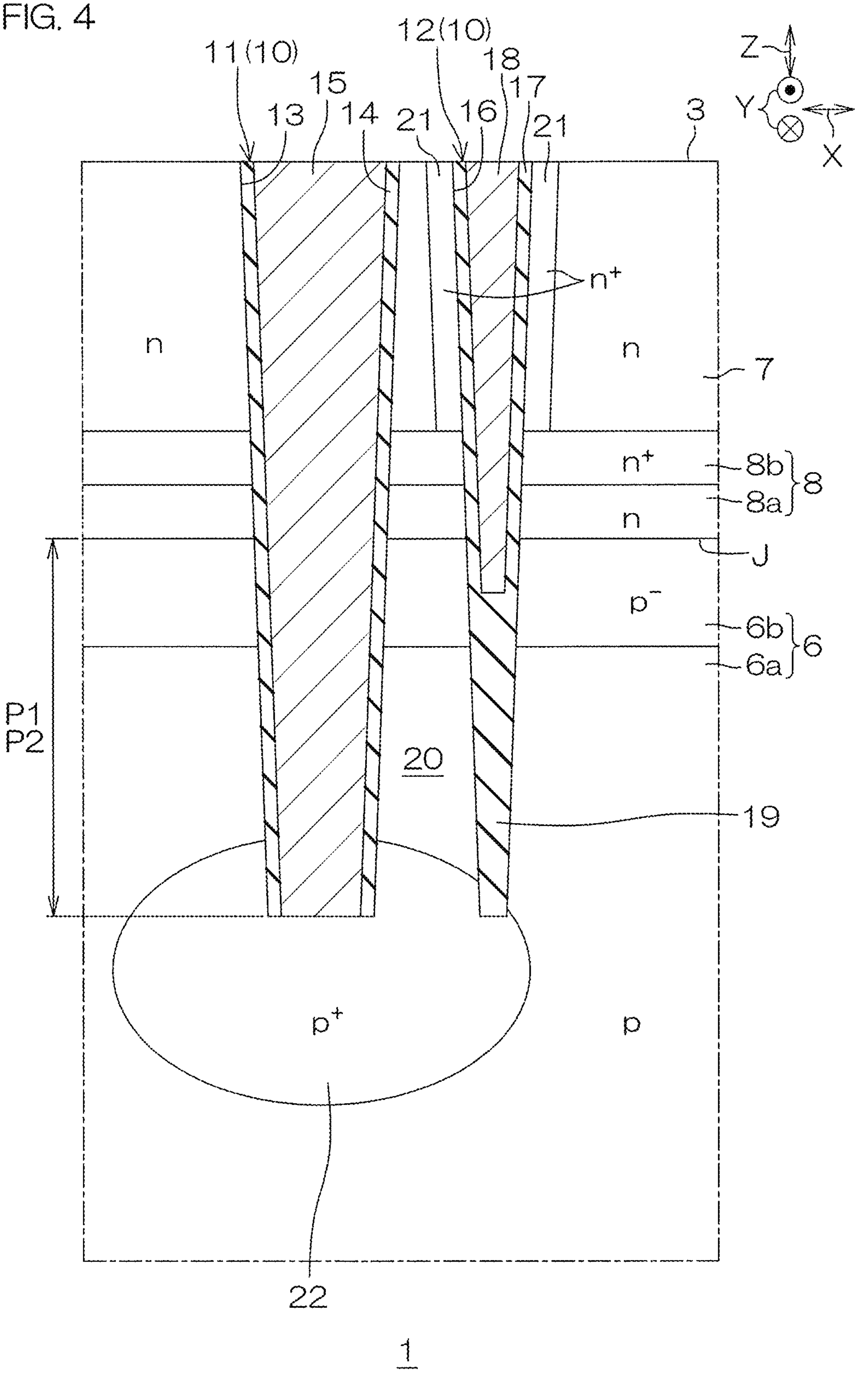
FIG. 4 is an enlarged sectional view of principal portions of the structure shown in FIG. 3.

FIG. 1 is a schematic plan view showing a semiconductor device 1 according to a first embodiment. FIG. 2 is an enlarged view of a region II shown in FIG. 1. FIG. 3 is a sectional view showing a sectional structure along a line III-III shown in FIG. 2 together with a second trench structure 12 according to a first configuration example. FIG. 4 is an enlarged sectional view of principal portions of the structure shown in FIG. 3.

Referring to FIG. 1 to FIG. 4, the semiconductor device 1 includes a chip 2 (semiconductor chip) of rectangular parallelepiped shape. The chip 2 is constituted of an Si (silicon) chip in this embodiment. The chip 2 has a first main surface 3 on one side, a second main surface 4 on another side, and first to fourth side surfaces 5A to 5D that are connected to the first main surface 3 and the second main surface 4.

The first main surface 3 and the second main surface 4 are formed in quadrilateral shapes in a plan view of viewing from a normal direction Z thereto (hereinafter referred to simply as "plan view"). The normal direction Z is also a thickness direction of the chip 2. The first side surface 5A and the second side surface 5B extend in a first direction X along the first main surface 3 and face each other in a second direction Y that intersects (to be specific, is orthogonal to) the first direction X. The third side surface 5C and the fourth side surface 5D extend in the second direction Y and face each other in the first direction X.

The semiconductor device 1 includes a first layer 6 of a p-type (first conductivity type), a second layer 7 of the p-type or an n-type (second conductivity type), and a third layer 8 of the n-type that are formed inside the chip 2. The first layer 6 may be referred to as a "base layer." The second layer 7 may be referred to as a "device formation layer." The third layer 8 may be referred to as an "embedded layer." The first layer 6, the second layer 7, and the third layer 8 may be regarded as constituent elements of the chip 2.

The first layer 6 is formed in a region inside the chip 2 on the second main surface 4 side and forms the second main surface 4 and the portions of first to fourth side surfaces 5A to 5D. The first layer 6 has a concentration gradient such that a p-type impurity concentration on the first main surface 3 side is lower than the p-type impurity concentration on the second main surface 4 side. Specifically, the first layer 6 has a laminated structure including a high concentration layer 6*a* and a low concentration layer 6*b* laminated in that order from the second main surface 4 side.

The high concentration layer 6*a* has a comparatively high p-type impurity concentration. The p-type impurity concentration of the high concentration layer 6*a* may be not less than $1\times10^{16}$ cm$^{-3}$ and not more than $1\times10^{20}$ cm$^{-3}$. The high concentration layer 6*a* may have a thickness of not less than 100 μm and not more than 1000 μm. In this embodiment, the high concentration layer 6*a* is constituted of a semiconductor substrate (Si substrate) of the p-type. The low concentration layer 6*b* has a lower p-type impurity concentration than the high concentration layer 6*a* and is laminated on the high concentration layer 6*a*. The p-type impurity concentration of the low concentration layer 6*b* may be not less than $1\times10^{14}$ cm$^{-3}$ and not more than $1\times10^{17}$ cm$^{-3}$. The low concentration layer 6*b* has a thickness less than the thickness of the high concentration layer 6*a*. The low concentration layer 6*b* may have a thickness of not less than 0.5 μm and not more than 20 μm. In this embodiment, the low concentration layer 6*b* is constituted of an epitaxial layer (Si epitaxial layer) of the p-type.

The second layer 7 is formed in a region inside the chip 2 on the first main surface 3 side and forms the first main surface 3 and portions of the first to fourth side surfaces 5A to 5D. A conductivity type (n-type or p-type) of the second layer 7 is arbitrary and is selected in accordance with specifications of the semiconductor device 1. Although with this embodiment, an example where the second layer 7 has a conductivity type of the n-type shall be described, this is not intended to restrict the conductivity type of the second layer 7 to the n-type.

The second layer 7 may have an n-type impurity concentration that is uniform in regard to the thickness direction or may have an n-type impurity concentration gradient that increases toward the first main surface 3. The n-type impurity concentration of the second layer 7 may be not less than $1\times10^{14}$ cm$^{-3}$ and not more than $1\times10^{17}$ cm$^{-3}$. The second layer 7 may have a thickness of not less than 0.5 μm and not more than 20 μm. In this embodiment, the second layer 7 is constituted of an epitaxial layer (Si epitaxial layer) of the n-type.

The third layer 8 is interposed between the first layer 6 and the second layer 7 in a region inside the chip 2 and forms portions of the first to fourth side surfaces 5A to 5D of the chip 2. The third layer 8 forms a pn-junction portion J in a boundary portion with the first layer 6. That is, inside the chip 2, the pn-junction portion J that extends in a horizontal direction (orthogonal direction to the thickness direction) along the first main surface 3 is formed in an intermediate portion in the thickness direction between the first main surface 3 and the second main surface 4. The pn-junction portion J may be referred to as a "pn-connection portion" or a "pn-boundary portion."

The third layer 8 has a higher n-type impurity concentration than the second layer 7. Specifically, the third layer 8 has a concentration gradient such that an n-type impurity concentration on the first main surface 3 side is higher than the n-type impurity concentration on the second main surface 4 side. More specifically, the third layer 8 has a laminated structure including a low concentration embedded layer 8*a* and a high concentration embedded layer 8*b* laminated in that order from the first layer 6 side.

The low concentration embedded layer 8*a* has a comparatively low n-type impurity concentration and is laminated on the low concentration layer 6*b* of the first layer 6. The low concentration embedded layer 8*a* forms the pn-junction portion J with the low concentration layer 6*b*. The low concentration embedded layer 8*a* may have a lower n-type impurity concentration than the second layer 7 or may have a higher n-type impurity concentration than the second layer 7. The n-type impurity concentration of the low concentration embedded layer 8*a* may be not less than $1\times10^{14}$ cm$^{-3}$ and not more than $1\times10^{18}$ cm$^{-3}$. The low concentration embedded layer 8*a* may have a thickness of not less than 0.1 μm and not more than 5 μm. In this embodiment, the low concentration embedded layer 8*a* is constituted of an epitaxial layer (Si epitaxial layer) of the n-type.

The high concentration embedded layer 8*b* has a higher n-type impurity concentration than the low concentration embedded layer 8*a* and is laminated on the low concentration embedded layer 8*a*. The high concentration embedded layer 8*b* preferably has a higher n-type impurity concentration than the second layer 7. The n-type impurity concentration of the high concentration embedded layer 8*b* may be not less than $1\times10^{16}$ $cm^{-3}$ and not more than $1\times10^{21}$ $cm^{-3}$. The high concentration embedded layer 8*b* may have a thickness of not less than 0.1 μm and not more than 5 μm. In this embodiment, the high concentration embedded layer 8*b* is constituted of an epitaxial layer (Si epitaxial layer) of the n-type.

The semiconductor device 1 includes a plurality of device regions 9 provided in the first main surface 3 (second layer 7). The plurality of device regions 9 are regions in which various functional devices are formed respectively. The plurality of device regions 9 are respectively demarcated in inner portions of the first main surface 3 at intervals from the first to fourth side surfaces 5A to 5D in plan view. The number, placements, and shapes of the device regions 9 are arbitrary and not restricted to a specific number, placements, and shapes.

The plurality of device regions may include at least one each of a semiconductor switching device, a semiconductor rectifying device, and a passive device. The semiconductor switching device may include at least one among a JFET (junction field effect transistor), a MISFET (metal insulator semiconductor field effect transistor), a BJT (bipolar junction transistor), and an IGBT (insulated gate bipolar junction transistor).

The semiconductor rectifying device may include at least one among a pn-junction diode, a pin-junction diode, a Zener diode, a Schottky barrier diode, and a fast recovery diode. The passive device may include at least one among a resistor, a capacitor, an inductor, and a fuse. In this embodiment, the plurality of device regions 9 include at least one transistor region 9A. A structure on the transistor region 9A side shall be described specifically below.

Referring to FIG. 2 to FIG. 4, the semiconductor device 1 includes a trench separation structure 10 as an example of a region separation structure that demarcates the transistor region 9A in the first main surface 3. The trench separation structure 10 includes a plurality of trench structures and demarcates the transistor region 9A of a predetermined shape in plan view.

The trench separation structure 10 has a multi-trench structure that includes at least one first trench structure 11 and at least one second trench structure 12 having a different structure from the first trench structure 11. In this embodiment, the trench separation structure 10 has a double trench structure that includes the single first trench structure 11 and the single second trench structure 12. The first trench structure 11 may be referred to as a "first trench electrode structure." The second trench structure 12 may be referred to as a "second trench electrode structure."

Referring to FIG. 2, the first trench structure 11 is formed in a band shape extending along the transistor region 9A in plan view. In this embodiment, the first trench structure 11 has an annular shape (a quadrilateral annular shape in this embodiment) in plan view and demarcates the transistor region 9A of the predetermined shape (a quadrilateral shape in this embodiment). In this embodiment, four corners of the first trench structure 11 are curved in directions away from the transistor region 9A in plan view. The planar shape of the first trench structure 11 (planar shape of the transistor region 9A) is arbitrary. The first trench structure 11 may be formed in a polygonal annular shape, circular annular shape, or elliptical annular shape in plan view and may demarcate the transistor region 9A of a polygonal shape, circular shape, or elliptical shape in plan view.

The first trench structure 11 has a first trench width W1. The first trench width W1 is a width in a direction orthogonal to a direction in which the first trench structure 11 extends in plan view. The first trench width W1 may be not less than 0.5 μm and not more than 10 μm. The first trench width W1 is preferably not less than 2 μm and not more than 4 μm.

Referring to FIG. 3 and FIG. 4, the first trench structure 11 is formed in the first main surface 3 such as to penetrate through the pn-junction portion J and demarcates the transistor region 9A in the first main surface 3. Specifically, the first trench structure 11 penetrates through the second layer 7 and the third layer 8 such as to reach the first layer 6 and demarcates the transistor region 9A in the second layer 7. In this embodiment, the first trench structure 11 extends from the first main surface 3 toward the second main surface 4 side such as to reach the high concentration layer 6*a* of the first layer 6 and penetrates through the second layer 7, the third layer 8, and the low concentration layer 6*b* of the first layer 6.

The first trench structure 11 includes an inner peripheral wall on the transistor region 9A side, an outer peripheral wall on an opposite side to the inner peripheral wall (peripheral edge side of the chip 2), and a bottom wall connected to the inner peripheral wall and the outer peripheral wall. The first trench structure 11 may be formed in a vertical shape having an opening width that is substantially fixed in sectional view. The first trench structure 11 may be formed in a convergent shape having an opening width that narrows toward the second main surface 4 side in sectional view. The bottom wall of the first trench structure 11 may be formed in a shape curved toward the second main surface 4. The bottom wall of the first trench structure 11 may have a flat surface parallel to the first main surface 3.

Referring to FIG. 4, the first trench structure 11 projects by a first value P1 from the pn-junction portion J (boundary portion between the first layer 6 and the third layer 8) toward the second main surface 4 side. The first value P1 may be not less than 1 μm and not more than 30 μm. The first value P1 is preferably not less than 5 μm.

The first trench structure 11 is electrically connected to the chip 2 at the bottom wall and electrically insulated from the chip 2 at the side walls (inner peripheral wall and outer peripheral wall). That is, the first trench structure 11 has a lower end portion that is electrically connected to the chip 2. Specifically, the first trench structure 11 is electrically connected to the first layer 6 and electrically insulated from the second layer 7 and the third layer 8. That is, the first trench structure 11 is fixed at the same potential as the first layer 6.

The first trench structure 11 includes a first trench 13, a first insulating film 14 and a first electrode 15. The first trench 13 is formed in the first main surface 3 such as to penetrate through the pn-junction portion J. Specifically, the first trench 13 penetrates through the second layer 7 and the third layer 8 such as to reach the first layer 6. In this embodiment, the first trench 13 extends from the first main surface 3 toward the second main surface 4 side such as to reach the high concentration layer 6*a* of the first layer 6 and penetrates through the second layer 7, the third layer 8, and the low concentration layer 6*b* of the first layer 6.

The first insulating film 14 covers inner walls of the first trench 13 such as to expose the chip 2 from a bottom wall of the first trench 13. Specifically, the first insulating film 14 exposes the first layer 6 from the bottom wall of the first trench 13. In this embodiment, the first insulating film 14 exposes the high concentration layer 6*a* of the first layer 6 from the bottom wall of the first trench 13. The first insulating film 14 preferably covers an entirety of an inner peripheral wall and an entirety of an outer peripheral wall of the first trench 13. The first insulating film 14 may include a silicon oxide film. The first insulating film 14 preferably includes a silicon oxide film constituted of an oxide of the chip 2.

The first electrode 15 is embedded in the first trench 13 with the first insulating film 14 therebetween and is electrically connected to the chip 2 at the bottom wall of the first trench 13. Specifically, the first electrode 15 is electrically connected to the first layer 6 and electrically insulated from the second layer 7 and the third layer 8. More specifically, the first electrode 15 has an exposed portion exposed from the bottom wall of the first trench 13 and is mechanically and electrically connected to the high concentration layer 6*a* of the first layer 6 at the exposed portion. The first electrode 15 preferably includes a conductive polysilicon. The first electrode 15 preferably includes a conductive polysilicon constituted of the same conductivity type as the first layer 6 (the p-type in this embodiment). A p-type impurity of the first electrode 15 is preferably boron.

Referring to FIG. 2, the second trench structure 12 is formed at an interval to the transistor region 9A side from the first trench structure 11 in plan view and extends in a band shape along the transistor region 9A. In this embodiment, the second trench structure 12 is formed in an annular shape (a quadrilateral annular shape in this embodiment) extending in parallel to the first trench structure 11 in plan view and demarcates the transistor region 9A of the predetermined shape (a quadrilateral shape in this embodiment). In this embodiment, four corners of the second trench structure 12 are curved along the four corners of the first trench structure 11 and in directions away from the transistor region 9A in plan view.

The planar shape of the second trench structure 12 (planar shape of the transistor region 9A) is arbitrary. The second trench structure 12 may be formed in a polygonal annular shape, circular annular shape, or elliptical annular shape in plan view and may demarcate the transistor region 9A of a polygonal shape, circular shape, or elliptical shape in plan view. The planar shape of the second trench structure 12 does not necessarily have to be similar to the planar shape of the first trench structure 11.

The second trench structure 12 has a second trench width W2. The second trench width W2 is a width in a direction orthogonal to a direction in which the second trench structure 12 extends in plan view. The second trench width W2 is preferably not more than the first trench width W1 (W2≤W1). The second trench width W2 is especially preferably less than the first trench width W1 (W2<W1). The second trench width W2 may be not less than 0.5 μm and not more than 10 μm. The second trench width W2 is preferably not less than 1 μm and not more than 2 μm.

The second trench structure 12 is formed at a predetermined trench interval IT from the first trench structure 11. The trench interval IT may be not less than 0.5 μm and not more than 20 μm. The trench interval IT is preferably not less than 1 μm and not more than 5 μm. The trench interval IT is preferably less than the first trench width W1 (IT<W1).

Referring to FIG. 3 and FIG. 4, the second trench structure 12 is formed in the first main surface 3 such as to penetrate through the pn-junction portion J and demarcates the transistor region 9A in a region of the first main surface 3 further to the transistor region 9A side than the first trench structure 11. Specifically, the second trench structure 12 penetrates through the second layer 7 and the third layer 8 such as to reach the first layer 6 and demarcates the transistor region 9A in a region of the second layer 7 further to the transistor region 9A side than the first trench structure 11. In this embodiment, the second trench structure 12 extends from the first main surface 3 toward the second main surface 4 side such as to reach the high concentration layer 6*a* of the first layer 6 and penetrates through the second layer 7, the third layer 8, and the low concentration layer 6*b* of the first layer 6.

The second trench structure 12 includes an inner peripheral wall on the transistor region 9A side, an outer peripheral wall on the first trench structure 11 side, and a bottom wall connecting the inner peripheral wall and the outer peripheral wall. The second trench structure 12 may be formed in a vertical shape having an opening width that is substantially fixed in sectional view. The second trench structure 12 may be formed in a convergent shape having an opening width that narrows toward the first layer 6 side in sectional view. The bottom wall of the second trench structure 12 may be formed in a shape curved toward the second main surface 4. The bottom wall of the second trench structure 12 may have a flat surface parallel to the first main surface 3.

Referring to FIG. 4, the second trench structure 12 projects by a second value P2 from the pn-junction portion J (boundary portion between the first layer 6 and the third layer 8) toward the second main surface 4 side. The second value P2 is preferably substantially equal to the first value P1 of the first trench structure 11 (P1≈P2). That is, the second trench structure 12 may have a depth that is substantially equal to a depth of the first trench structure 11. The second value P2 may be less than the first value P1 (P2<P1). That is, the second trench structure 12 may have a depth less than the depth of the first trench structure 11. The second value P2 may be not less than 1 μm and not more than 30 μm. The second value P2 is preferably not less than 5 μm.

The second trench structure 12 has a structure different from the first trench structure 11 and is electrically insulated from the first layer 6, the second layer 7 and the third layer 8. The second trench structure 12 is electrically separated from the first trench structure 11. In this embodiment, the second trench structure 12 is formed in an electrically floating state. A potential to be occurred in (applied to) the second trench structure 12 varies in accordance with a potential (electric field) applied to the transistor region 9A. The potential to be occurred in the second trench structure 12 is not more than a maximum potential to be applied to the transistor region 9A.

The second trench structure 12 includes a second trench 16, a second insulating film 17 and a second electrode 18. The second trench 16 is formed in the first main surface 3 such as to penetrate through the pn-junction portion J. Specifically, the second trench 16 penetrates through the second layer 7 and the third layer 8 such as to reach the first layer 6. In this embodiment, the second trench 16 extends from the first main surface 3 toward the second main surface 4 side such as to reach the high concentration layer 6*a* of the first layer 6 and penetrates through the second layer 7, the third layer 8, and the low concentration layer 6*b* of the first layer 6.

The second insulating film 17 covers inner walls of the second trench 16. Specifically, the second insulating film 17 covers entireties of inner walls (inner peripheral wall, outer peripheral wall, and bottom wall) of the second trench 16. The second insulating film 17 may include a silicon oxide film. The second insulating film 17 preferably includes the silicon oxide film constituted of the oxide of the chip 2.

In this embodiment, the second insulating film 17 forms a bottom side insulator 19 that is thicker than a portion covering the side walls (inner peripheral wall and outer peripheral wall) of the second trench 16 in a portion covering the bottom wall of the second trench 16. That is, the second trench structure 12 includes the bottom side insulator 19 that is embedded in the bottom wall side of the second trench 16 such as to be continuous to the second insulating film 17 and has a thickness exceeding a thickness of the second insulating film 17.

The bottom side insulator 19 is preferably embedded in a region further to the bottom wall side of the second trench 16 than the pn-junction portion J (boundary portion between the first layer 6 and the third layer 8) in regard to a depth direction of the second trench 16. Especially preferably, the bottom side insulator 19 contacts the high concentration layer 6*a* and the low concentration layer 6*b* of the first layer 6 in regard to the depth direction of the second trench 16. As a matter of course, the bottom side insulator 19 may be embedded such as to cross the pn-junction portion J (boundary portion between the first layer 6 and the third layer 8) in regard to the depth direction of the second trench 16. In this case, the bottom side insulator 19 may contact one of either or both of the low concentration embedded layer 8*a* and the high concentration embedded layer 8*b* of the third layer 8. Also, the bottom side insulator 19 may contact a portion of the second layer 7.

The second electrode 18 is embedded in the second trench 16 with the second insulating film 17 therebetween and is electrically insulated from the chip 2. Specifically, the second electrode 18 is electrically insulated from the first layer 6, the second layer 7 and the third layer 8 with the second insulating film 17 therebetween. In this embodiment, the second electrode 18 faces the first layer 6 (specifically, the high concentration layer 6*a*) with the comparatively thick bottom side insulator 19 therebetween on the bottom wall side of the second trench 16. A parasitic capacitance between the second electrode 18 and the first layer 6 is decreased by the bottom side insulator 19.

The second electrode 18 is electrically separated from the first electrode 15 of the first trench structure 11. In this embodiment, the second electrode 18 is formed in an electrically floating state. The second electrode 18 preferably includes a conductive polysilicon. The second electrode 18 preferably includes a conductive polysilicon constituted of the same conductivity type as the first layer 6 (the p-type in this embodiment). A p-type impurity of the second electrode 18 is preferably boron.

The semiconductor device 1 includes an inter-trench region 20 that is demarcated in a region of the chip 2 between the first trench structure 11 and the second trench structure 12. The inter-trench region 20 is demarcated between the inner peripheral wall of the first trench structure 11 and the outer peripheral wall of the second trench structure 12 and includes a portion of the first layer 6, a portion of the third layer 8 and a portion of the second layer 7. A width of the inter-trench region is adjusted by the trench interval IT.

The inter-trench region 20 is electrically separated from the first trench structure 11. The inter-trench region 20 is electrically separated from the second trench structure 12. In this embodiment, the inter-trench region 20 is formed in an electrically floating state. A potential to be occurred in (applied to) the inter-trench region 20 varies in accordance with a potential (electric field) to be applied to the transistor region 9A. The potential to be occurred in the inter-trench region 20 is not more than a maximum potential to be applied to the transistor region 9A.

The semiconductor device 1 includes sinker regions 21 of the n-type that cover the side walls of the second trench structure 12 inside the chip 2. The sinker regions 21 are formed inside the second layer 7 such as to extend along the side walls of the second trench structure 12. In this embodiment, the sinker regions 21 are formed as films extending along both the inner peripheral wall and the outer peripheral wall of the second trench structure 12. The sinker regions 21 have a higher n-type impurity concentration than the second layer 7. The n-type impurity concentration of the sinker regions 21 may be not less than $1\times10^{15}$ $cm^{-3}$ and not more than $1\times10^{19}$ $cm^{-3}$.

The sinker regions 21 are formed in annular shapes extending along the side walls of the second trench 16 in plan view. Lower end portions of the sinker regions 21 are connected to the third layer 8 (high concentration embedded layer 8*b*). In this embodiment, the sinker regions 21 are formed along the second trench structure 12 at intervals from the first trench structure 11 and do not cover one or both (both in this embodiment) of the inner peripheral wall and the outer peripheral wall of the first trench structure 11.

The semiconductor device 1 includes an impurity region 22 of the p-type that is formed in a region inside the chip 2 along the bottom wall of the first trench structure 11. The impurity region 22 is formed in the first layer 6 such as to cover the bottom wall of the first trench structure 11. The impurity region 22 has a higher p-type impurity concentration than the first layer 6. Specifically, the impurity region 22 is formed inside the high concentration layer 6*a* in the first layer 6 and has a higher p-type impurity concentration than the high concentration layer 6*a*.

In this embodiment, the first electrode 15 is formed as a supply source of a p-type impurity to the first layer 6 and the impurity region 22 includes the p-type impurity of the first layer 6 and the p-type impurity of the first electrode 15. The impurity region 22 also covers the side wall(s) of the first trench structure 11. In this embodiment, the impurity region 22 bulges in lateral directions along the first main surface 3 from the bottom wall of the first trench structure 11 and covers the bottom wall of the second trench structure 12. The impurity region 22 is preferably formed inside the high concentration layer 6*a* of the first layer 6 at an interval from the low concentration layer 6*b* of the first layer 6.

Referring to FIG. 3, the semiconductor device 1 includes a MISFET 30 of a planar gate type as an example of a functional device formed in the transistor region 9A. Illustration of the MISFET 30 is omitted in FIG. 2. In accordance with a magnitude of a drain-source voltage to be applied between a drain and a source, the MISFET 30 can take on a form of one among an HV (high voltage)-MISFET (for example, not less than 100 V and not more than 1000 V), an MV (middle voltage)-MISFET (for example, not less than 30 V and not more than 100 V), and an LV (low voltage)-MISFET (for example, not less than 1 V and not more than 30 V). Although with this embodiment, an example where the MISFET is constituted of an HV-MISFET shall be described, this is not intended to restrict the MISFET 30 to an HV-MISFET.

The MISFET 30 is constituted of at least one MISFET cell formed in the transistor region 9A. In this embodiment, the MISFET cell includes at least one (one in this embodiment) of a first well region 31 of the n-type, at least one (a plurality in this embodiment) of a second well region 32 of the p-type, at least one (one in this embodiment) of a drain region 33 of the n-type, at least one (a plurality in this embodiment) of a source region 34 of the n-type, at least one (a plurality in this embodiment) of a channel region 35 of the p-type, at least one (a plurality in this embodiment) of a contact region 36 of the p-type, a plurality of shallow trench structures 37, and at least one (a plurality in this embodiment) of a planar gate structure 38 in sectional view. The shallow trench structures 37 may be referred to as "STI (shallow trench isolation) structures."

The first well region 31 is formed in a surface layer portion of the second layer 7 in the transistor region 9A. The first well region 31 has a higher n-type impurity concentration than the second layer 7. The plurality of second well regions 32 are formed in surface layer portions of the second layer 7 at intervals from the first well region 31 in the transistor region 9A. One second well region 32 is formed at an interval to one side in the first direction X from the first well region 31 and another second well region 32 is formed at an interval to another side in the first direction X from the first well region 31.

The drain region 33 is formed in a surface layer portion of the first well region 31 at intervals inward from peripheral edges of the first well region 31. The plurality of source regions 34 are each formed in a surface layer portion of the corresponding second well region 32 at intervals inward from peripheral edges of the corresponding second well region 32. The plurality of channel regions 35 are each formed between the second layer 7 and the corresponding source region 34 in a surface layer portion of the corresponding second well region 32. The plurality of contact regions 36 are each formed in a surface layer portion of the corresponding second well region 32 at intervals inward from the peripheral edges of the corresponding second well region 32. The plurality of contact regions 36 are adjacent to the corresponding source regions 34.

The plurality of shallow trench structures 37 are each formed in the second layer 7 at an interval from the third layer 8 in regard to the thickness direction of the second layer 7. The plurality of shallow trench structures 37 are preferably formed at depth positions at intervals to the first main surface 3 side from a bottom portion of the first well region 31 and bottom portions of the second well regions 32. The plurality of shallow trench structures 37 are formed along peripheral edges of the drain region 33 and demarcate the drain region 33 from other regions.

The plurality of shallow trench structures 37 are formed along outer edges (peripheral edges on the trench separation structure 10 sides) of the plurality of second well regions 32 and demarcate the plurality of second well regions 32 from other regions. The plurality of shallow trench structures 37 each include a shallow trench 39 and an embedded insulator 40. Each shallow trench 39 is formed in the first main surface 3. Each embedded insulator 40 is embedded in the shallow trench 39.

The plurality of planar gate structures 38 are each formed on the second layer 7 (first main surface 3) such as to cover the corresponding channel region 35 and controls on/off of the corresponding channel region 35. In this embodiment, the plurality of planar gate structures 38 are each formed to span between the first well region 31 and the corresponding source region 34. The plurality of planar gate structures 38 may cover portions of the shallow trench structures 37 that demarcate the drain region 33.

The plurality of planar gate structures 38 each include a gate insulating film 41 and a gate electrode 42 laminated in that order from the second layer 7 side. The gate insulating film 41 may include a silicon oxide film. The gate insulating film 41 preferably includes the silicon oxide film constituted of the oxide of the chip 2. The gate electrode 42 preferably includes a conductive polysilicon. The gate electrode 42 preferably includes a conductive polysilicon constituted of the same conductivity type as the first layer 6 (that is, the p-type). A p-type impurity of the gate electrode 42 is preferably boron. As a matter of course, the gate electrode 42 may have a conductivity type of the n-type.

Figure 5A:
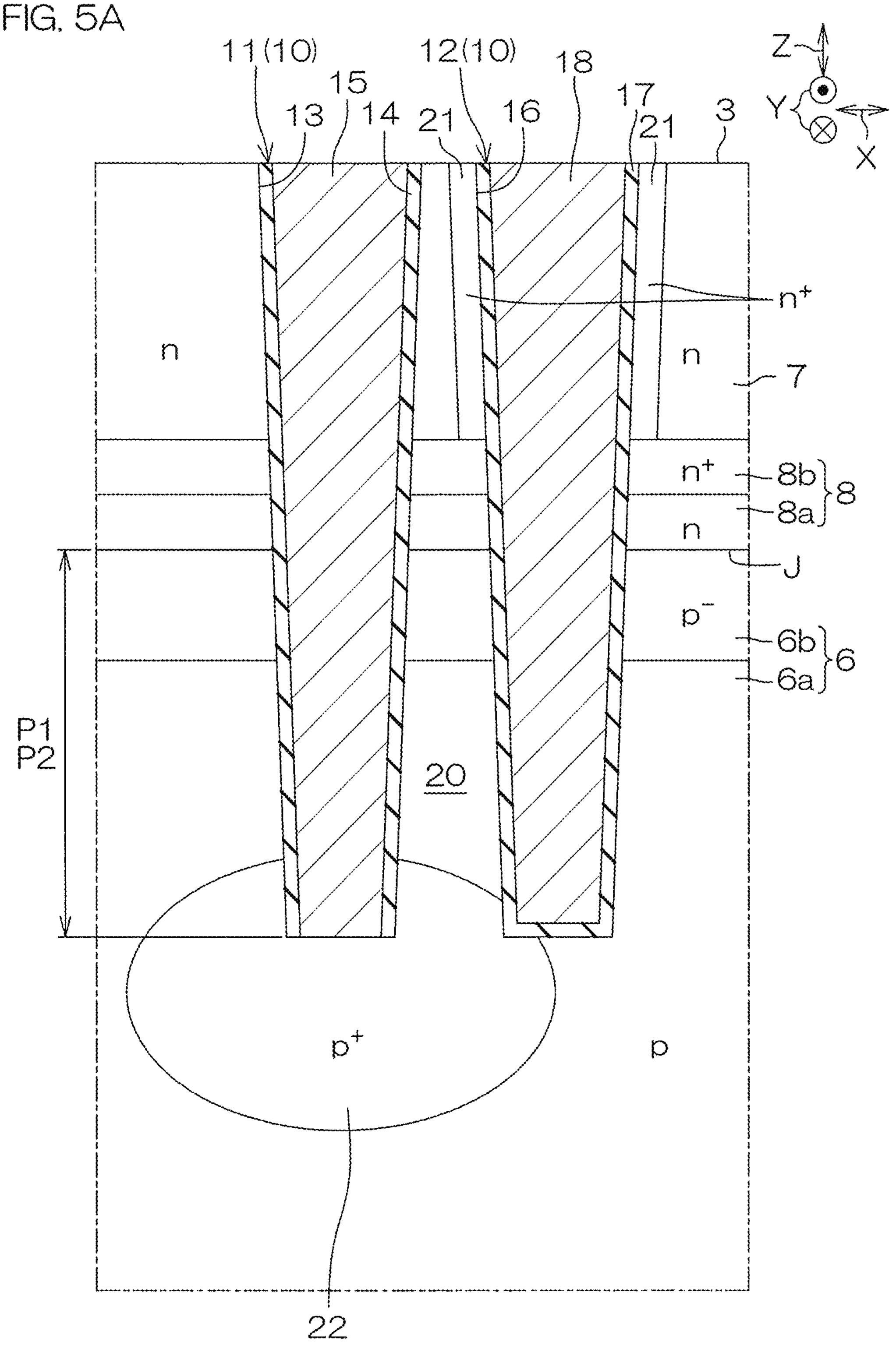
FIG. 5A is a sectional view showing the sectional structure shown in FIG. 4 together with the second trench structure according to a second configuration example.

The second trench structure 12 can take on a form other than the form shown in FIG. 3 and FIG. 4. Other configuration examples of the second trench structure 12 shall be illustrated below with reference to FIG. 5A and FIG. 5B. FIG. 5A is a sectional view showing the sectional structure shown in FIG. 4 together with the second trench structure 12 according to a second configuration example. In the following, structures corresponding to structures described with reference to FIG. 1 to FIG. 4 are provided with the same reference signs and description thereof shall be omitted.

Referring to FIG. 5A, the second trench structure 12 not having the bottom side insulator 19 may be adopted. That is, the second trench structure 12 may include the second insulating film 17 that covers the inner walls (inner peripheral wall, outer peripheral wall, and bottom wall) of the second trench 16 with a substantially uniform thickness. In this case, the second insulating film 17 preferably has a thickness that is less than one-half of the second trench width W2 of the second trench structure 12. The thickness of the second insulating film 17 is a thickness along a normal direction to a wall surface of the second trench structure 12 (second trench 16).

The thickness of the second insulating film 17 is especially preferably less than one-half of a width of the bottom wall of the second trench structure 12. The width of the bottom wall of the second trench structure 12 is a width in a direction orthogonal to the direction in which the second trench structure 12 extends in plan view. Under this condition, the second trench width W2 may be not less than the first trench width W1 of the first trench structure 11 (W1≤W2) or may be less than the first trench width W1 (W1>W2).

Figure 5B:
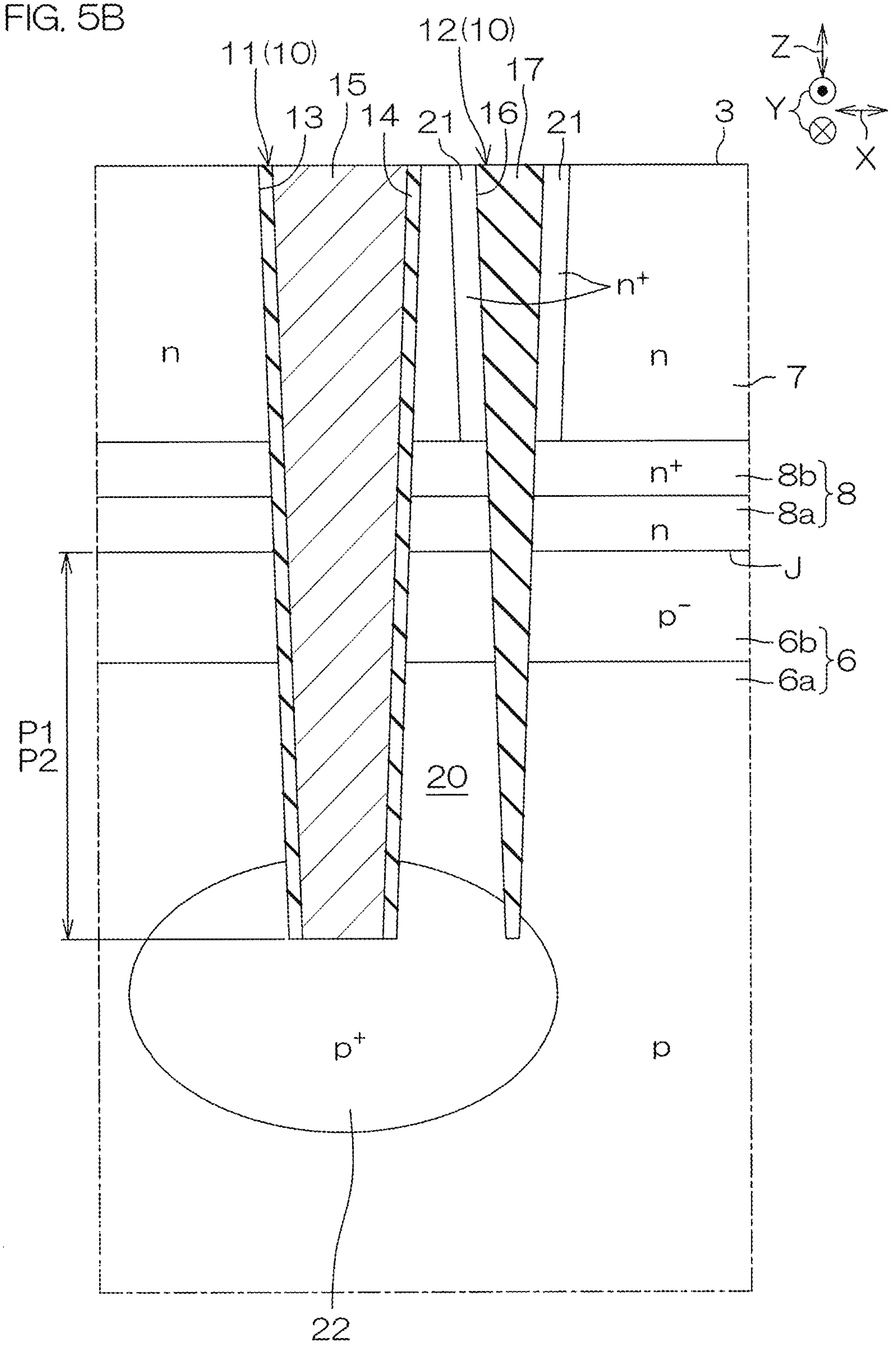
FIG. 5B is a sectional view showing the sectional structure shown in FIG. 4 together with the second trench structure according to a third configuration example.

FIG. 5B is a sectional view showing the sectional structure shown in FIG. 4 together with the second trench structure 12 according to a third configuration example. In the following, structures corresponding to structures described with reference to FIG. 1 to FIG. 4 are provided with the same reference signs and description thereof shall be omitted.

Referring to FIG. 5B, the second trench structure 12 not having the second electrode 18 may be adopted. That is, the second trench structure 12 may include the second insulating film 17 that is embedded in the second trench 16 as an integrated member. In this case, the second trench structure 12 may be referred to as a "trench insulating structure." Under this condition, the second trench width W2 may be not less than the first trench width W1 of the first trench structure 11 (W1≤W2) or may be less than the first trench width W1 (W1>W2).

Figure 6:
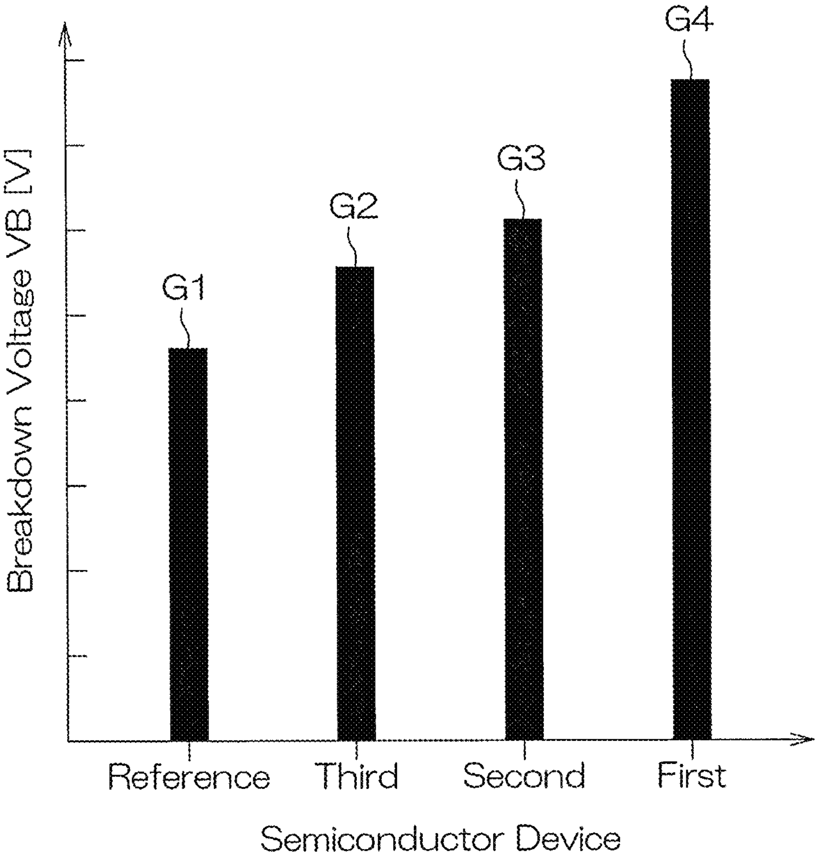
FIG. 6 is a graph showing breakdown voltages of the semiconductor devices shown in FIG. 1, FIG. 5A, and FIG. 5B together with a breakdown voltage of a semiconductor device according to a reference example.

FIG. 6 is a graph showing breakdown voltages VB of the semiconductor devices 1 shown in FIG. 1, FIG. 5A, and FIG. 5B together with a breakdown voltage VB of a semiconductor device according to a reference example. In FIG. 6, the ordinate shows the breakdown voltage VB [V] and the abscissa shows the item (the semiconductor device that is the measured object). Here, a potential of 0 V is applied to the first layer 6 and the first trench structure 11. The voltages here are voltages on a basis of the potential (=0 V) of the first layer 6.

A first graph bar G1, a second graph bar G2, a third graph bar G3, and a fourth graph bar G4 are shown in FIG. 6. The first graph bar G1 shows the breakdown voltage VB of the semiconductor device according to the reference example. The semiconductor device according to the reference example has the same structure as the semiconductor device 1 with the exception of not including the second trench structure 12. Other descriptions of the semiconductor device according to the reference example shall be omitted.

The second graph bar G2 shows the breakdown voltage VB of the semiconductor device 1 that includes the second trench structure 12 according to the third configuration example (see FIG. 5B). The third graph bar G3 shows the breakdown voltage VB of the semiconductor device 1 that includes the second trench structure 12 according to the second configuration example (see FIG. 5A). The fourth graph bar G4 shows the breakdown voltage VB of the semiconductor device 1 that includes the second trench structure 12 according to the first configuration example (see FIG. 3 and FIG. 4).

Referring to the first to fourth graph bars G1 to G4, the breakdown voltage VB increased in an order of the semiconductor device according to the reference example, the semiconductor device 1 that includes the second trench structure 12 according to the third configuration example, the semiconductor device 1 that includes the second trench structure 12 according to the second configuration example, and the semiconductor device 1 that includes the second trench structure 12 according to the first configuration example.

These results showed that it is preferable for the trench separation structure 10 to have the multi-trench structure that includes the first trench structure 11 and the second trench structure 12 (see the second to fourth graph bars G2 to G4). In this structure, an electric field concentration with respect to the first trench structure 11 is relaxed by the second trench structure 12 and the breakdown voltage VB is improved.

It was shown that when the trench separation structure 10 has the multi-trench structure, it is especially preferable for the first trench structure 11 to be constituted of the first trench electrode structure that includes the first electrode 15 and the second trench structure 12 to be constituted of the second trench electrode structure that includes the second electrode 18 (see the third and fourth graph bars G3 and G4). With this structure, an electric field concentration with respect to the second trench structure 12 is relaxed further and the breakdown voltage VB is improved further.

It was further shown that the second trench structure 12 preferably includes the bottom side insulator 19 in the structure including the second electrode 18 (see the fourth graph bar G4). When the bottom side insulator 19 is included, a facing area of the first layer 6 and the second electrode 18 in the second trench structure 12 is decreased and a parasitic capacitance of the second trench structure 12 is reduced. Consequently, the electric field concentration with respect to the second trench structure 12 is relaxed further and the breakdown voltage VB is improved further.

As described above, the semiconductor device 1 includes the chip 2, the pn-junction portion J, the transistor region 9A (device region 9), the first trench structure 11, and the second trench structure 12. The chip 2 has the first main surface 3 on the one side and the second main surface 4 on the other side. The pn-junction portion J is formed such as to extend in the horizontal direction along the first main surface 3 at an intermediate portion inside the chip 2 between the first main surface 3 and the second main surface 4. The transistor region 9A is provided in the first main surface 3.

The first trench structure 11 is formed in the first main surface 3 such as to penetrate through pn-junction portion J and demarcates the transistor region 9A in the first main surface 3. The second trench structure 12 is formed in the first main surface 3 such as to penetrate through the pn-junction portion J and demarcates the transistor region 9A in the region further to the transistor region 9A side than the first trench structure 11. With this structure, the semiconductor device 1 with which a withstand voltage (specifically, the breakdown voltage VB) can be improved can be provided.

From another point of view, the semiconductor device 1 includes the first layer 6 of the p-type, the second layer 7 of the p-type or the n-type (the n-type in this embodiment), the third layer 8 of the n-type, the transistor region 9A (device region 9), the first trench structure 11 (first trench electrode structure), and the second trench structure 12 (second trench electrode structure). The second layer 7 is laminated on the first layer 6. The third layer 8 is interposed between the first layer 6 and the second layer 7. The device region 9 is provided in the second layer 7.

The first trench structure 11 penetrates through the second layer 7 and the third layer 8 such as to reach the first layer 6. The first trench structure 11 demarcates the transistor region 9A in the second layer 7. The second trench structure 12 penetrates through the second layer 7 and the third layer 8 such as to reach the first layer 6. The second trench structure 12 demarcates the transistor region 9A in the region of the second layer 7 further to the transistor region 9A side than the first trench structure 11. With this structure, the semiconductor device 1 with which the withstand voltage (specifically, the breakdown voltage VB) can be improved can be provided.

Preferably, the first trench structure 11 is electrically connected to the chip 2. Specifically, the first trench structure 11 is preferably constituted of the first trench electrode structure that is electrically connected to the first layer 6 and electrically insulated from the second layer 7 and the third layer 8. Preferably, the second trench structure 12 is electrically insulated from the chip 2. Specifically, the second trench structure 12 is preferably constituted of the second trench electrode structure that is electrically insulated from the first layer 6, the second layer 7 and the third layer 8. That is, the second trench structure 12 preferably has an electrode structure that differs mutually from the first trench structure 11. With this structure, the electric field concentration with respect to the second trench structure 12 can be relaxed and the breakdown voltage VB can thereby be improved further.

The second trench structure 12 is preferably electrically separated from the first trench structure 11. The second trench structure 12 is preferably formed in the electrically floating state. Preferably, a potential different from that of the first trench structure 11 is to be occurred in the second trench structure 12.

Preferably, the first trench structure 11 has the first trench width W1 and the second trench structure 12 has the second trench width W2 that is not more than the first trench width W1 ($W2 \leq W1$). Preferably, the second trench structure 12 is formed at an interval of not more than the first trench width W1. The first trench width W1 may be not less than 0.5 μm and not more than 10 μm.

Preferably, the first trench structure 11 is formed in a shape convergent toward the thickness direction (second main surface 4 side). Preferably, the second trench structure 12 is formed in a shape convergent toward the thickness direction (second main surface 4 side). Preferably, the first trench structure 11 surrounds the device region 9 in plan view. Preferably, the second trench structure 12 surrounds the device region 9 in plan view.

Preferably, the first trench structure 11 includes the first trench 13 that penetrates through the second layer 7 and the third layer 8 such as to reach the first layer 6, the first insulating film 14 that covers the inner walls of the first trench 13 such as to expose the first layer 6, and the first electrode 15 that is embedded in the first trench 13 with the first insulating film 14 therebetween such as to be electrically connected to the first layer 6 and electrically insulated from the second layer 7 and the third layer 8.

Preferably, the second trench structure 12 includes the second trench 16 that penetrates through the second layer 7 and the third layer 8 such as to reach the first layer 6, the second insulating film 17 that covers the inner walls of the second trench 16, and the second electrode 18 that is embedded in the second trench 16 with the second insulating film 17 therebetween such as to be electrically insulated from the first layer 6, the second layer 7 and the third layer 8.

Preferably, the first electrode 15 includes a conductive polysilicon of the p-type. Preferably, the second electrode 18 includes a conductive polysilicon of the p-type. Preferably, the second trench structure 12 includes the bottom side insulator 19 that is embedded in the bottom wall side of the second trench 16 such as to be continuous to the second insulating film 17 and has the thickness exceeding the thickness of the second insulating film 17. Preferably, the second electrode 18 is embedded in the second trench 16 with the second insulating film 17 and the bottom side insulator 19 therebetween. With this structure, the electric field concentration with respect to the second trench structure 12 can be relaxed and the breakdown voltage VB can thereby be improved further.

Preferably, the first layer 6 includes the high concentration layer **6*a* of the p-type that has the comparatively high impurity concentration and the low concentration layer 6*b* of the p-type that is laminated on the high concentration layer 6*a* and has the impurity concentration lower than the high concentration layer 6*a*. Preferably, the third layer 8 is laminated on the low concentration layer 6*b*. In this case, the high concentration layer 6*a*** is preferably constituted of the semiconductor substrate of the p-type.

Preferably, the third layer 8 includes the low concentration embedded layer **8*a* of the n-type that is laminated on the first layer 6 and has the comparatively low impurity concentration and the high concentration embedded layer 8*b* of the n-type that is laminated on the low concentration embedded layer 8*a* and has the impurity concentration higher than the low concentration embedded layer 8*a*. In this case, the second layer 7 is preferably laminated on the high concentration embedded layer 8*b*. With this structure, the electric field concentration with respect to the second trench structure 12 can be relaxed by the low concentration embedded layer 8*a*. Thus, in comparison to a case where the third layer 8 has a single layer structure constituted of just the high concentration embedded layer 8*b***, the withstand voltage can be improved.

Preferably, the semiconductor device 1 includes the impurity region 22 of the p-type that is formed in the region inside the chip 2 along the bottom wall of the first trench structure 11. Preferably, the impurity region 22 is formed in the first layer 6 and has the impurity concentration higher than the first layer 6. Preferably, the impurity region 22 covers the bottom wall of the second trench structure 12. Preferably, the semiconductor device 1 includes the sinker region 21 of the n-type that cover the side wall of the second trench structure 12 inside the chip 2. Preferably, the sinker region 21 is formed inside the second layer 7 such as to extend along the side wall of the second trench structure 12.

Figure 7:
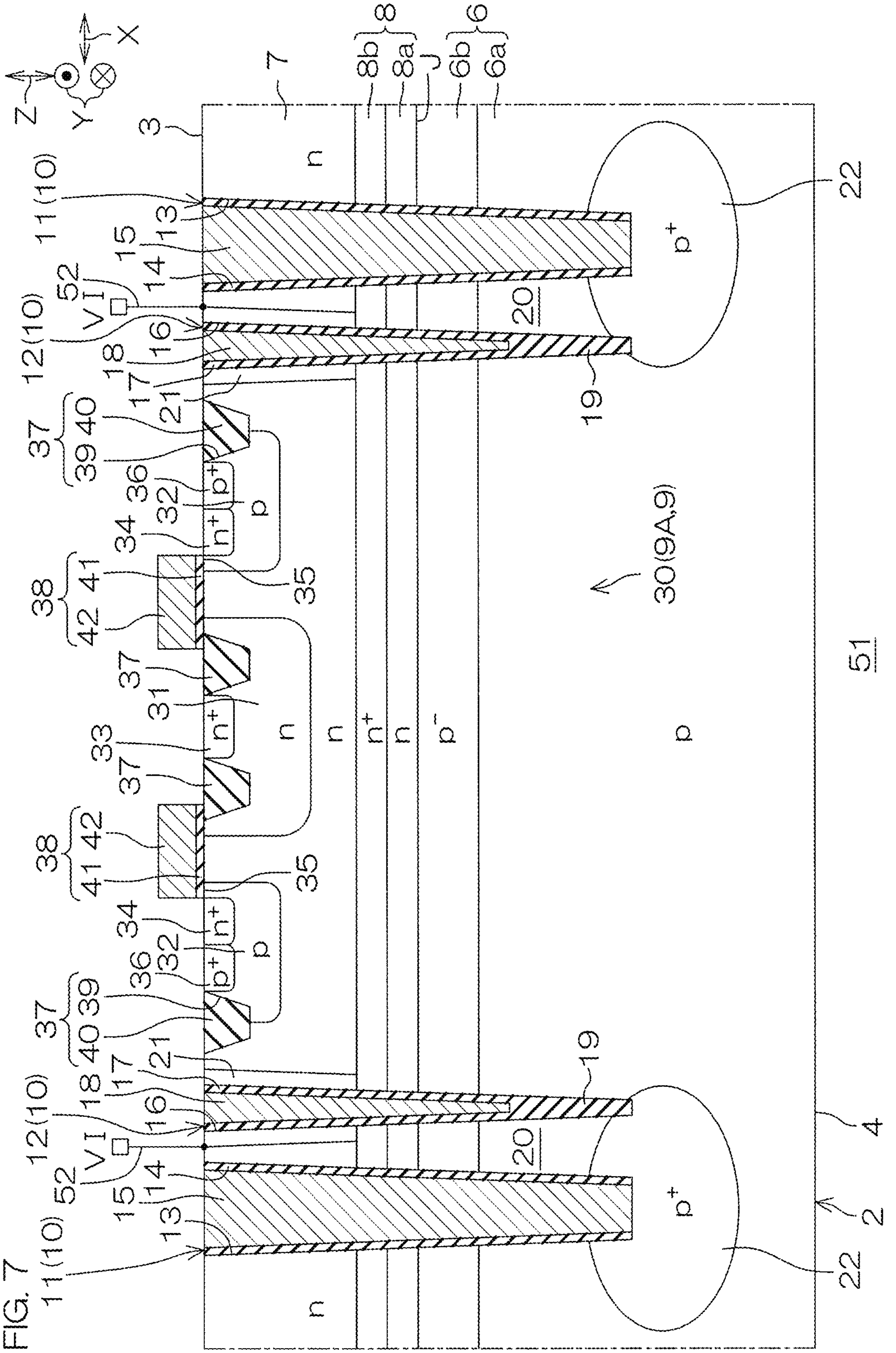
FIG. 7 corresponds to FIG. 3 and is a sectional view showing a semiconductor device according to a second embodiment.

FIG. 7 corresponds to FIG. 3 and is a sectional view showing a semiconductor device 51 according to a second embodiment. In the following, structures corresponding to structures described for the first embodiment are provided with the same reference signs and description thereof shall be omitted.

As in the first embodiment, the semiconductor device 51 includes the first trench structure 11 that is electrically connected to the chip 2 (first layer 6) and the second trench structure 12 that is electrically insulated from the chip 2. The second trench structure 12 is formed in the electrically floating state. In this embodiment, the semiconductor device 51 includes the inter-trench region 20 to which, unlike in the first embodiment, an inter-trench potential VI of not less than 0 V is to be applied. The inter-trench potential VI is to be applied to the inter-trench region 20 from an exterior of the chip 2.

Preferably, the inter-trench potential VI is set to any value in a potential range of not less than 0 V and not more than a maximum value of the potential to be applied to the transistor region 9A (MISFET 30). Preferably, the inter-trench potential VI exceeds 0 V. Preferably, the inter-trench potential VI differs from the potential to be applied to the first trench structure 11. Preferably, the inter-trench potential VI differs from the potential to be applied to the second trench structure 12.

Preferably, the inter-trench potential VI differs from the potential to be applied to the MISFET 30 (transistor region 9A). The potential at the inter-trench region 20 is raised to the inter-trench potential VI. In a state where the inter-trench potential VI is to be applied, a potential gradient that decreases gradually from the first main surface 3 side toward the first layer 6 side is formed in the inter-trench region 20.

In this embodiment, the semiconductor device 51 includes a first contact electrode 52 that is electrically connected to the inter-trench region 20 on the chip 2 (second layer 7). In FIG. 7, the first contact electrode 52 is illustrated in a simple manner by a line. The first contact electrode 52 applies the inter-trench potential VI to the inter-trench region 20.

Figure 8:
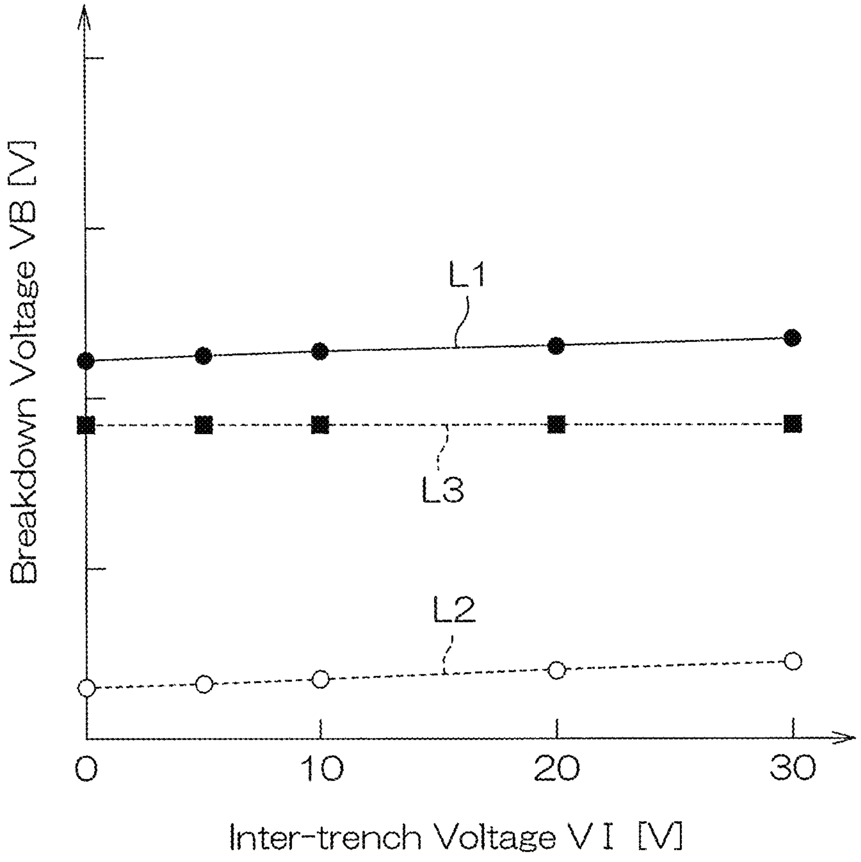
FIG. 8 is a graph showing a breakdown voltage of the semiconductor device shown in FIG. 7.

FIG. 8 is a graph showing a breakdown voltage VB of the semiconductor device 51 shown in FIG. 7. In FIG. 8, the ordinate shows the breakdown voltage VB [V] and the abscissa shows the inter-trench potential VI [V]. Here, arbitrary inter-trench potentials VI in a range between 0 V and 30 V are applied to the inter-trench region 20. Also, here, a potential of 0 V is applied to the first layer 6 and the first trench structure 11. The voltages here are voltages on the basis of the potential (=0 V) of the first layer 6. The inter-trench potentials VI may be replaced by inter-trench voltages on the basis of the potential (=0 V) of the first layer 6.

A first polygonal line L1 (see solid line through plotted black circles), a second polygonal line L2 (see broken line through plotted white circles), and a third polygonal line L3 (see broken line through plotted squares) are shown in FIG. 8. The first polygonal line L1 shows the breakdown voltage VB of the semiconductor device 51. The second polygonal line L2 shows a voltage at the second trench structure 12. The third polygonal line L3 shows a differential voltage resulting from subtracting the voltage at the second trench structure 12 from the breakdown voltage VB.

Referring to the first polygonal line L1, the breakdown voltage VB increased with increase in the inter-trench potential VI. Also, referring to the second polygonal line L2, the voltage occurred in the second trench structure 12 increased with increase in the inter-trench potential VI. On the other hand, referring to the third polygonal line L3, the differential voltage was substantially fixed regardless of increase in the inter-trench potential VI.

The above showed that it is more preferable for the inter-trench region 20 to be fixed at the inter-trench potential VI of not less than 0 V than to be formed in the electrically floating state. Also, it was shown that when the voltage at the second trench structure 12 when the inter-trench potential VI is 0 V is set as a reference value, an increase amount of the voltage at the second trench structure 12 from the reference value is added to the breakdown voltage VB. In this embodiment, the increase amount of the voltage at the second trench structure 12 was within a range of not less than 40% and not more than 50% of the inter-trench potential VI. In other words, a value within the range of not less than 40% and not more than 50% of the inter-trench potential VI was added to the breakdown voltage VB (voltage at the second trench structure 12).

As described above, the semiconductor device 51 includes the inter-trench region 20 to which the inter-trench potential VI of not less than 0 V is to be applied in the region between the first trench structure 11 and the second trench structure 12. With this structure, the semiconductor device 51 with which the withstand voltage (specifically, the breakdown voltage VB) can be improved can be provided.

Figure 9:
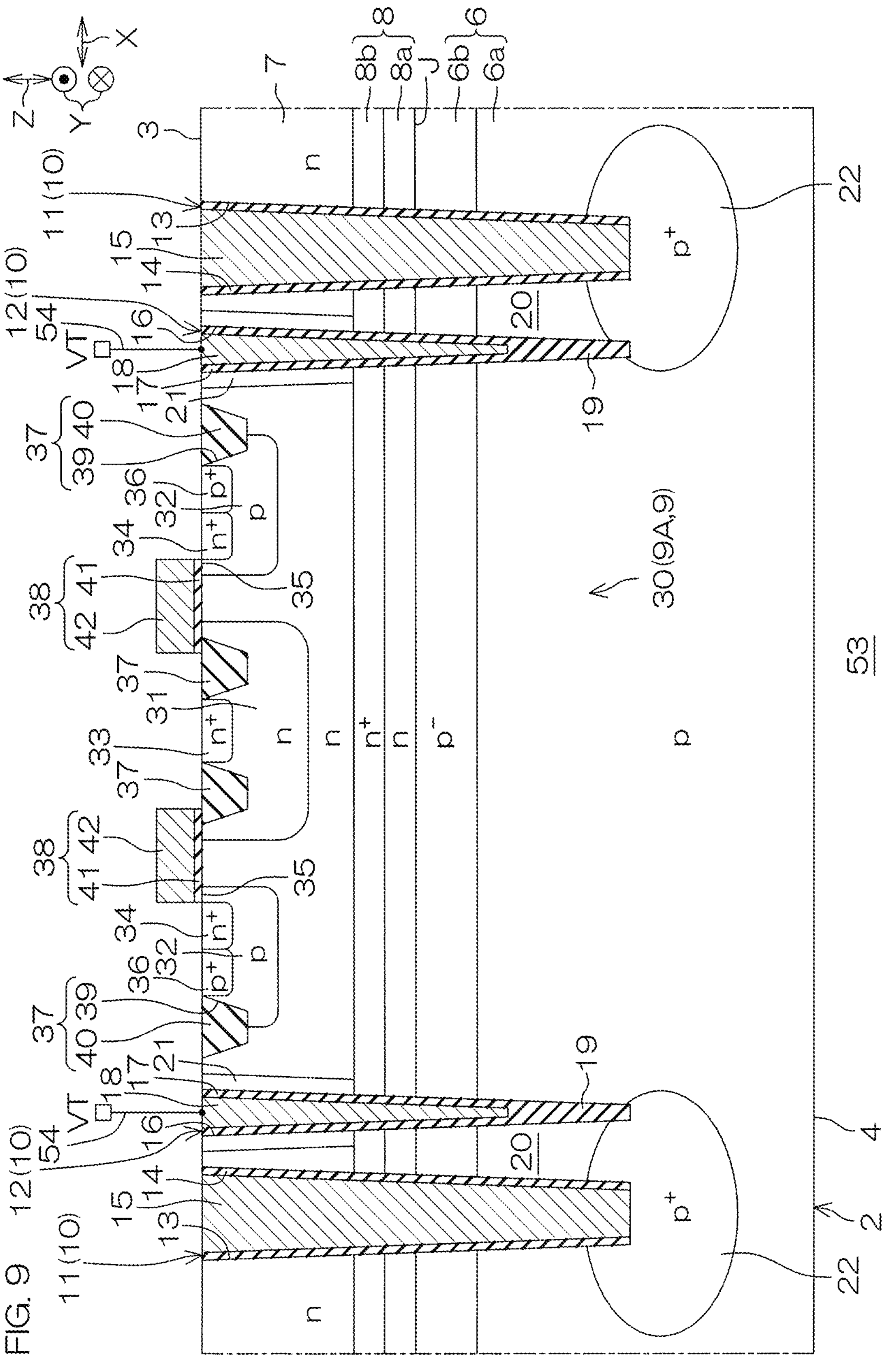
FIG. 9 corresponds to FIG. 7 and is a sectional view showing a semiconductor device according to a third embodiment.

FIG. 9 corresponds to FIG. 7 and is a sectional view showing a semiconductor device 53 according to a third embodiment. In the following, structures corresponding to structures described for the first and second embodiments are provided with the same reference signs and description thereof shall be omitted.

As in the first embodiment, the semiconductor device 53 includes the first trench structure 11 that is electrically connected to the chip 2 (first layer 6) and the inter-trench region 20 that is formed in the electrically floating state. In this embodiment, the semiconductor device 53 includes the second trench structure 12 to which, unlike in the first embodiment, a trench potential VT of not less than 0 V is to be applied. The trench potential VT is to be applied to the second trench structure 12 from the exterior of the chip 2.

Preferably, the trench potential VT is set to any value in a potential range of not less than 0 V and not more than the maximum value of the potential to be applied to the transistor region 9A (MISFET 30). Preferably, the trench potential VT exceeds 0 V. Preferably, the trench potential VT differs from the potential to be applied to the first trench structure 11. Preferably, the trench potential VT differs from the potential to be applied to the inter-trench region 20. Preferably, the trench potential VT differs from the potential to be applied to the MISFET 30 (transistor region 9A). The potential at the second trench structure 12 is raised to the trench potential VT. In a state where the trench potential VT is to be applied, a potential gradient that decreases gradually from the first main surface 3 side toward the first layer 6 side is formed in the second trench structure 12.

In this embodiment, the semiconductor device 53 includes a second contact electrode 54 on the chip 2 (second layer 7) that is electrically connected to the second trench structure 12. In FIG. 9, the second contact electrode 54 is illustrated in a simple manner by a line. The second contact electrode 54 applies the trench potential VT to the second trench structure 12.

Figure 10:
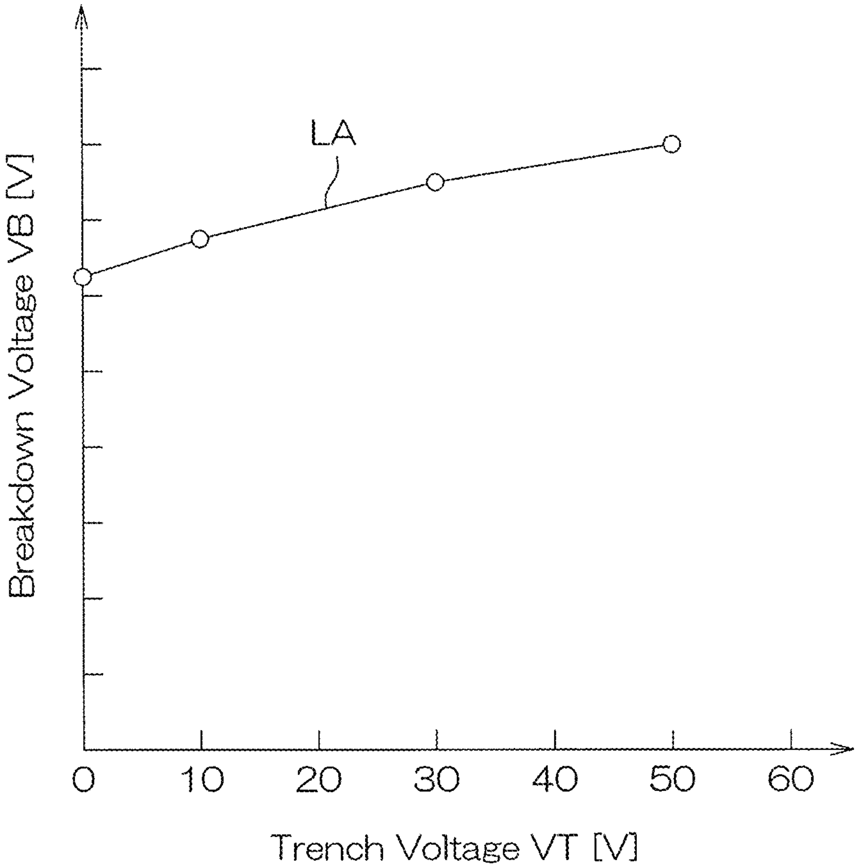
FIG. 10 is a graph showing a breakdown voltage of the semiconductor device shown in FIG. 9.

FIG. 10 is a graph showing a breakdown voltage VB of the semiconductor device 53 shown in FIG. 9. In FIG. 10, the ordinate shows the breakdown voltage VB [V] and the abscissa shows the trench potential VT [V]. Here, arbitrary trench potentials VT in a range between 0 V and 60 V are applied to the second trench structure 12. Also, here, a potential of 0 V is applied to the first layer 6 and the first trench structure 11. The voltages here are voltages on the basis of the potential (=0 V) of the first layer 6. The trench potential VT may be replaced by trench voltage on the basis of the potential (=0 V) of the first layer 6.

A single polygonal line LA is shown in FIG. 10. The single polygonal line LA shows the breakdown voltage VB of the semiconductor device 53. Referring to the polygonal line LA, the breakdown voltage VB increased with increase in the trench potential VT. This showed that it is more preferable for the second trench structure 12 to be fixed at the trench potential VT of at least not less than 0 V than to be formed in the electrically floating state.

As described above, the semiconductor device 53 includes the second trench structure 12 to which the trench potential VT of not less than 0 V is to be applied. With this structure, the semiconductor device 53 with which the withstand voltage (specifically, the breakdown voltage VB) can be improved can be provided.

Figure 11:
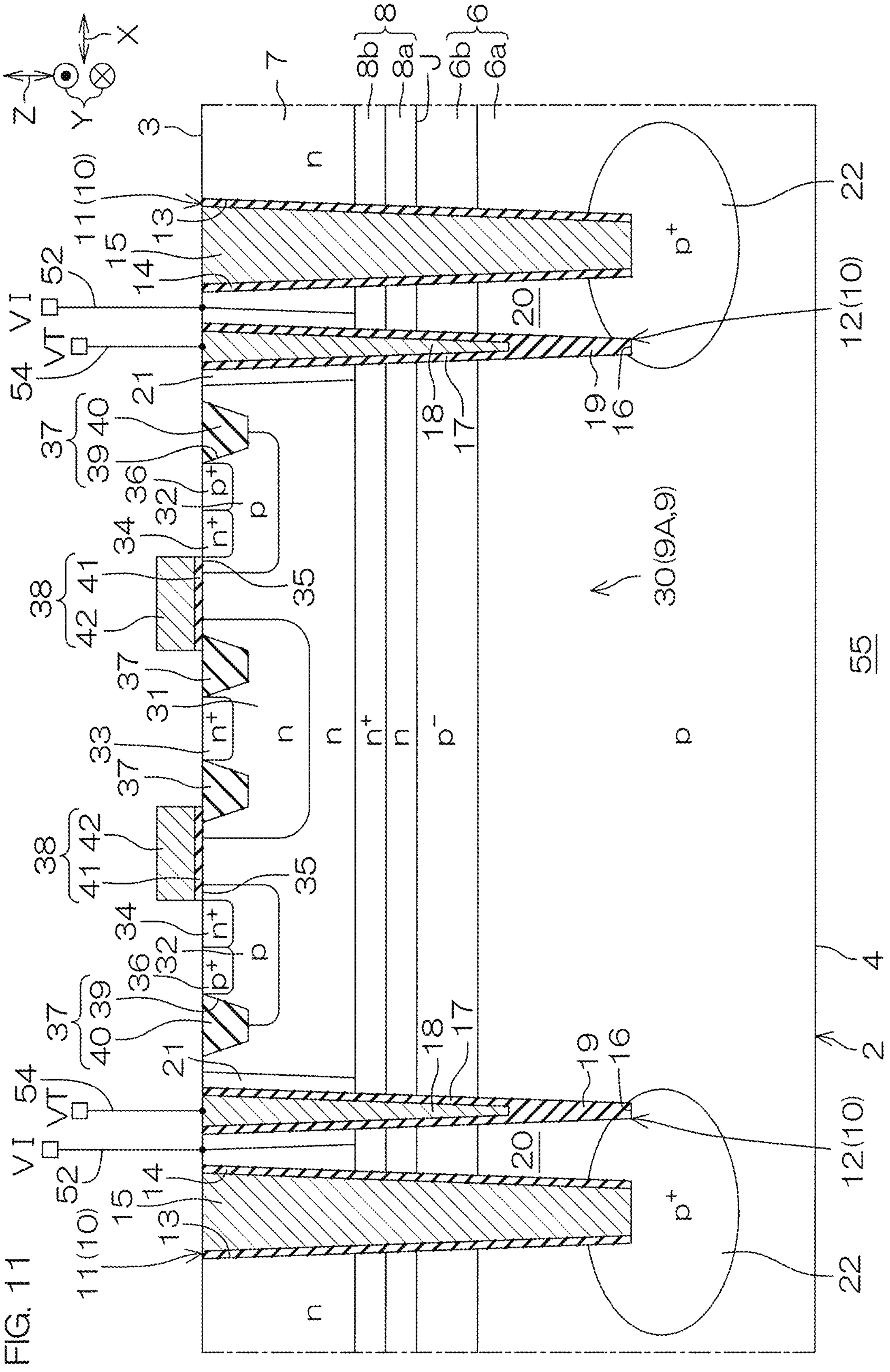
FIG. 11 corresponds to FIG. 7 and is a sectional view showing a semiconductor device according to a fourth embodiment.

FIG. 11 corresponds to FIG. 7 and is a sectional view showing a semiconductor device 55 according to a fourth embodiment. In the following, structures corresponding to structures described for the first to third embodiments are provided with the same reference signs and description thereof shall be omitted.

Referring to FIG. 11, the semiconductor device 55 has a structure in which the semiconductor device 51 according to the second embodiment and the semiconductor device 53 according to the third embodiment are combined. That is, the semiconductor device 55 includes the first trench structure 11 that is electrically connected to the chip 2 (first layer 6), the second trench structure 12 to which the trench potential VT of not less than 0 V is to be applied, and the inter-trench region 20 to which the inter-trench potential VI of not less than 0 V is to be applied. Also, the semiconductor device 55 includes, on the chip 2 (second layer 7), the first contact electrode 52 that is electrically connected to the inter-trench region 20 and the second contact electrode 54 that is electrically connected to the second trench structure 12. In FIG. 11, the first contact electrode 52 and the second contact electrode 54 are illustrated in a simple manner by lines.

As described above, with the semiconductor device 55, a withstand voltage improvement effect using the inter-trench potential VI and a withstand voltage improvement effect using the trench potential VT can be obtained. The semiconductor device 55 with which the withstand voltage (specifically, the breakdown voltage VB) can be improved can thus be provided.

Figure 12:
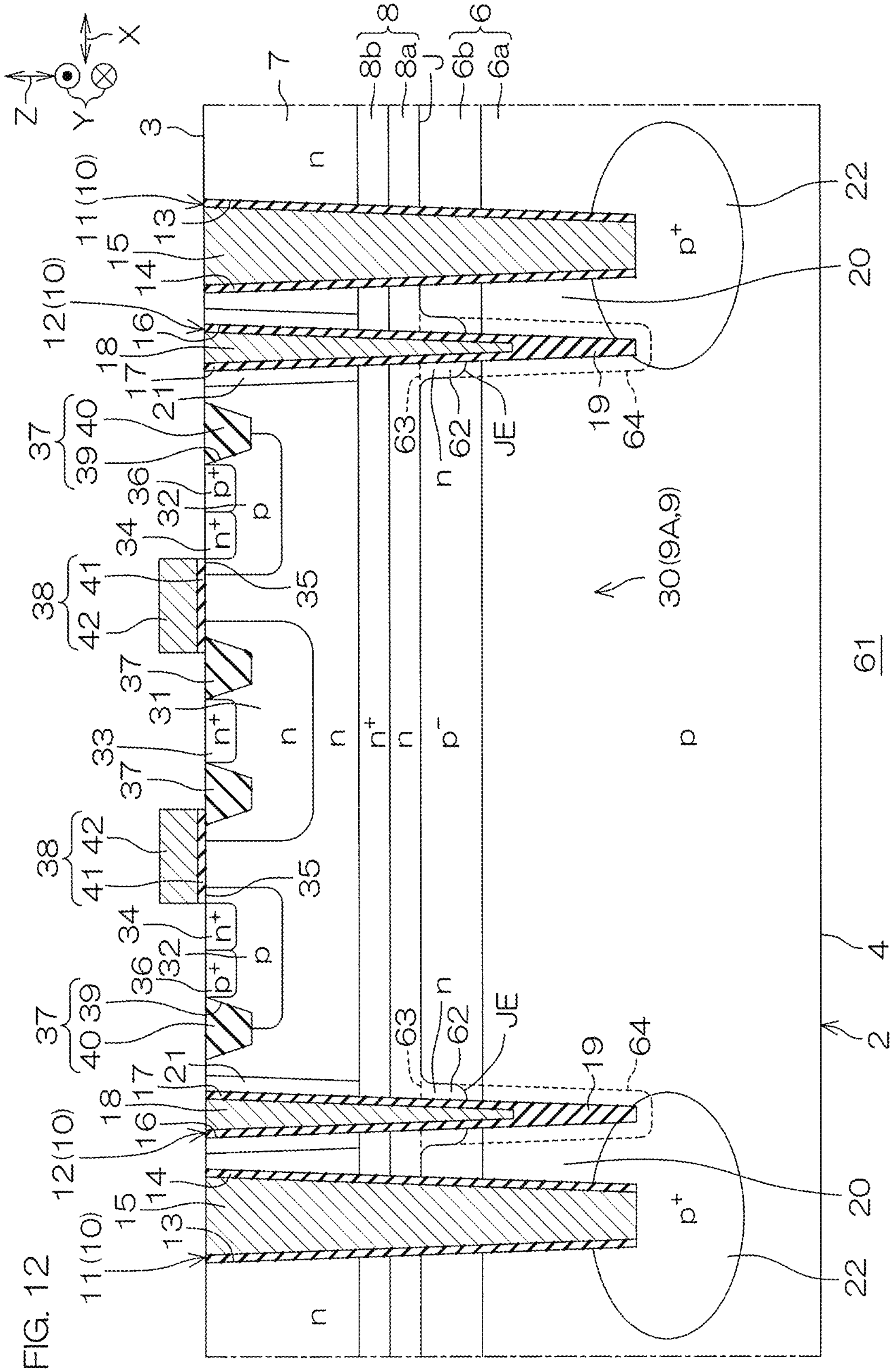
FIG. 12 corresponds to FIG. 3 and is a sectional view showing a semiconductor device according to a fifth embodiment.
Figure 13:
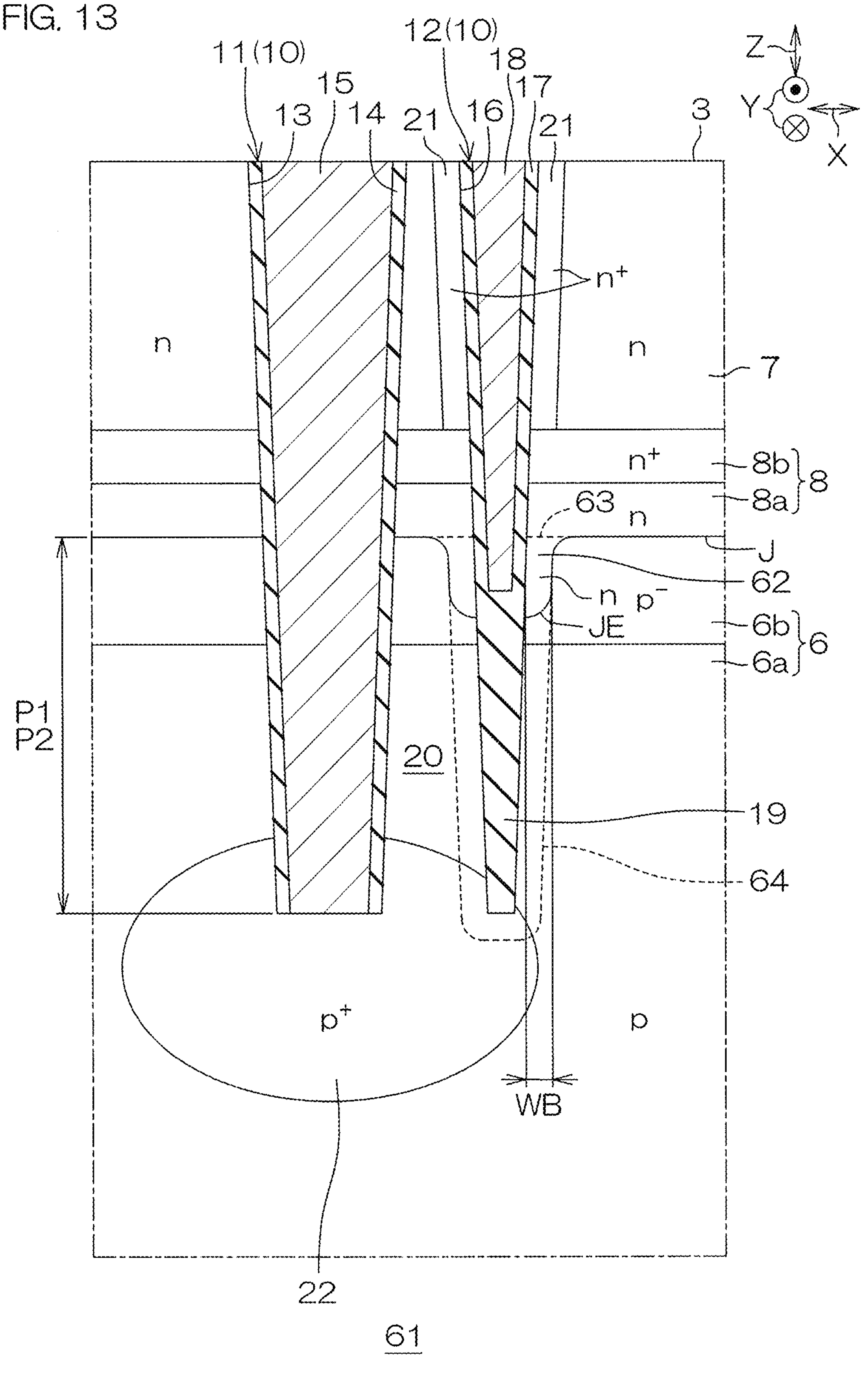
FIG. 13 is an enlarged sectional view of principal portions of the structure shown in FIG. 12.

FIG. 12 corresponds to FIG. 3 and is a sectional view showing a semiconductor device 61 according to a fifth embodiment. FIG. 13 is an enlarged sectional view of principal portions of the structure shown in FIG. 12. In the following, structures corresponding to structures described for the first to fourth embodiments are provided with the same reference signs and description thereof shall be omitted.

Referring to FIG. 12 and FIG. 13, the semiconductor device 61 includes side wall buffer layers 62 of the n-type. The side wall buffer layers 62 project from intersection portions 63 of the third layer 8 and the side walls of the second trench structure 12 toward the first layer 6 in the device region 9 and extend as films along the side walls of the second trench structure 12. The intersection portions 63 are also intersection portions of the pn-junction portion J and the side walls of the second trench structure 12.

The side wall buffer layers 62 extend from the intersection portions 63 of the second trench structure 12 that is most proximate to the device region 9 among the trench separation structure 10 toward the bottom wall of the second trench structure 12. In this embodiment, the intersection portions 63 are formed of the low concentration embedded layer 8*a* of the third layer 8 and the second trench structure 12. The side wall buffer layers 62 therefore project from the low concentration embedded layer 8*a* toward the bottom wall of the second trench 16.

In this embodiment, the side wall buffer layers 62 include the side wall buffer layer 62 on one side and the side wall buffer layer 62 on another side. The side wall buffer layer 62 on the one side extends from the intersection portion 63 on the inner peripheral wall side of the second trench structure 12 toward the bottom wall of the second trench structure 12. The side wall buffer layer 62 on the other side extends from the intersection portion 63 on the outer peripheral wall side of the second trench structure 12 toward the bottom wall of the second trench structure 12. In this embodiment, the side wall buffer layers 62 are formed at intervals from the first trench structure 11 that is not proximate to the device region 9 and are formed just along the second trench structure 12 that is proximate to the device region 9.

Preferably, the side wall buffer layers 62 are formed at depth positions between the third layer 8 and the bottom wall of the second trench structure 12. Preferably, the side wall buffer layers 62 are formed at intervals to the third layer 8 side from the bottom wall of the second trench structure 12. Preferably, the side wall buffer layers 62 project into the low concentration layer 6*b* from the intersection portions 63. Preferably, the side wall buffer layers 62 are formed inside the low concentration layer 6*b* at intervals to the third layer 8 side from the high concentration layer 6*a*. The side wall buffer layers 62 have an n-type impurity concentration that is lower than the p-type impurity concentration of the high concentration layer 6*a*. The n-type impurity concentration of the side wall buffer layers 62 exceeds the p-type impurity concentration of the low concentration layer 6*b*.

The side wall buffer layers 62 face the second electrode 18 with the second insulating film 17 therebetween. The side wall buffer layers 62 are formed on the first main surface 3 side with respect to a depth position of the bottom side insulator 19. Therefore, in this embodiment, the side wall buffer layers 62 face just the second electrode 18 with the second insulating film 17 therebetween. As a matter of course, the side wall buffer layers 62 that cover the bottom side insulator 19 may be formed as well.

Each side wall buffer layer 62 has a predetermined region width WB. The region width WB is a width in a direction orthogonal to a direction in which the side wall buffer layer 62 extends in plan view. In other words, the region width WB is the width of the side wall buffer layer 62 that appears when a portion of the second trench structure 12 extending in the first direction X (second direction Y) is sectioned in the second direction Y (first direction X).

Preferably, the region width WB is less than the first trench width W1 of the first trench structure 11 (WB<W1). Preferably, the region width WB is less than the second trench width W2 of the second trench structure 12 (WB<W2). Preferably, the region width WB is less than the width of the inter-trench region 20 (trench interval IT) (WB<IT). The region width WB may exceed 0 μm but be not more than 10 μm. The region width WB is preferably not more than 3 μm.

In this embodiment, the semiconductor device 61 includes a compensation region 64 of the p-type that is formed in a region of the first layer 6 on the bottom wall side of the second trench structure 12. In FIG. 12 and FIG. 13, the compensation region 64 is indicated by broken lines. The compensation region 64 may also be referred to as an "offset region" or an "offset compensation region." The compensation region 64 includes both an n-type impurity and a p-type impurity and is a region of the p-type having a p-type impurity concentration that exceeds the n-type impurity concentration.

The compensation region 64 is formed along the wall surfaces (side walls and bottom wall) of the second trench structure 12 in a region of the first layer 6 that is further to the bottom wall side of the second trench structure 12 than the side wall buffer layers 62. In this embodiment, the side wall buffer layers 62 are formed by introducing an n-type impurity into the chip 2 interior by an ion implantation method via the inner walls of the second trench 16. The region width WB of each side wall buffer layer 62 is adjusted by adjusting an introduction amount of the n-type impurity introduced via the inner walls of the second trench 16.

An n-type impurity concentration of a portion of the n-type impurity introduced into the high concentration layer 6*a* is less than the p-type impurity concentration of the high concentration layer 6*a*. Therefore, the n-type impurity introduced into the high concentration layer 6*a* is offset by the p-type impurity in a form of maintaining the function of the high concentration layer 6*a* and forms the compensation region 64 of the p-type with the high concentration layer 6*a*. On the other hand, an n-type impurity concentration of a portion of the n-type impurity introduced into the low concentration layer 6*b* exceeds the p-type impurity concentration of the low concentration layer 6*b*. Therefore, the n-type impurity introduced into the low concentration layer 6*b* is offset by the p-type impurity in a form of eliminating the function of the low concentration layer 6*b* and replaces the low concentration layer 6*b* with the side wall buffer layers 62.

Due to the p-type impurity diffusing from the high concentration layer 6*a*, the low concentration layer 6*b* has a concentration gradient where the p-type impurity concentration increases gradually toward the high concentration layer 6*a* side. Therefore, a portion of the n-type impurity introduced into a bottom portion side of the low concentration layer 6*b* is offset by the p-type impurity in a form of being offset from the high concentration layer 6*a* side to the third layer 8 (low concentration embedded layer 8*a*) side. The side wall buffer layers 62 are thereby formed, inside the low concentration layer 6*b*, at intervals to the third layer 8 (low concentration embedded layer 8*a*) side from the high concentration layer 6*a* side. On the other hand, the compensation region 64 is formed along the side walls and the bottom wall of the second trench structure 12 from a thickness direction intermediate portion of the low concentration layer 6*b*. The compensation region 64 may be connected to the impurity region 22 on a lower end portion side.

Each side wall buffer layer 62 forms a pn-junction expansion portion JE that expands the pn-junction portion J with the first layer 6 (specifically, the low concentration layer 6*b*). That is, the semiconductor device 61 includes the pn-junction expansion portions JE that are led out from the intersection portions 63 to the bottom wall side of the second trench structure 12 such as to expand portions of the pn-junction portion J to the bottom wall side of the second trench structure 12 inside the chip 2 (transistor region 9A). The pn-junction expansion portion JE may be referred to as a "pn-connection expansion portion" or a "pn-boundary expansion portion." The pn-junction expansion portion JE is synonymous to the "side wall buffer layer 62." A description of the "pn-junction expansion portion JE" is obtained by replacing "side wall buffer layer 62" with "pn-junction expansion portion JE."

Figure 14:
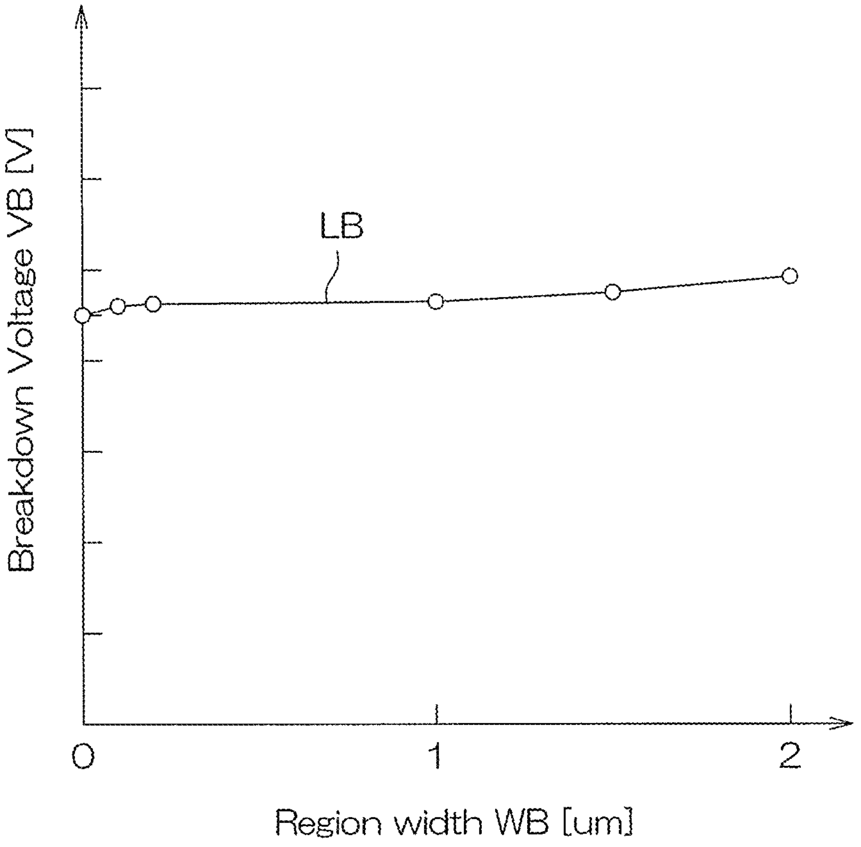
FIG. 14 is a graph showing a breakdown voltage of the semiconductor device shown in FIG. 12.

FIG. 14 is a graph showing a breakdown voltage VB of the semiconductor device 61 shown in FIG. 12. In FIG. 14, the ordinate shows the breakdown voltage VB [V] and the abscissa shows a region width WB [μm]. A single polygonal line LB is shown in FIG. 14. The single polygonal line LB shows the breakdown voltage VB of the semiconductor device 61. Here, the region width WB is adjusted in a range between 0 μm and 2 μm. Also, here, a potential of 0 V is applied to the first layer 6 and the first trench structure 11. The voltages here are voltages on the basis of the potential (=0 V) of the first layer 6.

Referring to the single polygonal line LB, the breakdown voltage VB increased with increase in the region width WB. This showed that it is preferable for the pn-junction expansion portions JE (side wall buffer layers 62) to be formed. This is because electric field concentrations with respect to the intersection portions 63 are relaxed by the pn-junction expansion portions JE (side wall buffer layers 62).

As described above, the semiconductor device 61 includes the pn-junction expansion portion JE that extends from the intersection portion 63 of the pn-junction portion J and the side wall of the second trench structure 12 toward the bottom wall side of the second trench structure 12 such as to expand the pn-junction portion J in the transistor region 9A (device region 9). With this structure, the electric field concentration at the intersection portion 63 can be relaxed by the pn-junction expansion portion JE. The semiconductor device 61 with which the withstand voltage (specifically, the breakdown voltage VB) can be improved can thus be provided.

From another point of view, the semiconductor device 61 includes the side wall buffer layer 62 of the n-type that projects from the intersection portion 63 of the third layer 8 and the second trench structure 12 toward the first layer 6 in the device region 9 and extends along the side wall of the second trench structure 12. With this structure, the electric field concentration at the intersection portion 63 can be relaxed by the side wall buffer layer 62. The semiconductor device 61 with which the withstand voltage (specifically, the breakdown voltage VB) can be improved can thus be provided.

As a matter of course, features according to the second to fourth embodiments may be combined in the semiconductor device 61. That is, the semiconductor device 61 may include the second trench structure 12 to which the trench potential VT of not less than 0 V is to be applied. Also, semiconductor device 61 may include the inter-trench region 20 to which the inter-trench potential VI of not less than 0 V is to be applied.

Figure 15:
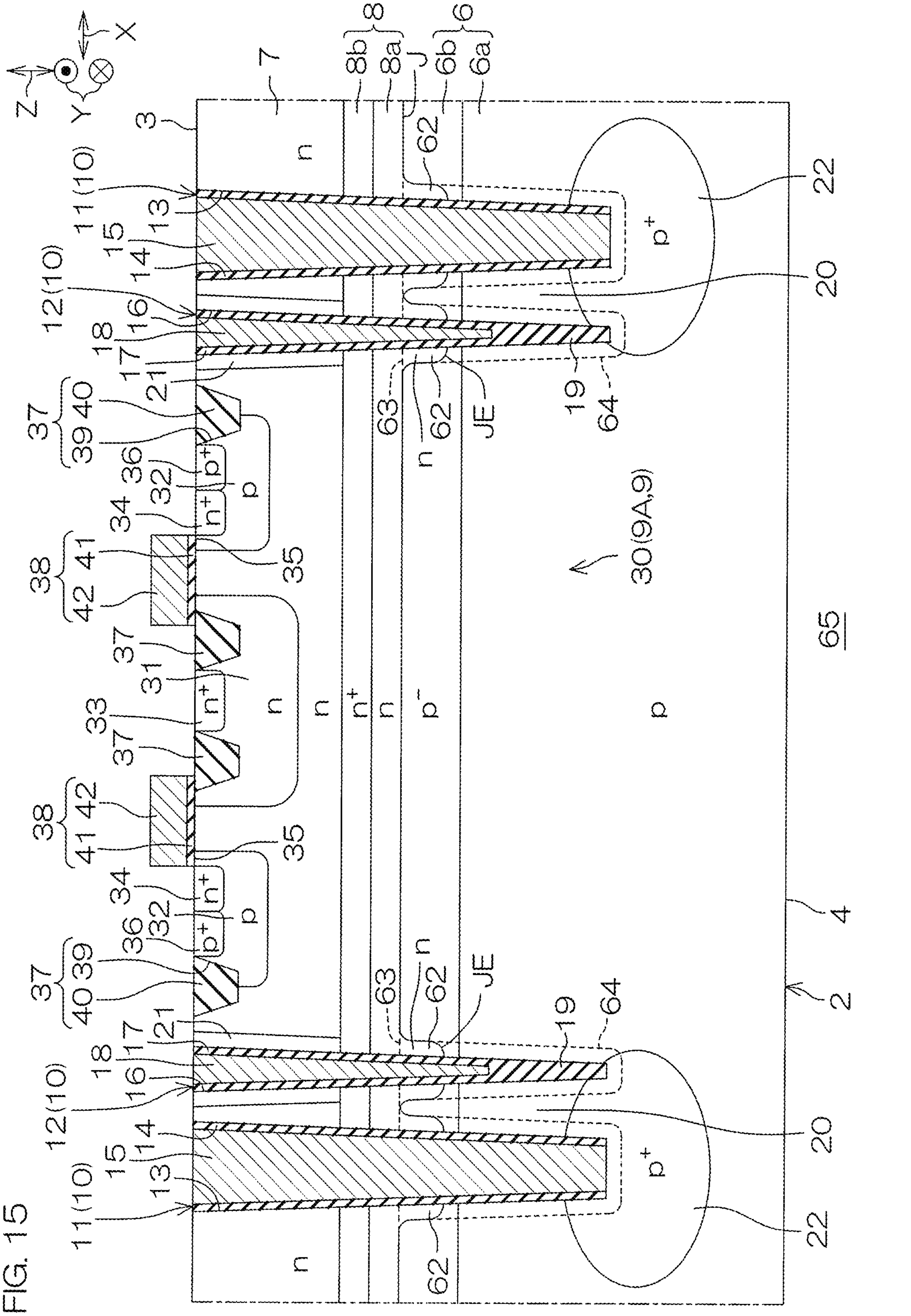
FIG. 15 corresponds to FIG. 12 and is a sectional view showing a semiconductor device according to a sixth embodiment.

FIG. 15 corresponds to FIG. 12 and is a sectional view showing a semiconductor device 65 according to a sixth embodiment. The semiconductor device 65 has a form with which the semiconductor device 61 is modified. In the following, structures corresponding to structures described for the first to fifth embodiments are provided with the same reference signs and description thereof shall be omitted.

With the semiconductor device 61, the side wall buffer layers 62 were formed just along the second trench structure 12. On the other hand, referring to FIG. 15, the semiconductor device 65 includes a plurality of the side wall buffer layers 62 that are oriented along the first trench structure 11 and the second trench structure 12. One set of the side wall buffer layers 62 are formed along the second trench structure 12 in the same mode as in the fifth embodiment and another set of side wall buffer layers 62 are formed along the first trench structure 11 in the same mode as the one set of side wall buffer layers 62.

A specific description of the side wall buffer layers 62 on the first trench structure 11 side is obtained by replacing "second trench structure 12" with "first trench structure 11" in the above description of the semiconductor device 61. The side wall buffer layer 62 on the second trench structure 12 side may be integrated with the side wall buffer layer 62 on the first trench structure 11 side in the inter-trench region 20. As described above, even with the semiconductor device 65, the same effects as the effects described for the semiconductor device 61 are exhibited.

Figure 16:
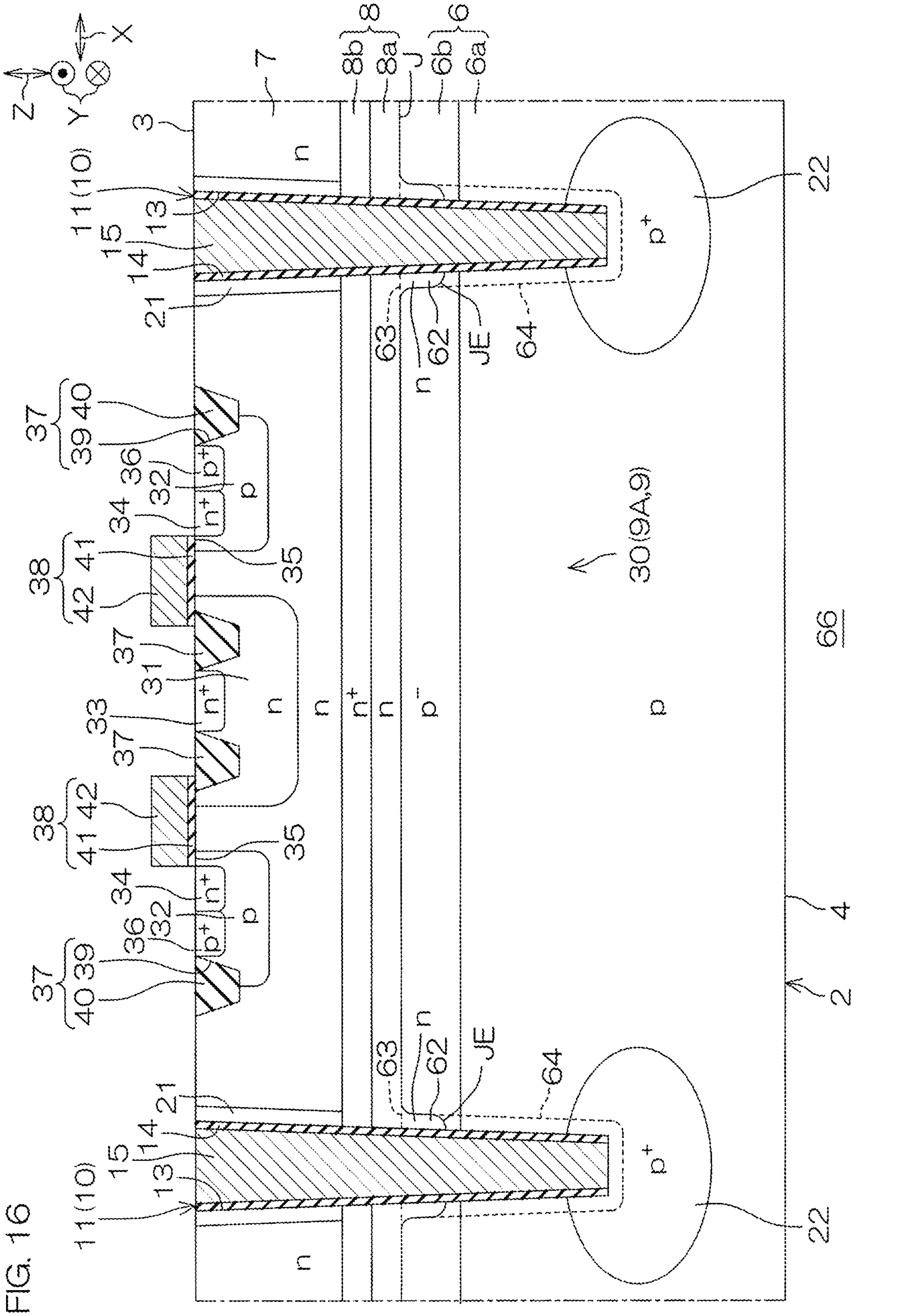
FIG. 16 corresponds to FIG. 12 and is a sectional view showing a semiconductor device according to a seventh embodiment.

FIG. 16 corresponds to FIG. 12 and is a sectional view showing a semiconductor device 66 according to a seventh embodiment. The semiconductor device 66 has a form with which the semiconductor device 61 is modified. In the following, structures corresponding to structures described for the first to sixth embodiments are provided with the same reference signs and description thereof shall be omitted.

With the semiconductor device 61, the trench separation structure 10 includes the first trench structure 11 and the second trench structure 12 and the side wall buffer layers 62 are formed along the second trench structure 12. On the other hand, referring to FIG. 16, with the semiconductor device 66, the trench separation structure does not have the second trench structure 12 but includes just the first trench structure 11 and the side wall buffer layers 62 are formed just along the first trench structure 11. A specific description of the side wall buffer layers 62 is obtained by replacing "second trench structure 12" by "first trench structure 11" in the above description of the semiconductor device 61. As described above, even with the semiconductor device 66, the same effects as the effects described for the semiconductor device 61 are exhibited.

With each of the fifth to seventh embodiments, an example where the side wall buffer layers 62 are formed by introducing the n-type impurity into the chip 2 interior by the ion implantation method via the inner walls of the first trench 13 and/or the inner walls of the second trench 16 was described. However, the side wall buffer layers 62 may be introduced into the interior of the chip 2 by an ion implantation method via the first main surface 3 before a step of forming the first trench 13 and/or the second trench 16.

After a step of forming the side wall buffer layers 62, the first trench 13 and/or the second trench 16 is formed in the first main surface 3 such as to penetrate through the side wall buffer layers 62. In this step, the compensation region 64 according to any of the fifth to seventh embodiments is not formed. In this case, the side wall buffer layers 62 may be connected to the high concentration layer 6*a* of the first layer 6 or may be formed at intervals to the third layer 8 side from the high concentration layer 6*a*. The side wall buffer layers 62 may be formed at the same time as the sinker regions 21.

Figure 17:
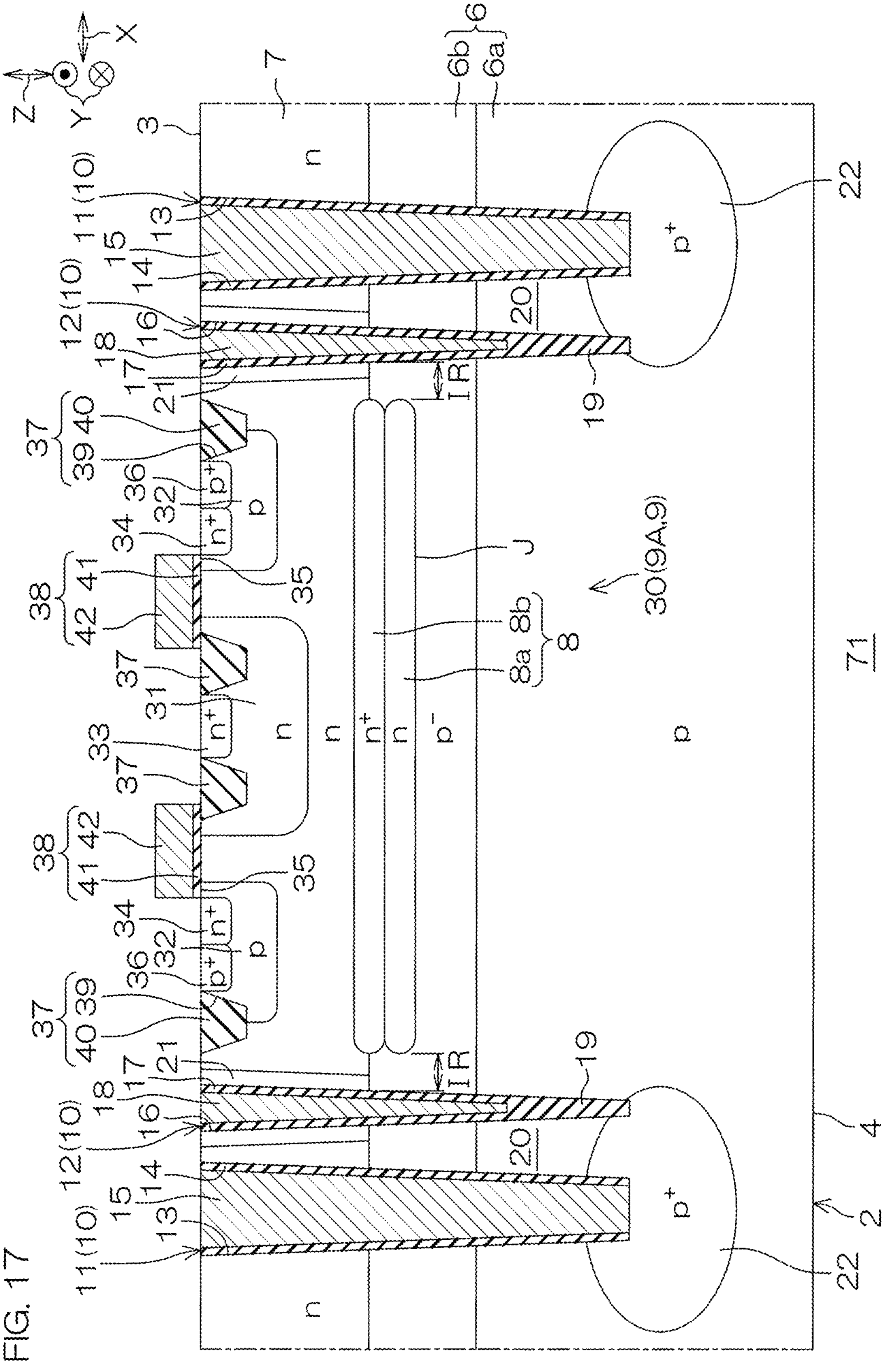
FIG. 17 corresponds to FIG. 3 and is a sectional view showing a semiconductor device according to an eighth embodiment.

FIG. 17 corresponds to FIG. 3 and is a sectional view showing a semiconductor device 71 according to an eighth embodiment. In the following, structures corresponding to structures described for the first to seventh embodiments are provided with the same reference signs and description thereof shall be omitted.

Referring to FIG. 17, the semiconductor device 71 includes, as in the first embodiment, the first layer 6, the second layer 7, the third layer 8, the transistor region 9A (device region 9), the trench separation structure 10 (trench structure), and the MISFET 30. In this embodiment, the second layer 7 is laminated directly on the first layer 6. In this embodiment, the third layer 8 is formed in the transistor region 9A such as to extend across a boundary portion between the first layer 6 and the second layer 7 at an interval from the trench separation structure 10 (in this embodiment, the second trench structure 12). The third layer 8 forms the pn-junction portion J with the first layer 6.

As in the first embodiment, the third layer 8 includes the low concentration embedded layer 8*a* and the high concentration embedded layer 8*b*. The low concentration embedded layer 8*a* is formed in a region on the first layer 6 side with respect to the boundary portion between the first layer 6 and the second layer 7. Specifically, the low concentration embedded layer 8*a* is formed inside the low concentration layer 6*b* at an interval from a boundary portion between the low concentration layer 6*b* of the first layer 6 and the second layer 7 in regard to the thickness direction of the chip 2. The low concentration embedded layer 8*a* is formed inside the low concentration layer 6*b* at an interval to the second layer 7 side from the high concentration layer 6*a* of the first layer 6 in regard to the thickness direction of the chip 2. The low concentration embedded layer 8*a* is formed at an interval from the second trench structure 12 in regard to a width direction of the device region 9. The low concentration embedded layer 8*a* forms the pn-junction portion J with the first layer 6 (high concentration layer 6*a*).

The high concentration embedded layer 8*b* is formed such as to extend across the boundary portion between the first layer 6 and the second layer 7. Specifically, the high concentration embedded layer 8*b* is interposed between the low concentration embedded layer 8*a* and the second layer 7 such as to extend across the boundary portion between the low concentration layer 6*b* of the first layer 6 and the second layer 7 and is electrically connected to the low concentration embedded layer 8*a* and the second layer 7. The high concentration embedded layer 8*b* is formed at an interval from the second trench structure 12 in regard to the width direction of the device region 9.

The third layer 8 (low concentration embedded layer 8*a* and high concentration embedded layer 8*b*) is formed at a predetermined region interval IR from the trench separation structure 10 (second trench structure 12). That is, the third layer 8 exposes the first layer 6 between itself and the trench separation structure 10. The region interval IR may exceed 0 μm but be not more than 10 μm. The region interval IR is preferably not more than 5 μm.

In this embodiment, the above-described sinker regions 21 are formed in a region between the third layer 8 and the trench separation structure 10 (second trench structure 12) in plan view. The sinker regions 21 are preferably formed at intervals to the trench separation structure 10 (second trench structure 12) side from the third layer 8 in plan view. That is, the sinker regions 21 are preferably not connected to the third layer 8. The lower end portions of the sinker regions 21 may be connected to the first layer 6 or may be formed inside the second layer 7 at intervals from the first layer 6.

Figure 18:
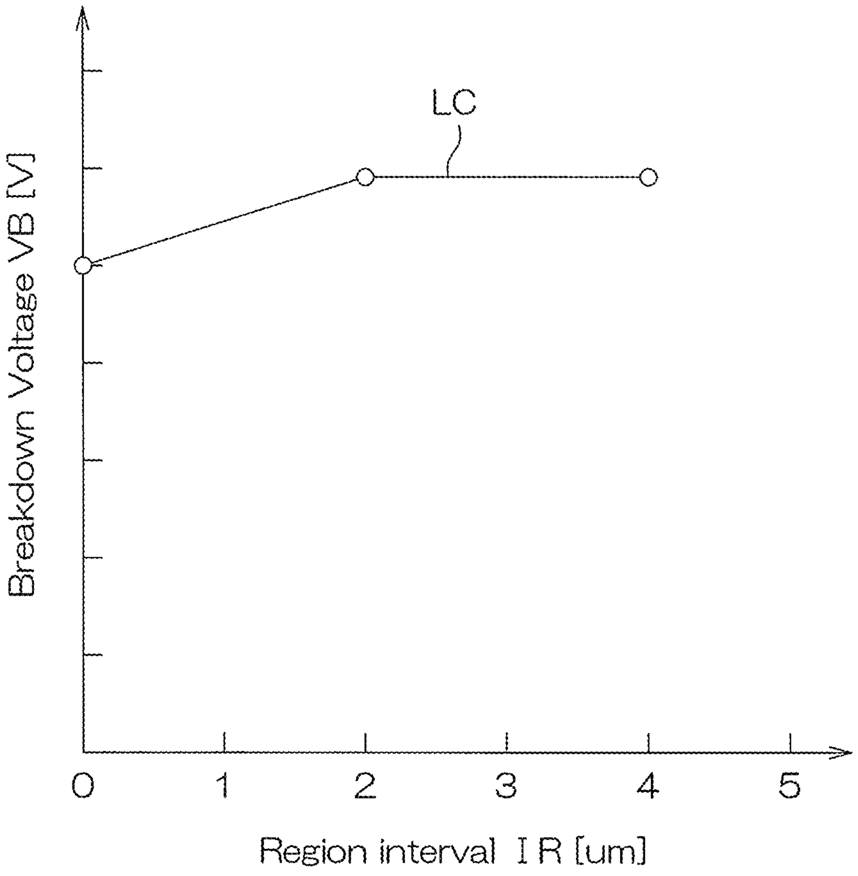
FIG. 18 is a graph showing a breakdown voltage of the semiconductor device shown in FIG. 17.

FIG. 18 is a graph showing a breakdown voltage VB of the semiconductor device 71 shown in FIG. 17. In FIG. 18, the ordinate shows the breakdown voltage VB [V] and the abscissa shows the region interval IR [μm]. Here, the region interval IR is adjusted in a range between 0 μm and 5 μm. Also, here, a potential of 0 V is applied to the first layer 6 and the first trench structure 11. The voltages here are voltages on the basis of the potential (=0 V) of the first layer 6.

A single polygonal line LC is shown in FIG. 18. The single polygonal line LC shows the breakdown voltage VB of the semiconductor device 71. Referring to the single polygonal line LC, the breakdown voltage VB increased with increase in the region interval IR. This is because the electric field concentration with respect to the second trench structure 12 is relaxed by forming the third layer 8 in a mode of being set back with respect to the second trench structure 12.

As described above, the semiconductor device 71 includes the first layer 6 of the p-type, the second layer 7 of the p-type or the n-type, the transistor region 9A (device region 9), the trench separation structure 10 (trench structure), and the third layer 8 (embedded layer) of the n-type. The second layer 7 is laminated on the first layer 6. The transistor region 9A is provided in the second layer 7. The trench separation structure 10 penetrates through the second layer 7 such as to reach the first layer 6 and demarcates the transistor region 9A in the second layer 7. The third layer 8 is formed in the transistor region 9A such as to extend across the boundary portion between the first layer 6 and the second layer 7 at an interval from the trench separation structure 10. With this structure, the semiconductor device 71 with which the withstand voltage (specifically, the breakdown voltage VB) can be improved can be provided.

The trench separation structure 10 specifically has the multi-trench structure including the plurality of trench structures that are respectively formed to penetrate through the second layer 7 such as to reach the first layer 6 and are aligned at intervals in directions away from the transistor region 9A such as to demarcate the transistor region 9A in the second layer 7.

In this embodiment, the plurality of trench structures include the first trench structure 11 and the second trench structure 12. The first trench structure 11 is electrically connected to the first layer 6 and electrically insulated from the second layer 7. The second trench structure 12 is electrically insulated from the first layer 6 and the second layer 7. In this embodiment, the third layer 8 is formed at an interval from the second trench structure 12. The withstand voltage (specifically, the breakdown voltage VB) of the semiconductor device 71 is increased by such a structure.

Figure 19:
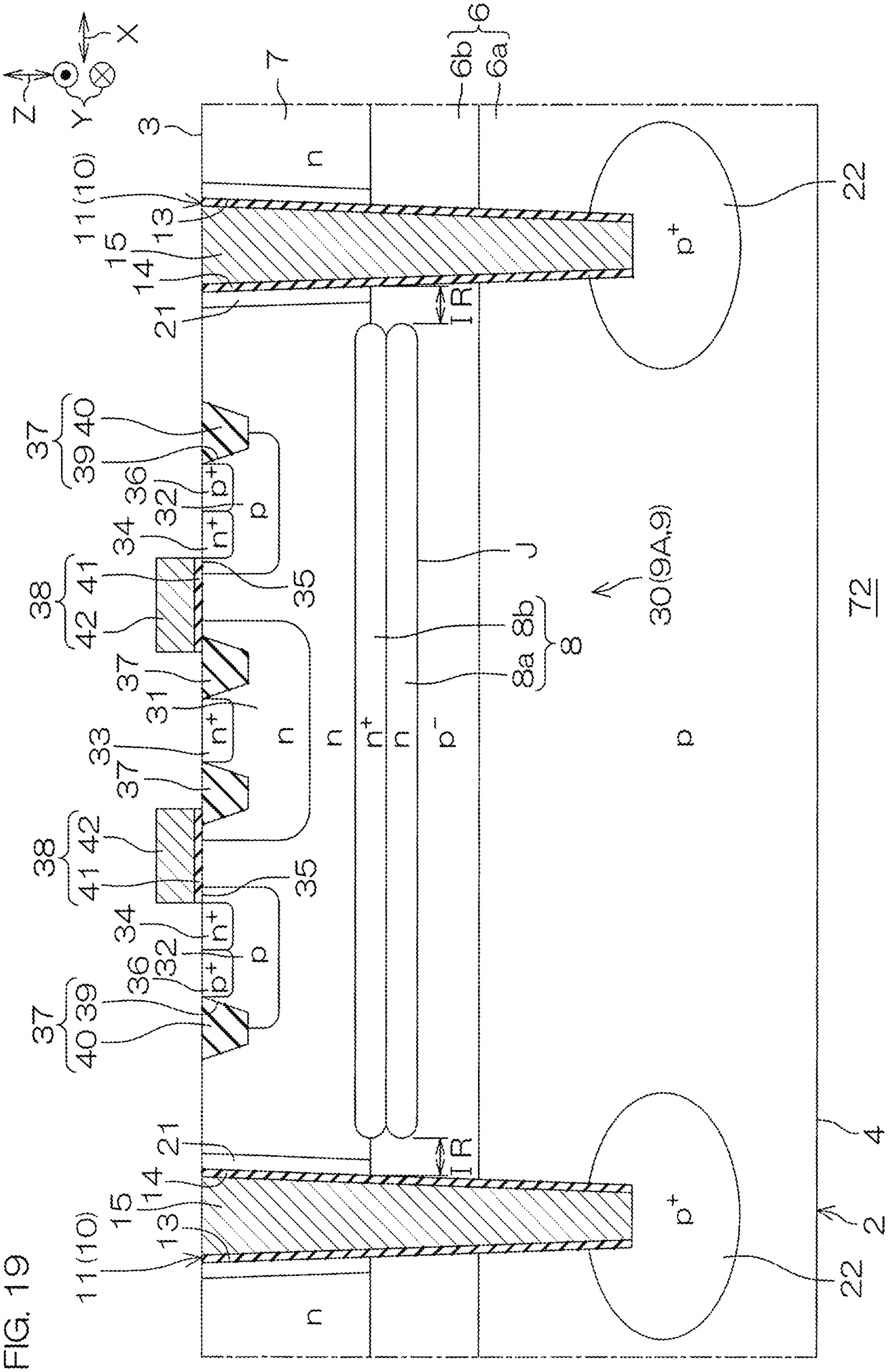
FIG. 19 corresponds to FIG. 17 and is a sectional view showing a semiconductor device according to a ninth embodiment.

FIG. 19 corresponds to FIG. 17 and is a sectional view showing a semiconductor device 72 according to a ninth embodiment. The semiconductor device 72 has a form with which the semiconductor device 71 is modified. In the following, structures corresponding to structures described for the first to eighth embodiments are provided with the same reference signs and description thereof shall be omitted.

With the semiconductor device 71, the trench separation structure 10 has the first trench structure 11 and the second trench structure 12 and the third layer 8 is formed at an interval from the second trench structure 12. On the other hand, referring to FIG. 19, with the semiconductor device 72, the trench separation structure 10 does not have the second trench structure 12 but includes just the first trench structure 11 and the third layer 8 is formed at an interval from the first trench structure 11. A specific description of the third layer 8 is obtained by replacing "second trench structure 12" by "first trench structure 11" in the above description of the semiconductor device 71. As described above, even with the semiconductor device 72, the same effects as the effects described for the semiconductor device 71 are exhibited.

Figure 20:
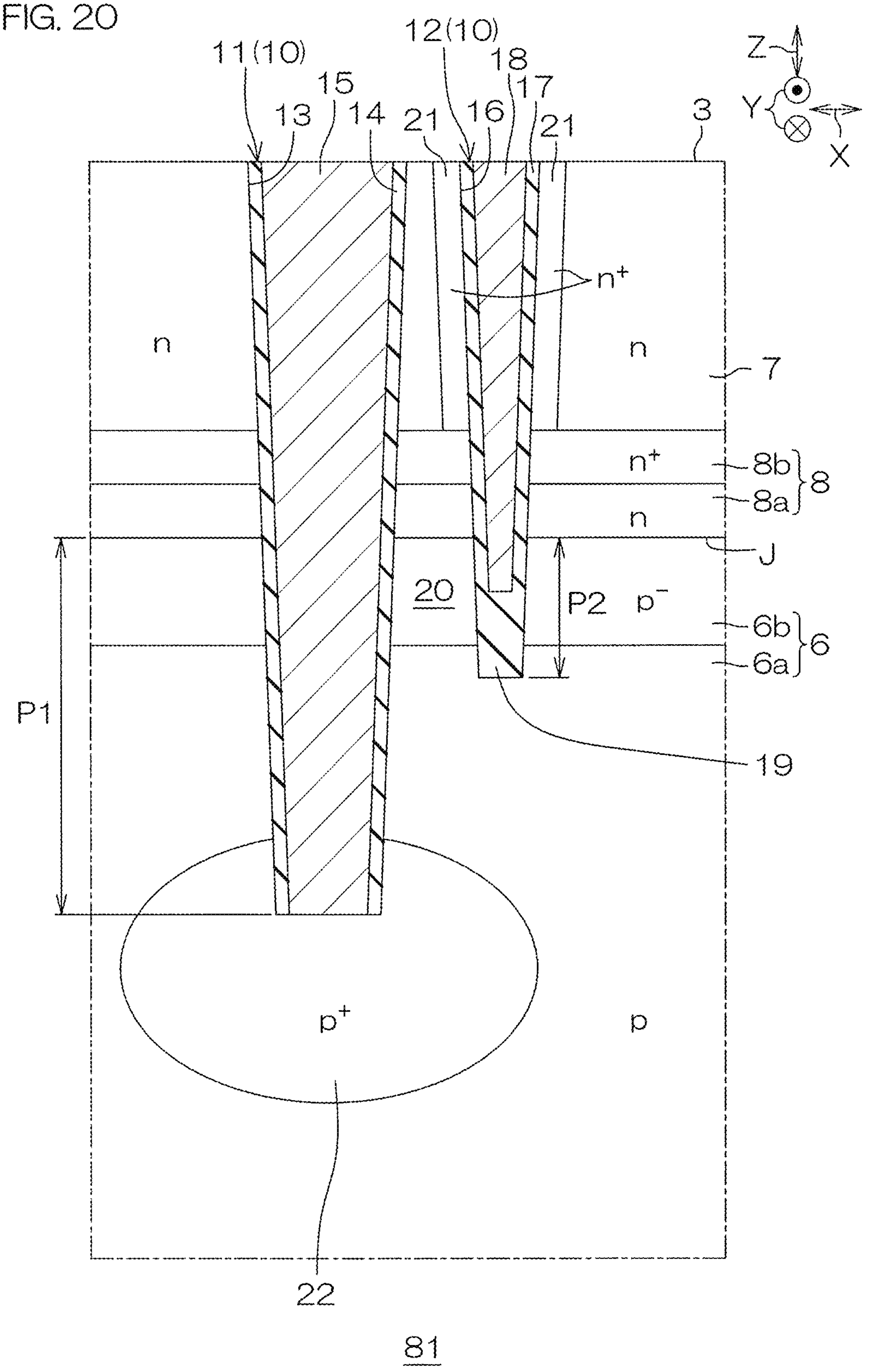
FIG. 20 corresponds to FIG. 4 and is a sectional view showing a semiconductor device according to a tenth embodiment together with the trench structure according to the first configuration example.

FIG. 20 corresponds to FIG. 4 and is a sectional view showing a semiconductor device 81 according to a tenth embodiment together with a trench structure according to a first configuration example. In the following, structures corresponding to structures described for the first to ninth embodiments are provided with the same reference signs and description thereof shall be omitted.

Referring to FIG. 20, with the semiconductor device 81, the second trench structure 12 is formed at a depth position shallower than the first trench structure 11 such as to penetrate through the pn-junction portion J. Specifically, the second trench structure 12 penetrates through the second layer 7 and the third layer 8 such as to reach the first layer 6 at the depth position shallower than the first trench structure 11. The first trench structure 11 projects by the first value P1 from the pn-junction portion J toward the second main surface 4 side. On the other hand, the second trench structure 12 projects by the second value P2 less than the first value P1 (P2<P1) from the pn-junction portion J toward the second main surface 4 side. Descriptions of the second trench structure 12 according to the first embodiment apply to other descriptions of the second trench structure 12 according to this embodiment.

The impurity region 22 described above is formed at an interval to the bottom wall side of the first trench structure 11 from the bottom wall of the second trench structure 12 in this embodiment. The impurity region 22 therefore does not cover the bottom wall of the second trench structure 12. In regard to the thickness direction of the first layer 6, the impurity region 22 may face the bottom wall of the second trench structure 12 with a portion of the first layer 6 (high concentration layer 6*a*) therebetween.

Figure 21A:
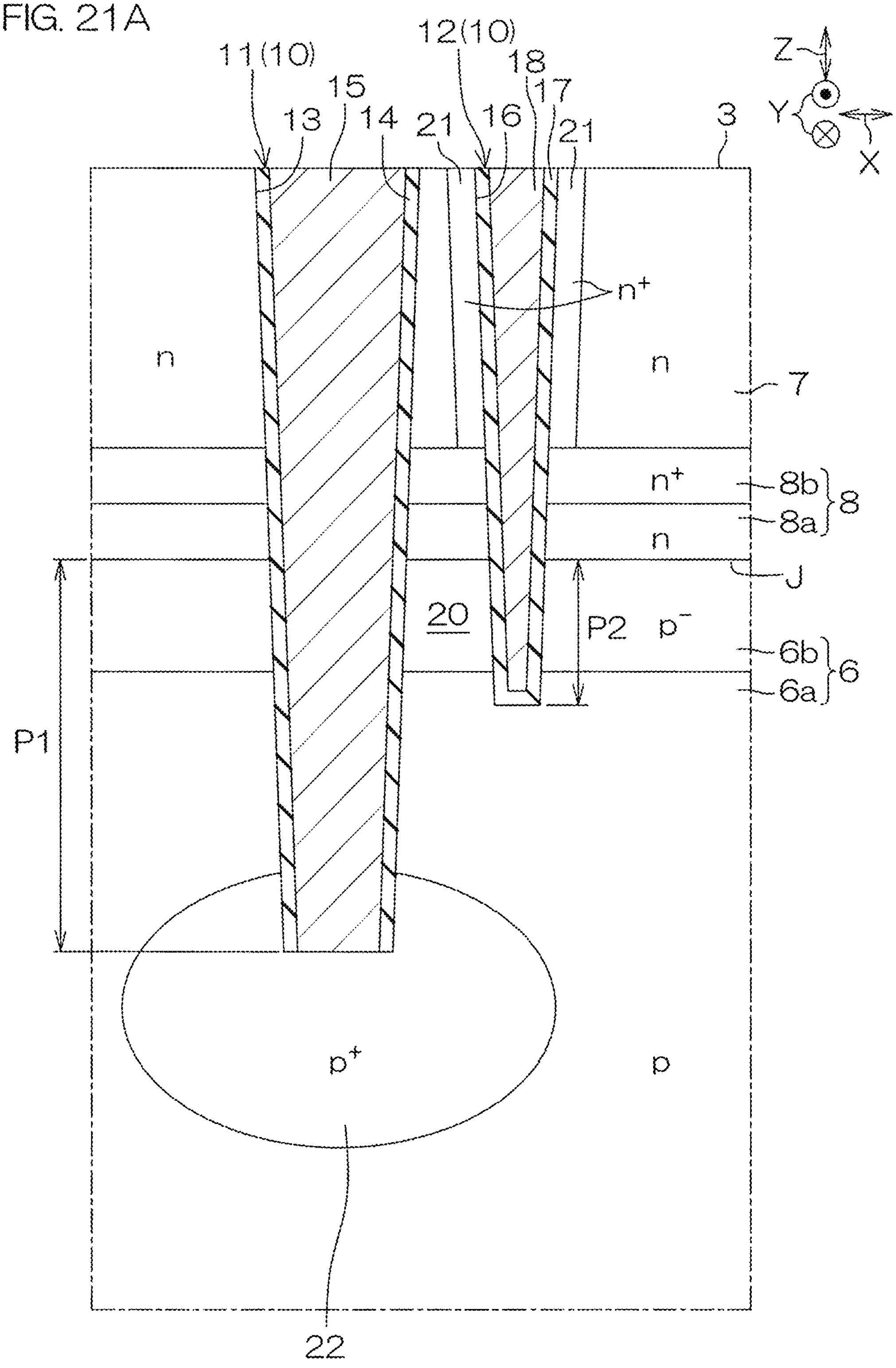
FIG. 21A is a sectional view showing the sectional structure shown in FIG. 20 together with the trench structure according to the second configuration example.

The second trench structure 12 can take on a form other than the form shown in FIG. 20. Other configuration examples of the second trench structure 12 shall be illustrated below with reference to FIG. 21A and FIG. 21B. FIG. 21A is a sectional view showing the sectional structure shown in FIG. 20 together with the second trench structure 12 according to the second configuration example. In the following, structures corresponding to structures described with reference to FIG. 20 are provided with the same reference signs and description thereof shall be omitted.

Referring to FIG. 21A, the second trench structure 12 not having the bottom side insulator 19 may be adopted. That is, the second trench structure 12 may include the second insulating film 17 that covers the inner walls (inner peripheral wall, outer peripheral wall, and bottom wall) of the second trench 16 with a substantially uniform thickness. In this case, the second insulating film 17 preferably has a thickness that is less than one-half of the second trench width W2 of the second trench structure 12. The thickness of the second insulating film 17 is the thickness along the normal direction to the wall surface of the second trench structure 12 (second trench 16).

The thickness of the second insulating film 17 is especially preferably less than one-half of the width of the bottom wall of the second trench structure 12. The width of the bottom wall of the second trench structure 12 is the width in the direction orthogonal to the direction in which the second trench structure 12 extends in plan view. Under this condition, the second trench width W2 may be not less than the first trench width W1 of the first trench structure 11 (W1≤W2) or may be less than the first trench width W1 (W1>W2).

Figure 21B:
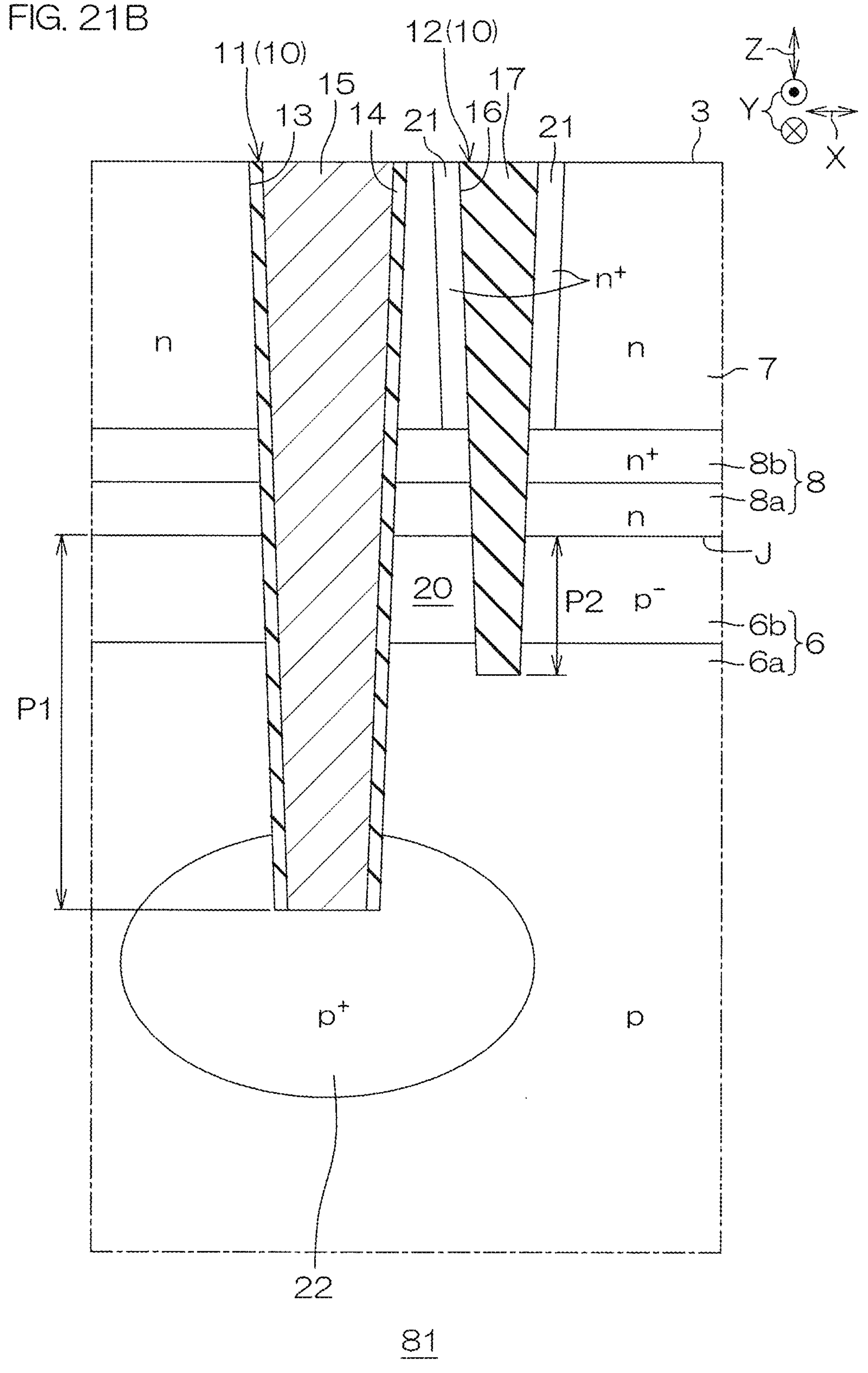
FIG. 21B is a sectional view showing the sectional structure shown in FIG. 20 together with the trench structure according to the third configuration example.

FIG. 21B is a sectional view showing the sectional structure shown in FIG. 20 together with the second trench structure 12 according to the third configuration example. In the following, structures corresponding to structures described with reference to FIG. are provided with the same reference signs and description thereof shall be omitted.

Referring to FIG. 21B, the second trench structure 12 not having the second electrode 18 may be adopted. That is, the second trench structure 12 may include the second insulating film 17 that is embedded in the second trench 16 as an integrated member. In this case, the second trench structure 12 may be referred to as the "trench insulating structure." Under this condition, the second trench width W2 may be not less than the first trench width W1 of the first trench structure 11 (W1≤W2) or may be less than the first trench width W1 (W1>W2).

Figure 22:
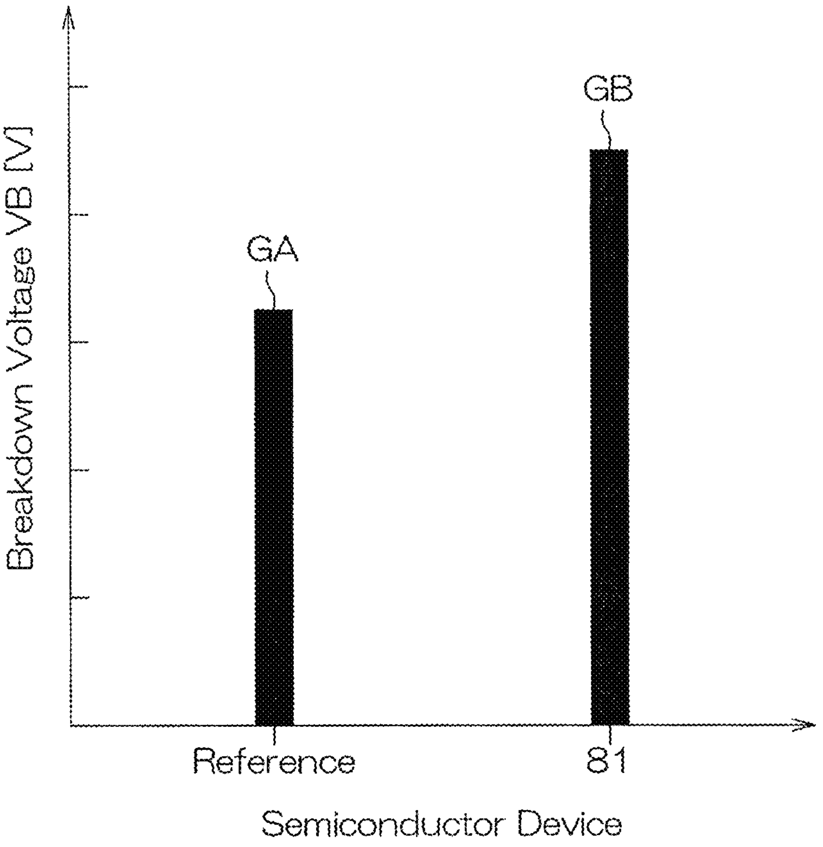
FIG. 22 is a graph showing a breakdown voltage of the semiconductor device shown in FIG. 20 together with a breakdown voltage of a semiconductor device according to a reference example.

FIG. 22 is a graph showing a breakdown voltage VB of the semiconductor device 81 shown in FIG. 20 together with a breakdown voltage VB of a semiconductor device according to a reference example. In FIG. 22, the ordinate shows the breakdown voltage VB [V] and the abscissa shows the item (the semiconductor device that is the measured object). Here, a potential of 0 V is applied to the first layer 6 and the first trench structure 11. The voltages here are voltages on the basis of the potential (=0 V) of the first layer 6.

A first graph bar GA, and a second graph bar GB are shown in FIG. 22. The first graph bar GA shows the breakdown voltage VB of the semiconductor device according to the reference example. The second graph bar GB shows the breakdown voltage VB of the semiconductor device 81. The semiconductor device according to the reference example has the same structure as the semiconductor device 81 with the exception of not including the second trench structure 12. Other descriptions of the semiconductor device according to the reference example shall be omitted.

Referring to the first and second graph bars GA and GB, the breakdown voltage VB increased due to forming the second trench structure 12 that is shallower than the first trench structure 11. This showed that even when the second trench structure 12 that is shallower than the first trench structure 11 is formed, the breakdown voltage VB is improved.

In comparison to the second trench structure 12 of the semiconductor device 1 (see FIG. 3 and FIG. 4), a facing area of the first layer 6 and the second electrode 18 (that is, a parasitic capacitance of the second trench structure 12) is decreased with the second trench structure 12 of the semiconductor device 81. Therefore, even when the second trench structure 12 that is shallower than the first trench structure 11 is formed, the breakdown voltage VB increases. Even when the forms shown in FIG. 21A and FIG. 21B are applied, the parasitic capacitance of the second trench structure 12 is reduced. The breakdown voltage VB thus increases even in the cases of FIG. 21A and FIG. 21B.

As described above, the semiconductor device 81 has the second trench structure 12 that is shallower than the first trench structure 11. With this structure, the semiconductor device 81 with which the withstand voltage (specifically, the breakdown voltage VB) can be improved can be provided.

Figure 23:
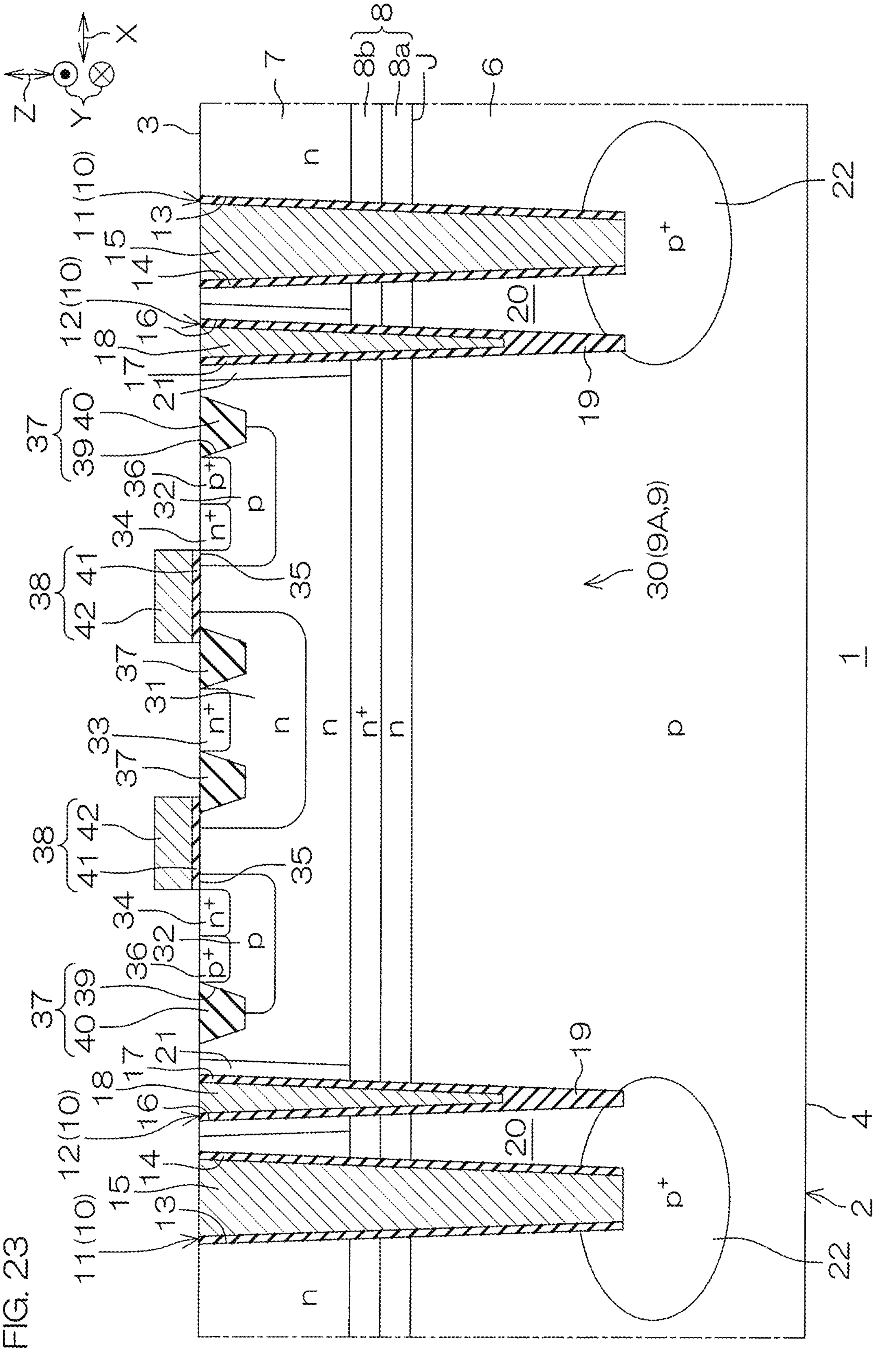
FIG. 23 is a sectional view showing a first modification example of a chip according to any of the first to tenth embodiments.

Modification examples applied to the first to tenth embodiments are illustrated below with reference to FIG. 23 to FIG. 27. FIG. 23 is a sectional view showing a first modification example of the chip 2 according to any of the first to tenth embodiments. Although an example in which the chip 2 according to the first modification example is applied to the semiconductor device 1 according to the first embodiment shall be described here, the chip 2 according to the first modification example is also applicable to the second to tenth embodiments. In the following, structures corresponding to structures described for the first to tenth embodiments are provided with the same reference signs and description thereof shall be omitted.

In the first embodiment, the first layer 6 has the laminated structure that includes the high concentration layer 6*a* and the low concentration layer 6*b*. However, as shown in FIG. 23, the chip 2 may have the first layer 6 that has a single layer structure instead. The first layer 6 may be constituted of a semiconductor substrate of the p-type. In this case, the first layer 6 may have the impurity concentration of the high concentration layer 6*a* or may have the impurity concentration of the low concentration layer 6*b*. Even in this case, the pn-junction portion J is formed at the boundary portion between the first layer 6 and the third layer 8 (low concentration embedded layer 8*a*).

Figure 24:
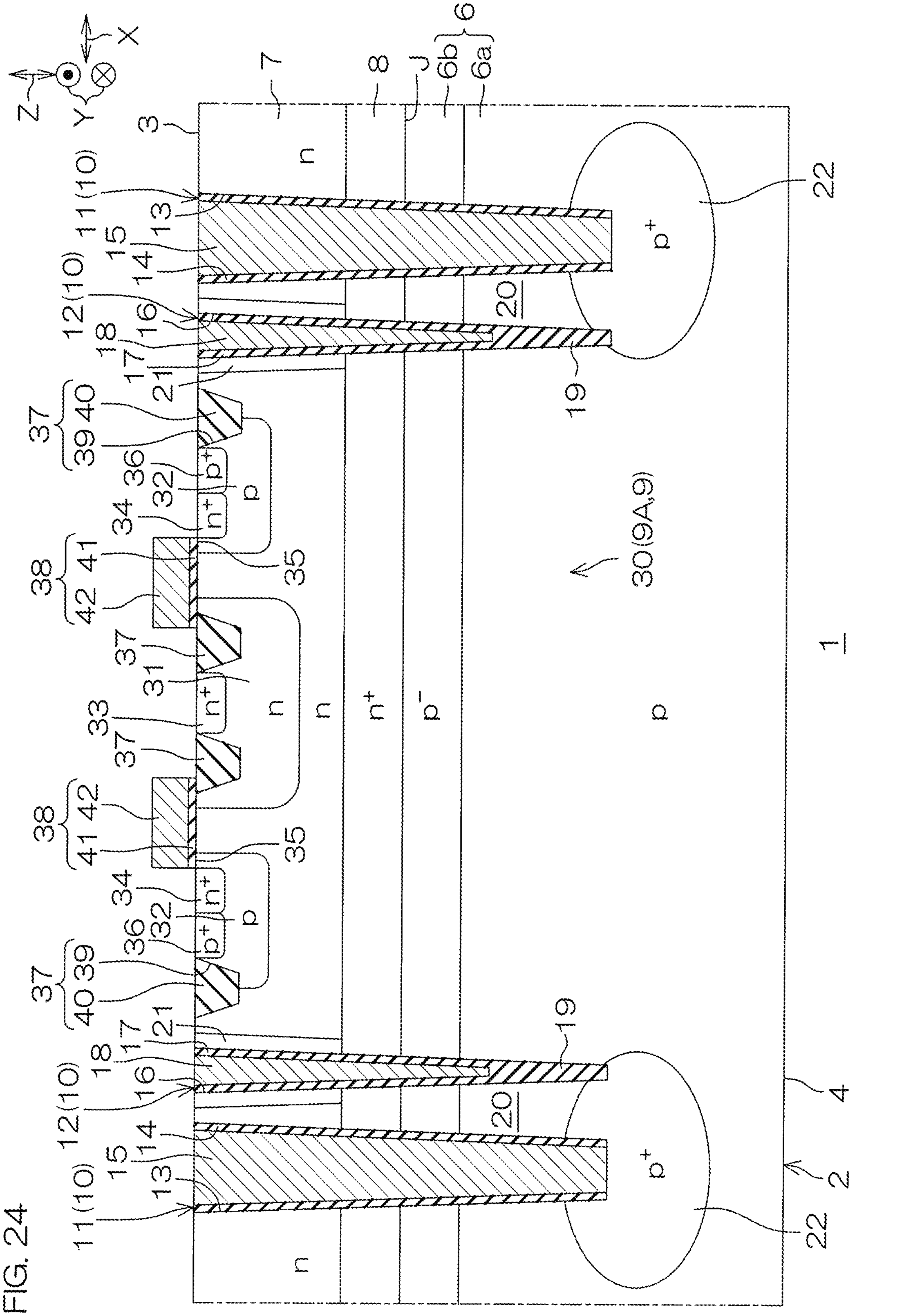
FIG. 24 is a sectional view showing a second modification example of the chip according to any of the first to tenth embodiments.

FIG. 24 is a sectional view showing a second modification example of the chip 2 according to any of the first to tenth embodiments. Although an example in which the chip 2 according to the second modification example is applied to the semiconductor device 1 according to the first embodiment shall be described here, the chip 2 according to the second modification example is also applicable to the second to tenth embodiments. In the following, structures corresponding to structures described for the first to tenth embodiments are provided with the same reference signs and description thereof shall be omitted.

In the first embodiment, the third layer 8 has the laminated structure that includes the low concentration embedded layer 8*a* and the high concentration embedded layer 8*b*. However, as shown in FIG. 24, the chip 2 may include the third layer 8 that has a single layer structure instead. In this case, the third layer 8 may have the impurity concentration of the low concentration embedded layer 8*a* or may have the impurity concentration of the high concentration embedded layer 8*b*. Even in this case, the pn-junction portion J is formed at the boundary portion between the first layer 6 (low concentration layer 6*b*) and the third layer 8. If the second layer 7 of the n-type is applied, the second layer 7 may have an impurity concentration that is lower than the third layer 8.

Figure 25:
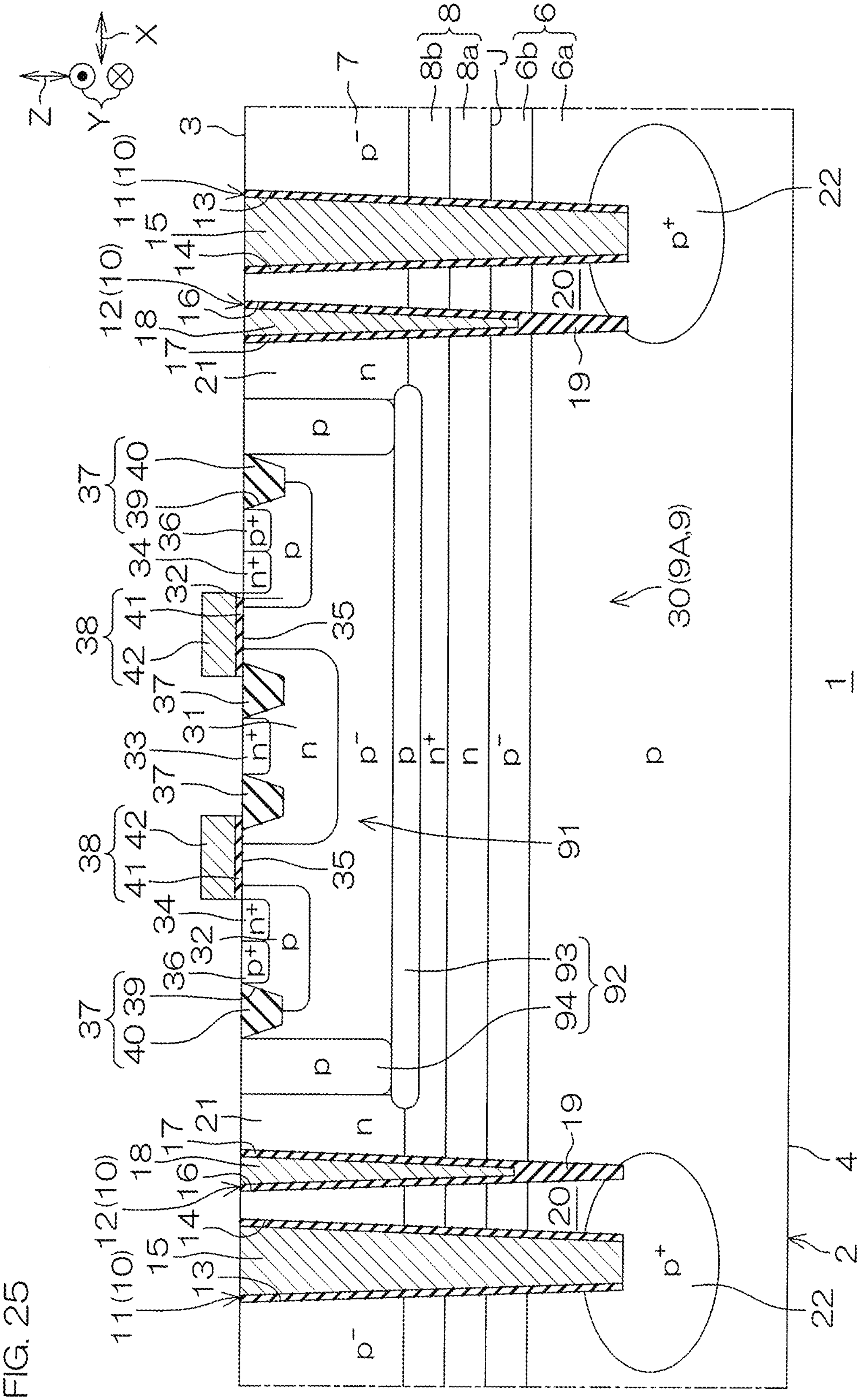
FIG. 25 is a sectional view showing a third modification example of the chip according to any of the first to tenth embodiments.

FIG. 25 is a sectional view showing a third modification example of the chip 2 according to any of the first to tenth embodiments. Although an example in which the chip 2 according to the third modification example is applied to the semiconductor device 1 according to the first embodiment shall be described here, the chip 2 according to the third modification example is also applicable to the second to tenth embodiments. In the following, structures corresponding to structures described for the first to tenth embodiments are provided with the same reference signs and description thereof shall be omitted.

In the first embodiment, the second layer 7 of the n-type (epitaxial layer of the n-type) is formed. However, as shown in FIG. 25, the chip 2 may include the second layer 7 of the p-type (epitaxial layer of the p-type) instead. When the second layer 7 of the p-type is applied, the structure inside the transistor region 9A is adjusted accordingly. A structural example inside the transistor region 9A shall be described below.

In this embodiment, the semiconductor device 1 has a separation region 92 of the p-type as an example of a region separation structure that demarcates a cell region 91 in the transistor region 9A. The separation region 92 is formed at an interval inward from the inner peripheral wall of the second trench structure 12 in plan view. The separation region 92 is formed in a cylindrical shape that surrounds an inner portion of the second layer 7 from a bottom portion side toward a surface layer portion side of the second layer 7. In this embodiment, the separation region 92 includes an embedded region 93 of the p-type and a column region 94 of the p-type.

The embedded region 93 is formed at a boundary portion between the third layer 8 (specifically, the high concentration embedded layer 8*b*) and the second layer 7. The embedded region 93 is formed at an interval inward from the inner peripheral wall of the second trench structure 12 and exposes a portion of the third layer 8 between itself and the second trench structure 12. The column region 94 is formed in a region of the second layer 7 between the first main surface 3 and a peripheral edge portion of the embedded region 93 and is electrically connected to the embedded region 93. The number of laminated layers of the column region 94 is arbitrary and two or more column regions 94 may be laminated from the embedded region 93 side to the first main surface 3 side.

The sinker region 21 described above is formed in a region of the transistor region 9A between the second trench structure 12 and the separation region 92. The sinker region 21 is formed inside the second layer 7 and extends along a side wall of the second trench structure 12. In this embodiment, the sinker region 21 is formed as a film extending along just the inner peripheral wall of the second trench structure 12. In plan view, the sinker region 21 is formed in an annular shape extending along the inner peripheral wall of the second trench structure 12 and surrounding the separation region 92. The lower end portion of the sinker region 21 is electrically connected to the third layer 8 (high concentration embedded layer 8*b*).

The MISFET 30 described above is formed in the same mode as in the first embodiment inside the cell region 91 demarcated by the separation region 92. In this embodiment, the channel regions 35 are formed in regions between the first well region 31 and the source regions 34 in surface layer portions of the second layer 7. Other descriptions of the MISFET 30 shall be omitted since descriptions of the MISFET 30 according to the first embodiment apply thereto.

Figure 26:
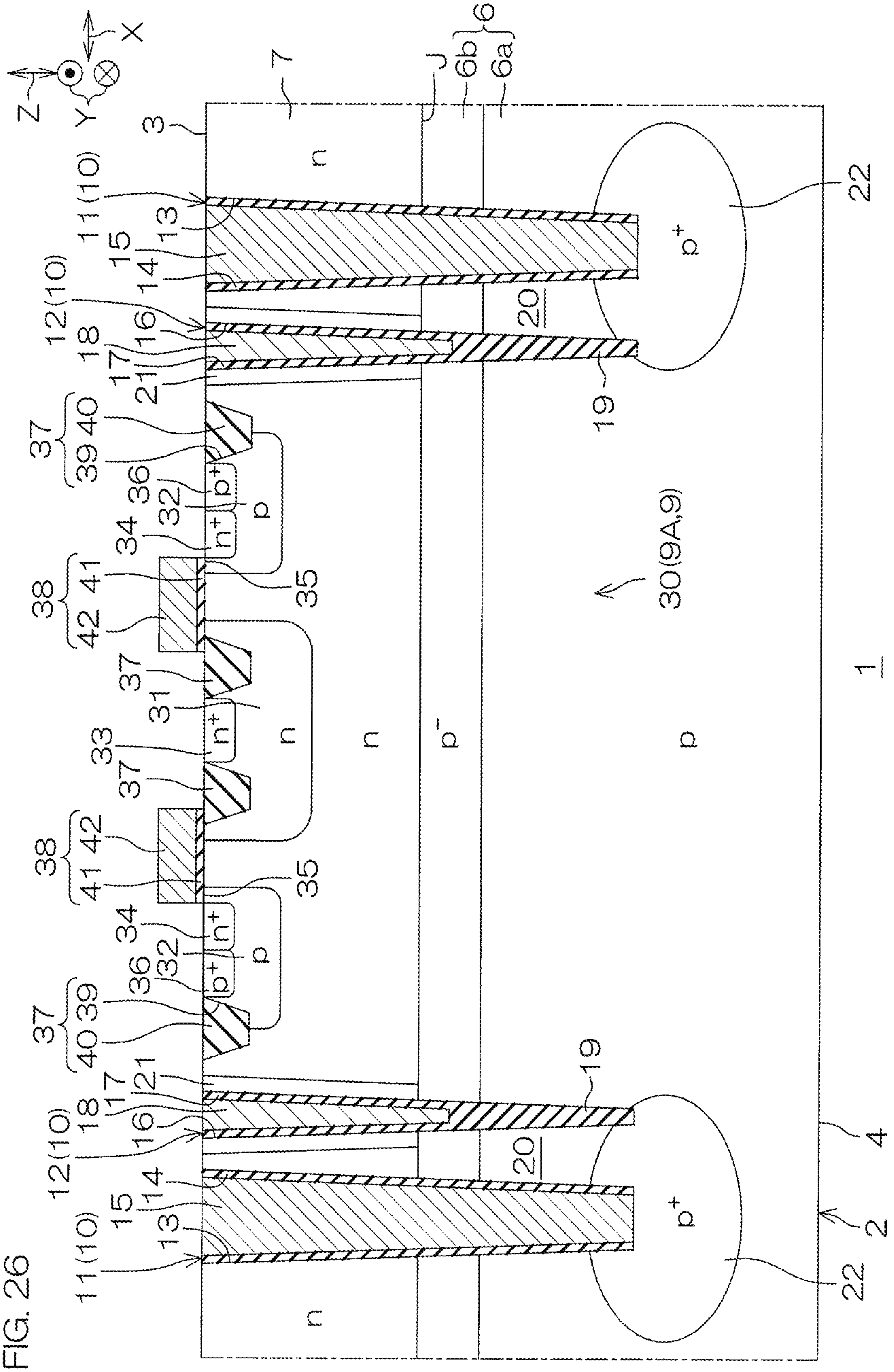
FIG. 26 is a sectional view showing a fourth modification example of the chip according to any of the first to tenth embodiments.

FIG. 26 is a sectional view showing a fourth modification example of the chip 2 according to any of the first to tenth embodiments. Although an example in which the chip 2 according to the fourth modification example is applied to the semiconductor device 1 according to the first embodiment shall be described here, the chip 2 according to the fourth modification example is also applicable to the second to tenth embodiments. In the following, structures corresponding to structures described for the first to tenth embodiments are provided with the same reference signs and description thereof shall be omitted.

With the first embodiment, an example where the chip 2 includes the first layer 6, the second layer 7, and the third layer 8 was described. However, as shown in FIG. 26, the chip 2 that includes the first layer 6 of the p-type and the second layer 7 of the n-type but does not include the third layer 8 may be adopted instead. In this embodiment, the second layer 7 forms the pn-junction portion J with the first layer 6. As a matter of course, the chip 2 may include the first layer 6 that has a single layer structure. In this case, the first layer 6 may have the impurity concentration of the high concentration layer 6*a* or may have the impurity concentration of the low concentration layer 6*b*.

Features of the chips 2 according to the first to fourth modification examples can be combined with each other in any mode. Therefore, the chip 2 including at least two features among the features of the chips 2 according to the first to fourth modification examples at the same time may be combined in any one of the first to tenth embodiments.

Figure 27:
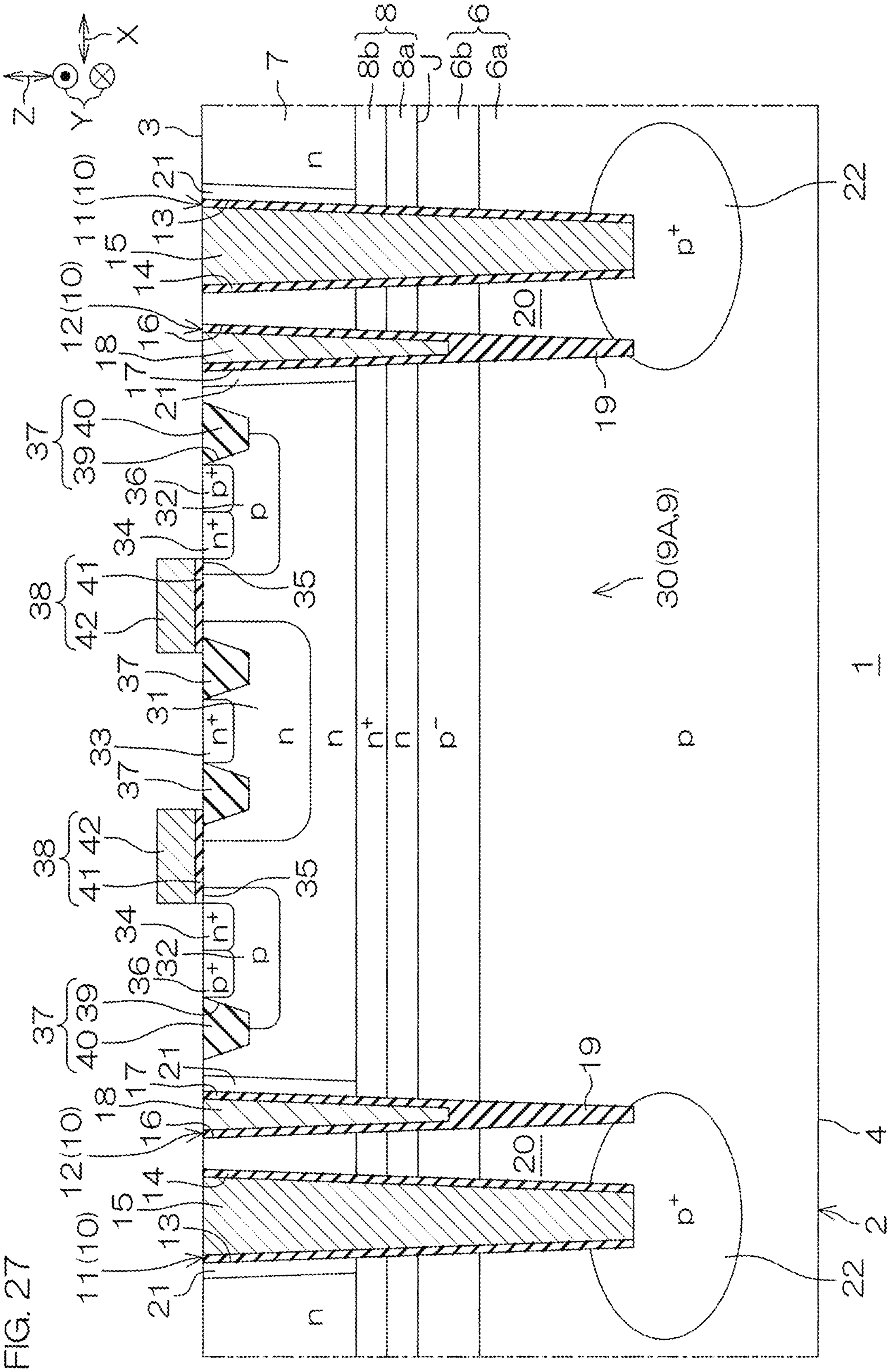
FIG. 27 is a sectional view showing a modification example of sinker regions according to any of the first to tenth embodiments.

FIG. 27 is a sectional view showing a modification example of the sinker regions 21 according to any of the first to tenth embodiments. Although an example in which the sinker regions 21 according to the modification example are applied to the semiconductor device 1 according to the first embodiment shall be described here, the sinker regions 21 according to the modification example are also applicable to the second to tenth embodiments. In the following, structures corresponding to structures described for the first to tenth embodiments are provided with the same reference signs and description thereof shall be omitted.

With the first embodiment, a configuration example in which the sinker regions 21 cover just the second trench structure 12 was described. However, as shown in FIG. 27, the sinker regions 21 may cover the first trench structure 11 in addition to the second trench structure 12. The sinker regions 21 are formed along one of either or both (both in this embodiment) of the inner peripheral wall and the outer peripheral wall of the first trench structure 11. The sinker region 21 covering the inner peripheral wall of the first trench structure 11 may be integrated with the sinker region 21 covering the outer peripheral wall of the second trench structure 12 in the inter-trench region 20.

The embodiments of the present invention can be implemented in yet other embodiments. With each of the embodiments described above, a configuration example in which the trench separation structure 10 demarcates the transistor region 9A was described. However, the device region 9 that is demarcated by the trench separation structure 10 is not restricted to the transistor region 9A. That is, the trench separation structure 10 may demarcate the device region 9 that is not restricted to the transistor region 9A and in which at least one among a semiconductor switching device, a semiconductor rectifying device, and a passive device is formed.

In each of the embodiments described above, the trench separation structure 10 may include any number of the first trench structures 11 and any number of the second trench structures 12. That is, the trench separation structure 10 may include a plurality of the first trench structures 11 and a plurality of the second trench structures 12. The trench separation structure 10 may include a single first trench structure 11 and a plurality of the second trench structures 12. The trench separation structure 10 may include a plurality of the first trench structures 11 and a single second trench structure 12.

When the trench separation structure 10 includes a plurality of the first trench structures 11, the plurality of the first trench structures 11 may be formed at an interval (for example, the trench interval IT) from each other such as to surround the device region 9. When the trench separation structure 10 includes a plurality of the second trench structures 12, the plurality of the second trench structures 12 may be formed at an interval (for example, the trench interval IT) from each other such as to surround the device region 9 in a region between the device region 9 and the first trench structure 11.

Although with each of the embodiments described above, an example where the first conductivity type is the p-type and the second conductivity type is the n-type was described, the first conductivity type may be the n-type and the second conductivity type may be the p-type instead. Specific configurations in this case are obtained by replacing the n-type regions with p-type regions and replacing the p-type regions with n-type regions in the description above and the attached drawings. Although with each of the embodiments described above, an example where the p-type is expressed as the "first conductivity type" and the n-type is expressed as the "second conductivity type" was described, these expressions are used for clarifying the order of description and the p-type may be expressed as the "second conductivity type" and the n-type may be expressed as the "first conductivity type" instead.

Features of the first to tenth embodiments described above may be combined with each other in arbitrary modes. Therefore, a semiconductor device that includes at least two features among the features of the first to tenth embodiments at the same time may be adopted.

That is, the features of the second embodiment may be combined with the features of the first embodiment. Also, the features of the third embodiment may be combined with any one of the features of the first and second embodiments. Also, the features of the fourth embodiment may be combined with any one of the features of the first to third embodiments. Also, the features of the fifth embodiment may be combined with any one of the features of the first to fourth embodiments. Also, the features of the sixth embodiment may be combined with any one of the features of the first to fifth embodiments.

Also, the features of the seventh embodiment may be combined with any one of the features of the first to sixth embodiments. Also, the features of the eighth embodiment may be combined with any one of the features of the first to seventh embodiments. Also, the features of the ninth embodiment may be combined with any one of the features of the first to eighth embodiments. Also, the features of the tenth embodiment may be combined with any one of the features of the first to ninth embodiments.

Examples of features extracted from this Description and the drawings are indicated below. The following [A1] to [A20], [B1] to [B20], [C1] to [C22], and [D1] to [D20] each provide a semiconductor device with which the withstand voltage can be improved. Although alphanumeric characters within parentheses in the following express corresponding constituent elements, etc., in the embodiments described above, these are not meant to limit the scopes of the respective Clauses to the embodiments.

[A1] A semiconductor device (1, 51, 53, 55, 61, 65, 66, 71, 72, 81 (hereinafter indicated simply as "1, etc.")) comprising: a chip (2) that has a first main surface (3) on one side and a second main surface (4) on another side; a pn-junction portion (J) that is formed in an interior of the chip (2) such as to extend along the first main surface (3); a device region (9, 9A) that is provided in the first main surface (3); a first trench structure (11) that is formed in the first main surface (3) such as to penetrate through the pn-junction portion (J) and demarcates the device region (9, 9A) in the first main surface (3); and a second trench structure (12) that is formed in the first main surface (3) such as to penetrate through the pn-junction portion (J) and demarcates the device region (9, 9A) in a region further to the device region (9, 9A) side than the first trench structure (11).

[A2] The semiconductor device (1, etc.) according to A1, wherein the first trench structure (11) is constituted of a first trench electrode structure (11) that is electrically connected to the chip (2), and the second trench structure (12) is constituted of a second trench electrode structure (12) that is electrically insulated from the chip (2).

[A3] The semiconductor device (1, etc.) according to A1 or A2, wherein the first trench structure (11) has a lower end portion that is electrically connected to the chip (2).

[A4] The semiconductor device (1, etc.) according to any one of A1 to A3, wherein the second trench structure (12) is electrically separated from the first trench structure (11).

[A5] The semiconductor device (1, etc.) according to any one of A1 to A4, wherein the second trench structure (12) is formed in an electrically floating state.

[A6] The semiconductor device (1, etc.) according to any one of A1 to A5, wherein a potential different from that of the first trench structure (11) is to be occurred in the second trench structure (12).

[A7] The semiconductor device (1, etc.) according to any one of A1 to A6, wherein the first trench structure (11) has a first width (W1), and the second trench structure (12) has a second width (W2) that is not more than the first width (W1).

[A8] The semiconductor device (1, etc.) according to A7, wherein the second trench structure (12) is formed at an interval (IT) of not more than the first width (W1) from the first trench structure (11).

[A9] The semiconductor device (1, etc.) according to any one of A1 to A8, wherein the first trench structure (11) includes a first trench (13) that penetrates through the pn-junction portion (J), a first insulating film (14) that covers an inner wall of the first trench (13) such as to expose the chip (2) from a bottom wall of the first trench (13), and a first electrode (15) that is embedded in the first trench (13) with the first insulating film (14) therebetween and is electrically connected to the chip (2) at the bottom wall of the first trench (13), and the second trench structure (12) includes a second trench (16) that penetrates through the pn-junction portion (J), a second insulating film (17) that covers an inner wall of the second trench (16), and a second electrode (18) that is embedded in the second trench (16) with the second insulating film (17) therebetween and is electrically insulated from the chip (2).

[A10] The semiconductor device (1, etc.) according to A9, wherein the second trench structure (12) includes a bottom side insulator (19) that is embedded in a bottom wall side of the second trench (16) such as to be continuous to the second insulating film (17) and has a thickness exceeding a thickness of the second insulating film (17), and the second electrode (18) is embedded in the second trench (16) with the second insulating film (17) and the bottom side insulator (19) therebetween.

[A11] The semiconductor device (1, etc.) according to any one of A1 to A10, further comprising: a first layer (6) of a first conductivity type that is formed in a region inside the chip (2) on the second main surface (4) side; a second layer (7) of the first conductivity type or a second conductivity type that is formed in a region inside the chip (2) on the first main surface (3) side; and a third layer (8) of the second conductivity type that is interposed in a region inside the chip (2) between the first layer (6) and the second layer (7) and forms the pn-junction portion (J) with the first layer (6); wherein the first trench structure (11) penetrates through the second layer (7) and the third layer (8) such as to reach the first layer (6) and demarcates the device region (9, 9A) in the second layer (7), and the second trench structure (12) penetrates through the second layer (7) and the third layer (8) such as to reach the first layer (6) and demarcates the device region (9, 9A) in a region of the second layer (7) further to the device region (9, 9A) side than the first trench structure (11).

[A12] The semiconductor device (1, etc.) according to A11, wherein the first trench structure (11) is electrically connected to the first layer (6) and electrically insulated from the second layer (7) and the third layer (8), and the second trench structure (12) is electrically insulated from the first layer (6), the second layer (7) and the third layer (8).

[A13] The semiconductor device (1, etc.) according to any one of A1 to A10, further comprising: a first layer (6) of a first conductivity type that is formed in a region inside the chip (2) on the second main surface (4) side; and a second layer (7) of a second conductivity type that is formed in a region inside the chip (2) on the first main surface (3) side and forms the pn-junction portion (J) with the first layer (6); wherein the first trench structure (11) penetrates through the second layer (7) such as to reach the first layer (6) and demarcates the device region (9, 9A) in the second layer (7), and the second trench structure (12) penetrates through the second layer (7) such as to reach the first layer (6) and demarcates the device region (9, 9A) in a region of the second layer (7) further to the device region (9, 9A) side than the first trench structure (11).

[A14] The semiconductor device (1, etc.) according to A13, wherein the first trench structure (11) is electrically connected to the first layer (6) and electrically insulated from the second layer (7), and the second trench structure (12) is electrically insulated from the first layer (6) and the second layer (7).

[A15] The semiconductor device (1, etc.) according to any one of A1 to A14, further comprising: an inter-trench region (20) that is demarcated in a region between the first trench structure (11) and the second trench structure (12) and is formed in an electrically floating state.

[A16] The semiconductor device (1, etc.) according to any one of A1 to A15, further comprising: a transistor (30) that is formed in the device region (9, 9A).

[A17] A semiconductor device (1, etc.) comprising: a first layer (6) of a first conductivity type; a second layer (7) of the first conductivity type or a second conductivity type that is laminated on the first layer (6); a third layer (8) of the second conductivity type that is interposed between the first layer (6) and the second layer (7); a device region (9, 9A) that is provided in the second layer (7); a first trench structure (11) that penetrates through the second layer (7) and the third layer (8) such as to reach the first layer (6) and demarcates the device region (9, 9A) in the second layer (7); and a second trench structure (12) that penetrates through the second layer (7) and the third layer (8) such as to reach the first layer (6) and demarcates the device region (9, 9A) in a region of the second layer (7) further to the device region (9, 9A) side than the first trench structure (11).

[A18] The semiconductor device (1, etc.) according to A17, wherein the first trench structure (11) is constituted of a first trench electrode structure (11) that is electrically connected to the first layer (6) and electrically insulated from the second layer (7) and the third layer (8), and the second trench structure (12) is constituted of a second trench electrode structure (12) that is electrically insulated from the first layer (6), the second layer (7) and the third layer (8).

[A19] A semiconductor device (1, etc.) comprising: a first layer (6) of a first conductivity type; a second layer (7) of a second conductivity type that is laminated on the first layer (6); a device region (9, 9A) that is provided in the second layer (7); a first trench structure (11) that penetrates through the second layer (7) such as to reach the first layer (6) and demarcates the device region (9, 9A) in the second layer (7); and a second trench structure (12) that penetrates through the second layer (7) such as to reach the first layer (6) and demarcates the device region (9, 9A) in a region of the second layer (7) further to the device region (9, 9A) side than the first trench structure (11).

[A20] The semiconductor device (1, etc.) according to A19, wherein the first trench structure (11) is constituted of a first trench (13) electrode structure that is electrically connected to the first layer (6) and electrically insulated from the second layer (7), and the second trench structure (12) is constituted of a second trench (16) electrode structure that is electrically insulated from the first layer (6) and the second layer (7).

[B1] A semiconductor device (51, 53, 55 (hereinafter indicated simply as "51, etc.")) comprising: a chip (2) that has a first main surface (3) on one side and a second main surface (4) on another side; a pn-junction portion (J) that is formed in an interior of the chip (2) such as to extend along the first main surface (3); a device region (9, 9A) that is provided in the first main surface (3); a first trench structure (11) that is formed in the first main surface (3) such as to penetrate through the pn-junction portion (J) and demarcates the device region (9, 9A) in the first main surface (3); a second trench structure (12) that is formed in the first main surface (3) such as to penetrate through the pn-junction portion (J) and demarcates the device region (9, 9A) in a region further to the device region (9, 9A) side than the first trench structure (11); and an inter-trench region (20) that is demarcated in a region between the first trench structure (11) and the second trench structure (12) and to which a potential (VI) of not less than 0 V is to be applied.

[B2] The semiconductor device (51, etc.) according to B1, wherein the potential (VI) different from that of the first trench structure (11) is to be applied to the inter-trench region (20).

[B3] The semiconductor device (51, etc.) according to B1 or B2, wherein the potential (VI) different from that of the second trench structure (12) is to be applied to the inter-trench region (20).

[B4] The semiconductor device (51, etc.) according to any one of B1 to B3, wherein the second trench structure (12) is electrically separated from the first trench structure (11).

[B5] The semiconductor device (51, etc.) according to any one of B1 to B4, wherein the second trench structure (12) is formed in an electrically floating state.

[B6] The semiconductor device (51, etc.) according to any one of B1 to B4, wherein the potential (VT) different from that of the first trench structure (11) is to be applied to the second trench structure (12).

[B7] The semiconductor device (51, etc.) according to any one of B1 to B6, further comprising: a contact electrode (52) that is electrically connected to the inter-trench region (20).

[B8] A semiconductor device (51, etc.) comprising: a chip (2) that has a first main surface (3) on one side and a second main surface (4) on another side; a pn-junction portion (J) that is formed in an interior of the chip (2) such as to extend along the first main surface (3); a device region (9, 9A) that is provided in the first main surface (3); a first trench structure (11) that is formed in the first main surface (3) such as to penetrate through the pn-junction portion (J) and demarcates the device region (9, 9A) in the first main surface (3); and a second trench structure (12) that is formed in the first main surface (3) such as to penetrate through the pn-junction portion (J) and demarcates the device region (9, 9A) in a region further to the device region (9, 9A) side than the first trench structure (11) and to which a potential (VT) different from that of the first trench structure (11) is to be applied.

[B9] The semiconductor device (51, etc.) according to B8, wherein the potential (VT) of not less than 0 V is to be applied to the second trench structure (12).

[B10] The semiconductor device (51, etc.) according to B8 or B9, further comprising: a contact electrode (54) that is electrically connected to the second trench structure (12).

[B11] The semiconductor device (51, etc.) according to any one of B1 to B10, wherein the first trench structure (11) has a first width (W1), and the second trench structure (12) has a second width (W2) that is not more than the first width (W1).

[B12] The semiconductor device (51, etc.) according to B11, wherein the second trench structure (12) is formed at an interval (IT) of not more than the first width (W1) from the first trench structure (11).

[B13] The semiconductor device (51, etc.) according to any one of B1 to B12, wherein the first trench structure (11) is electrically connected to the chip (2), and the second trench structure (12) is electrically insulated from the chip (2).

[B14] The semiconductor device (51, etc.) according to any one of B1 to B13, wherein the first trench structure (11) includes a first trench (13) that penetrates through the pn-junction portion (J), a first insulating film (14) that covers an inner wall of the first trench (13) such as to expose the chip (2) from a bottom wall of the first trench (13), and a first electrode (15) that is embedded in the first trench (13) with the first insulating film (14) therebetween and is electrically connected to the chip (2) at the bottom wall of the first trench (13), and the second trench structure (12) includes a second trench (16) that penetrates through the pn-junction portion (J), a second insulating film (17) that covers an inner wall of the second trench (16), and a second electrode (18) that is embedded in the second trench (16) with the second insulating film (17) therebetween and is electrically insulated from the chip (2).

[B15] The semiconductor device (51, etc.) according to B14, wherein the second trench structure (12) includes a bottom side insulator (19) that is embedded in a bottom wall side of the second trench (16) such as to be continuous to the second insulating film (17) and has a thickness exceeding a thickness of the second insulating film (17) and the second electrode (18) is embedded in the second trench (16) with the second insulating film (17) and the bottom side insulator (19) therebetween.

[B16] The semiconductor device (51, etc.) according to any one of B1 to B15, further comprising: a first layer (6) of a first conductivity type that is formed in a region inside the chip (2) on the second main surface (4) side; a second layer (7) of the first conductivity type or a second conductivity type that is formed in a region inside the chip (2) on the first main surface (3) side; and a third layer (8) of the second conductivity type that is interposed in a region inside the chip (2) between the first layer (6) and the second layer (7) and forms the pn-junction portion (J) with the first layer (6); wherein the first trench structure (11) penetrates through the second layer (7) and the third layer (8) such as to reach the first layer (6) and demarcates the device region (9, 9A) in the second layer (7), and the second trench structure (12) penetrates through the second layer (7) and the third layer (8) such as to reach the first layer (6) and demarcates the device region (9, 9A) in a region of the second layer (7) further to the device region (9, 9A) side than the first trench structure (11).

[B17] The semiconductor device (51, etc.) according to B16, wherein the first trench structure (11) is electrically connected to the first layer (6) and electrically insulated from the second layer (7) and the third layer (8), and the second trench structure (12) is electrically insulated from the first layer (6), the second layer (7) and the third layer (8).

[B18] The semiconductor device (51, etc.) according to any one of B1 to B15, further comprising: a first layer (6) of a first conductivity type that is formed in a region inside the chip (2) on the second main surface (4) side; and a second layer (7) of a second conductivity type that is formed in a region inside the chip (2) on the first main surface (3) side and forms the pn-junction portion (J) with the first layer (6); wherein the first trench structure (11) penetrates through the second layer (7) such as to reach the first layer (6) and demarcates the device region (9, 9A) in the second layer (7), and the second trench structure (12) penetrates through the second layer (7) such as to reach the first layer (6) and demarcates the device region (9, 9A) in a region of the second layer (7) further to the device region (9, 9A) side than the first trench structure (11).

[B19] The semiconductor device (51, etc.) according to B18, wherein the first trench structure (11) is electrically connected to the first layer (6) and electrically insulated from the second layer (7), and the second trench structure (12) is electrically insulated from the first layer (6) and the second layer (7).

[B20] The semiconductor device (51, etc.) according to any one of B1 to B19, further comprising: a transistor (30) that is formed in the device region (9, 9A).

[C1] A semiconductor device (61, 65, 66 (hereinafter indicated simply as "61, etc.")) comprising: a chip (2) that has a first main surface (3) on one side and a second main surface (4) on another side; a pn-junction portion (J) that is formed in an interior of the chip (2) such as to extend along the first main surface (3); a device region (9, 9A) that is provided in the first main surface (3); a trench structure (10, 11, 12) that is formed in the first main surface (3) such as to penetrate through the pn-junction portion (J) and demarcates the device region (9, 9A) in the first main surface (3); and a pn-junction expansion portion (JE) that is led out from an intersection portion (63) of the pn-junction portion (J) and the trench structure (10, 11, 12) to a bottom wall side of the trench structure (10, 11, 12) such as to expand the pn-junction portion (J) in the device region (9, 9A).

[C2] The semiconductor device (61, etc.) according to C1, wherein the pn-junction expansion portion (JE) is formed at an interval to the first main surface (3) side from the bottom wall of the trench structure (10, 11, 12).

[C3] The semiconductor device (61, etc.) according to C1 or C2, wherein the pn-junction expansion portion (JE) has a width less than a width of the trench structure (10, 11, 12).

[C4] The semiconductor device (61, etc.) according to any of C1 to C3, wherein the trench structure (10, 11, 12) is electrically insulated from the chip (2).

[C5] The semiconductor device (61, etc.) according to any of C1 to C4, wherein the trench structure (10, 11, 12) is formed in an electrically floating state.

[C6] The semiconductor device (61, etc.) according to any one of C1 to C4, wherein a potential (VT) different from that of the chip (2) is to be applied to the trench structure (10, 11, 12).

The semiconductor device (61, etc.) according to any one of C4 to C6, wherein the trench structure (10, 11, 12) includes a trench (13, 16) that penetrates through the pn-junction portion (J), an insulating film (14, 17) that covers an inner wall of the trench (13, 16), and an electrode (15, 18) that is embedded in the trench (13, 16) with the insulating film (14, 17) therebetween and is electrically insulated from the chip (2), and the pn-junction expansion portion (JE) faces the electrode (15, 18) with the insulating film (14, 17) therebetween.

[C8] The semiconductor device (61, etc.) according to any one of C1 to C3, wherein the trench structure (10, 11, 12) is connected to the chip (2).

[C9] The semiconductor device (61, etc.) according to C8, wherein the trench structure (10, 11, 12) includes a trench (13, 16) that penetrates through the pn-junction portion (J), an insulating film (14, 17) that covers an inner wall of the trench (13, 16) such as to expose the chip (2) from the bottom wall of the trench (13, 16), and an electrode (15, 18) that is embedded in the trench (13, 16) with the insulating film (14, 17) therebetween and is electrically connected to the chip (2) at the bottom wall of the trench (13, 16), and the pn-junction expansion portion (JE) faces the electrode (15, 18) with the insulating film (14, 17) therebetween.

[C10] The semiconductor device (61, etc.) according to any one of C1 to C9, further comprising: a first layer (6) of a first conductivity type that is formed in a region inside the chip (2) on the second main surface (4) side; a second layer (7) of the first conductivity type or a second conductivity type that is formed in a region inside the chip (2) on the first main surface (3) side; a third layer (8) of the second conductivity type that is interposed in a region inside the chip (2) between the first layer (6) and the second layer (7) and forms the pn-junction portion (J) with the first layer (6); the trench structure (10, 11, 12) that penetrates through the second layer (7) and the third layer (8) such as to reach the first layer (6) and demarcates the device region (9, 9A) in the second layer (7); and a side wall buffer layer (62) of the second conductivity type that is led out from an intersection portion (63) of the third layer (8) and the trench structure (10, 11, 12) to the bottom wall side of the trench structure (10, 11, 12) such as to expand the pn-junction portion (J) in the device region (9, 9A) and forms the pn-junction expansion portion (JE) with the first layer (6).

[C11] The semiconductor device (61, etc.) according to any one of C1 to C9, further comprising: a first layer (6) of a first conductivity type that is formed in a region inside the chip (2) on the second main surface (4) side; a second layer (7) of a second conductivity type that is formed in a region inside the chip (2) on the first main surface (3) side and forms the pn-junction portion (J) with the first layer (6); the trench structure (10, 11, 12) that penetrates through the second layer (7) such as to reach the first layer (6) and demarcates the device region (9, 9A) in the second layer (7); and a side wall buffer layer (62) of the second conductivity type that is led out from an intersection portion (63) of the second layer (7) and the trench structure (10, 11, 12) to the bottom wall side of the trench structure (10, 11, 12) such as to expand the pn-junction portion (J) in the device region (9, 9A) and forms the pn-junction expansion portion (JE) with the first layer (6).

[C12] The semiconductor device (61, etc.) according to C10 or C11, wherein the first layer (6) includes a high concentration layer (6*a*) of the first conductivity type that is formed in a region on the second main surface (4) side, and a low concentration layer (6*b*) of the first conductivity type that is formed in a region on the first main surface (3) side and has a lower impurity concentration than the high concentration layer (6*a*) and the side wall buffer layer (62) extends from the intersection portion (63) into the low concentration layer (6*b*).

[C13] The semiconductor device (61, etc.) according to C12, wherein the side wall buffer layer (62) is formed at an interval to the first main surface (3) side from the high concentration layer (6*a*).

[C14] The semiconductor device (61, etc.) according to C12 or C13, wherein the side wall buffer layer (62) has an impurity concentration higher than the low concentration layer (6*b*) and lower than the high concentration layer (6*a*).

[C15] A semiconductor device (61, etc.) comprising: a chip (2) that has a first main surface (3) on one side and a second main surface (4) on another side; a pn-junction portion (J) that is formed in an interior of the chip (2) such as to extend along the first main surface (3); a device region (9, 9A) that is provided in the first main surface (3); a first trench structure (11) that is formed in the first main surface (3) such as to penetrate through the pn-junction portion (J) and demarcates the device region (9, 9A) in the first main surface (3); a second trench structure (12) that is formed in the first main surface (3) such as to penetrate through the pn-junction portion (J) and demarcates the device region (9, 9A) in a region further to the device region (9, 9A) side than the first trench structure (11); and a pn-junction expansion portion (JE) that is led out from an intersection portion (63) of the pn-junction portion (J) and a side wall of the second trench structure (12) to a bottom wall side of the second trench structure (12) such as to expand the pn-junction portion (J) in the device region (9, 9A).

[C16] The semiconductor device (61, etc.) according to C15, wherein the pn-junction expansion portion (JE) is formed at an interval to the first main surface (3) side from the bottom wall of the second trench structure (12).

[C17] The semiconductor device (61, etc.) according to C15 or C16, wherein the second trench structure (12) is electrically separated from the first trench structure (11).

[C18] The semiconductor device (61, etc.) according to any one of C15 to C17, wherein the first trench structure (11) is electrically connected to the chip (2) and the second trench structure (12) is electrically insulated from the chip (2).

[C19] The semiconductor device (61, etc.) according to any one of C15 to C18, wherein the second trench structure (12) is formed in an electrically floating state.

[C20] The semiconductor device (61, etc.) according to any one of C15 to C19, wherein a potential (VT) different from that of the first trench structure (11) is to be applied to the second trench structure (12).

[C21] A semiconductor device (61, etc.) comprising: a first layer (6) of a first conductivity type; a second layer (7) of the first conductivity type or a second conductivity type that is laminated on the first layer (6); a third layer (8) of the second conductivity type that is interposed in a region between the first layer (6) and the second layer (7); a device region (9, 9A) that is provided in the second layer (7); a trench structure (10, 11, 12) that penetrates through the second layer (7) and the third layer (8) such as to reach the first layer (6) and demarcates the device region (9, 9A) in the second layer (7); and a side wall buffer layer (62) of the second conductivity type that is led out from an intersection portion (63) of the third layer (8) and the trench structure (10, 11, 12) to a bottom wall side of the trench structure (10, 11, 12).

[C22] A semiconductor device (61, etc.) comprising: a first layer (6) of a first conductivity type; a second layer (7) of a second conductivity type that is laminated on the first layer (6); a device region (9, 9A) that is provided in the second layer (7); a trench structure (10, 11, 12) that penetrates through the second layer (7) such as to reach the first layer (6) and demarcates the device region (9, 9A) in the second layer (7); and a side wall buffer layer (62) of the second conductivity type that is led out from an intersection portion (63) of the second layer (7) and the trench structure (10, 11, 12) to a bottom wall side of the trench structure (10, 11, 12).

[D1] A semiconductor device (71, etc.) comprising: a first layer (6) of a first conductivity type; a second layer (7) of a second conductivity type that is laminated on the first layer (6); a device region (9, 9A) that is provided in the second layer (7); a trench structure (10, 11, 12) that penetrates through the second layer (7) such as to reach the first layer (6) and demarcates the device region (9, 9A) in the second layer (7); and an embedded layer (8) of the second conductivity type that is formed in the device region (9, 9A) such as to extend across a boundary portion between the first layer (6) and the second layer (7) at an interval from the trench structure (10, 11, 12).

[D2] The semiconductor device (71, etc.) according to D1, wherein the embedded layer (8) includes a low concentration embedded layer (8*a*) of the second conductivity type that is formed on the first layer (6) side, and a high concentration embedded layer (8*b*) of the second conductivity type that is formed on the second layer (7) side and has a higher impurity concentration than the low concentration embedded layer (8*a*).

[D3] The semiconductor device (71, etc.) according to D2, wherein the low concentration embedded layer (8*a*) is formed in a region on the first layer (6) side with respect to the boundary portion between the first layer (6) and the second layer (7), and the high concentration embedded layer (8*b*) extends across the boundary portion.

[D4] The semiconductor device (71, etc.) according to D2 or D3, wherein the low concentration embedded layer (8*a*) is formed at an interval from the trench structure (10, 11, 12), and the high concentration embedded layer (8*b*) is formed at an interval from the trench structure (10, 11, 12).

[D5] The semiconductor device (71, etc.) according to any one of D1 to D4, wherein the first layer (6) includes a high concentration layer (6*a*) of the first conductivity type and a low concentration layer (6*b*) of the first conductivity type that is laminated on the high concentration layer (6*a*) and has a lower impurity concentration than the high concentration layer (6*a*), the second layer (7) is laminated on the low concentration layer (6*b*), and the embedded layer (8) is embedded such as to extend across a boundary portion of the low concentration layer (6*b*) and the second layer (7).

[D6] The semiconductor device (71, etc.) according to D5, wherein the high concentration layer (6*a*) is constituted of a semiconductor substrate, and the low concentration layer (6*b*) is constituted of an epitaxial layer.

[D7] The semiconductor device (71, etc.) according to any one of D1 to D6, wherein the trench structure (10, 11, 12) is electrically connected to the first layer (6) and is electrically insulated from the second layer (7).

[D8] The semiconductor device (71, etc.) according to any one of D1 to D6, wherein the trench structure (10, 11, 12) is electrically insulated from the first layer (6) and the second layer (7).

[D9] The semiconductor device (71, etc.) according to any one of D1 to D6, comprising: a plurality of the trench structures (10, 11, 12) that are respectively formed to penetrate through the second layer (7) such as to reach the first layer (6) and are aligned at intervals in a direction away from the device region (9, 9A) such as to demarcate the device region (9, 9A) in the second layer (7); wherein the embedded layer (8) is formed at an interval from the trench structure (10, 11, 12) that is most proximate to the device region (9, 9A).

[D10] The semiconductor device (71, etc.) according to D7, wherein the trench structure (10, 11, 12) includes a trench (13) that penetrates through the second layer (7) such as to reach the first layer (6), an insulating film (14) that covers an inner wall of the trench (13) such as to expose the first layer (6), and an electrode (15) that is embedded in the trench (13) with the insulating film (14) therebetween such as to be electrically connected to the first layer (6) and electrically insulated from the second layer (7).

[D11] The semiconductor device (71, etc.) according to D8, wherein the trench structure (10, 11, 12) includes a trench (16) that penetrates through the second layer (7) such as to reach the first layer (6), an insulating film (17) that covers an inner wall of the trench (16), and an electrode (18) that is embedded in the trench (16) with the insulating film (17) therebetween such as to be electrically insulated from the first layer (6) and the second layer (7).

[D12] The semiconductor device (71, etc.) according to D9, wherein each of the trench structures (10, 11, 12) includes a trench (13, 16) that penetrates through the second layer (7) such as to reach the first layer (6), an insulating film (14, 17) that covers an inner wall of the trench (13, 16), and an electrode (15, 18) that is embedded in the trench (13, 16) with the insulating film therebetween.

[D13] The semiconductor device (71, etc.) according to any one of D10 to D12, wherein the electrode (15, 18) includes a conductive polysilicon of the first conductivity type.

[D14] The semiconductor device (71, etc.) according to any one of D1 to D13, wherein the trench structure (10, 11, 12) is formed in a shape convergent toward the first layer (6).

[D15] The semiconductor device (71, etc.) according to any one of D1 to D14, wherein the trench structure (10, 11, 12) surrounds the device region (9, 9A) in plan view.

[D16] The semiconductor device (71, etc.) according to any one of D1 to D15, further comprising: a sinker region (21) of the second conductivity type that is formed inside the second layer (7) such as to cover a side wall of the trench structure (10, 11, 12) in the device region (9, 9A).

[D17] The semiconductor device (71, etc.) according to any one of D1 to D16, further comprising: an impurity region (22) of the first conductivity type that is formed along a bottom wall of the trench structure (10, 11, 12) in the first layer (6) and has an impurity concentration higher than the first layer (6).

[D18] The semiconductor device (71, etc.) according to any one of D1 to D17, further comprising: a transistor (30) that is formed in the device region (9, 9A).

[D19] A semiconductor device (71, etc.) comprising: a first layer (6) of a first conductivity type; a second layer (7) of a second conductivity type that is laminated on the first layer (6); a device region (9, 9A) that is provided in the second layer (7); a first trench structure (11) that penetrates through the second layer (7) such as to be electrically connected to the first layer (6) and electrically insulated from the second layer (7) and demarcates the device region (9, 9A) in the second layer (7); a second trench structure (12) that penetrates through the second layer (7) such as to be electrically insulated from the first layer (6) and the second layer (7) and demarcates the device region (9, 9A) in a region of the second layer (7) further to the device region (9, 9A) side than the first trench structure (11); and an embedded layer (8) of the second conductivity type that is formed in the device region (9, 9A) such as to extend across a boundary portion between the first layer (6) and the second layer (7) at an interval from the second trench structure (12).

[D20] The semiconductor device (71, etc.) according to D19, wherein the first trench structure (11) includes a first trench (13) that penetrates through the second layer (7) such as to reach the first layer (6), a first insulating film (14) that covers an inner wall of the first trench (13) such as to expose the first layer (6), and a first electrode (15) that is embedded in the first trench (13) with the first insulating film (14) therebetween such as to be electrically connected to the first layer (6) and electrically insulated from the second layer (7), and the second trench structure (12) includes a second trench (16) that penetrates through the second layer (7) such as to reach the first layer (6), a second insulating film (17) that covers an inner wall of the second trench (16), and a second electrode (18) that is embedded in the second trench (16) with the second insulating film (17) therebetween such as to be electrically insulated from the first layer (6) and the second layer (7).

Although here, features of the semiconductor devices were indicated according to each item, the features described in [A1] to [A20], the features described in [B1] to [B20], the features described in [C1] to [C22], and the features described in [D1] to [D20] can be combined with each other in any mode. While embodiments of the present invention were described in detail above, these are merely specific examples used to clarify the technical contents of the present invention and the present invention should not be interpreted as being limited to these specific examples and the scope of the present invention is limited only by the appended claims.

What is claimed is:

1. A semiconductor device comprising:

a chip that has a first main surface on one side and a second main surface on another side;

a pn-junction portion that is formed in an interior of the chip such as to extend along the first main surface;

a device region that is provided in the first main surface;

a first trench structure that is formed in the first main surface such as to penetrate through the pn-junction portion and demarcates the device region in the first main surface; and a second trench structure that is formed in the first main surface such as to penetrate through the pn-junction portion and demarcates the device region in a region further to the device region side than the first trench structure, wherein the chip has a first layer that is formed in a region inside the chip on the second main surface side, a second layer that is formed in a region inside the chip on the first main surface side, and a third layer that is interposed in a region inside the chip between the first layer and the second layer, and the semiconductor device further comprises:

an impurity region that has an impurity concentration higher than that of the first layer and is formed in the first layer such as to cover a bottom wall of the first trench structure, wherein the impurity region covers a bottom wall of the second trench structure.

2. The semiconductor device according to claim 1, wherein the first trench structure is constituted of a first trench electrode structure that is electrically connected to the chip, and the second trench structure is constituted of a second trench electrode structure that is electrically insulated from the chip.

3. The semiconductor device according to claim 1, wherein the first trench structure has a lower end portion that is electrically connected to the chip.

4. The semiconductor device according to claim 1, wherein the second trench structure is electrically separated from the first trench structure.

5. The semiconductor device according to claim 1, wherein the second trench structure is formed in an electrically floating state.

6. The semiconductor device according to claim 1, wherein a potential different from that of the first trench structure is to be occurred in the second trench structure.

7. The semiconductor device according to claim 1,
wherein the first trench structure has a first width, and
the second trench structure has a second width that is not more than the first width.

8. The semiconductor device according to claim 7,
wherein the second trench structure is formed at an interval of not more than the first width from the first trench structure.

9. The semiconductor device according to claim 1,
wherein the first trench structure includes a first trench that penetrates through the pn-junction portion, a first insulating film that covers an inner wall of the first trench such as to expose the chip from a bottom wall of the first trench, and a first electrode that is embedded in the first trench with the first insulating film therebetween and is electrically connected to the chip at the bottom wall of the first trench, and
the second trench structure includes a second trench that penetrates through the pn-junction portion, a second insulating film that covers an inner wall of the second trench, and a second electrode that is embedded in the second trench with the second insulating film therebetween and is electrically insulated from the chip.

10. The semiconductor device according to claim 9,
wherein the second trench structure includes a bottom side insulator that is embedded in a bottom wall side of the second trench such as to be continuous to the second insulating film and has a thickness exceeding a thickness of the second insulating film, and
the second electrode is embedded in the second trench with the second insulating film and the bottom side insulator therebetween.

11. The semiconductor device according to claim 1,
wherein the first layer has a first conductivity type;
the second layer has the first conductivity type or a second conductivity type,
the third layer has the second conductivity type and forms the pn-junction portion with the first layer,
the first trench structure penetrates through the second layer and the third layer such as to reach the first layer and demarcates the device region in the second layer, and
the second trench structure penetrates through the second layer and the third layer such as to reach the first layer and demarcates the device region in a region of the second layer further to the device region side than the first trench structure.

12. The semiconductor device according to claim 11,
wherein the first trench structure is electrically connected to the first layer and electrically insulated from the second layer and the third layer, and
the second trench structure is electrically insulated from the first layer, the second layer and the third layer.

13. The semiconductor device according to claim 1,
wherein the first trench structure penetrates through the second layer such as to reach the first layer and demarcates the device region in the second layer, and
the second trench structure penetrates through the second layer such as to reach the first layer and demarcates the device region in a region of the second layer further to the device region side than the first trench structure.

14. The semiconductor device according to claim 13,
wherein the first trench structure is electrically connected to the first layer and electrically insulated from the second layer, and
the second trench structure is electrically insulated from the first layer and the second layer.

15. The semiconductor device according to claim 1, further comprising:
an inter-trench region that is demarcated in a region between the first trench structure and the second trench structure and is formed in an electrically floating state.

16. The semiconductor device according to claim 1, further comprising:
a transistor that is formed in the device region.

17. A semiconductor device comprising:
a first layer of a first conductivity type;
a second layer of the first conductivity type or a second conductivity type that is laminated on the first layer;
a third layer of the second conductivity type that is interposed between the first layer and the second layer;
a device region that is provided in the second layer;
a first trench structure that penetrates through the second layer and the third layer such as to reach the first layer and demarcates the device region in the second layer;
a second trench structure that penetrates through the second layer and the third layer such as to reach the first layer and demarcates the device region in a region of the second layer further to the device region side than the first trench structure; and
an impurity region that has an impurity concentration higher than that of the first layer and is formed in the first layer such as to cover a bottom wall of the first trench structure;
wherein the impurity region covers a bottom wall of the second trench structure.

18. The semiconductor device according to claim 17,
wherein the first trench structure is constituted of a first trench electrode structure that is electrically connected to the first layer and electrically insulated from the second layer and the third layer, and
the second trench structure is constituted of a second trench electrode structure that is electrically insulated from the first layer, the second layer and the third layer.

19. A semiconductor device comprising:
a first layer of a first conductivity type;
a second layer of a second conductivity type that is laminated on the first layer;
a device region that is provided in the second layer;
a first trench structure that penetrates through the second layer such as to reach the first layer and demarcates the device region in the second layer;
a second trench structure that penetrates through the second layer such as to reach the first layer and demarcates the device region in a region of the second layer further to the device region side than the first trench structure; and
an impurity region that has an impurity concentration higher than that of the first layer and is formed in the first layer such as to cover a bottom wall of the first trench structure;
wherein the impurity region covers a bottom wall of the second trench structure.

20. The semiconductor device according to claim 19,
wherein the first trench structure is constituted of a first trench electrode structure that is electrically connected to the first layer and electrically insulated from the second layer, and
the second trench structure is constituted of a second trench electrode structure that is electrically insulated from the first layer and the second layer.

* * * * *